United States Patent
Montalvo et al.

(10) Patent No.: US 11,849,333 B2
(45) Date of Patent: *Dec. 19, 2023

(54) SYSTEM, METHOD, AND APPARATUS FOR PROVIDING DYNAMIC, PRIORITIZED SPECTRUM MANAGEMENT AND UTILIZATION

(71) Applicant: Digital Global Systems, Inc., Tysons Corner, VA (US)

(72) Inventors: Armando Montalvo, Winter Garden, FL (US); Dwight Inman, Travelers Rest, SC (US); Edward Hummel, Hillsborough, NJ (US)

(73) Assignee: DIGITAL GLOBAL SYSTEMS, INC., Tysons Corner, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/201,383

(22) Filed: May 24, 2023

(65) Prior Publication Data

US 2023/0308884 A1    Sep. 28, 2023

Related U.S. Application Data

(63) Continuation of application No. 18/081,331, filed on Dec. 14, 2022, now Pat. No. 11,665,548, which is a
(Continued)

(51) Int. Cl.
*H04W 16/10* (2009.01)
*H04L 41/0893* (2022.01)
(Continued)

(52) U.S. Cl.
CPC ............ *H04W 16/10* (2013.01); *G06F 30/27* (2020.01); *G06N 3/02* (2013.01); *G06N 5/022* (2013.01);
(Continued)

(58) Field of Classification Search
CPC ..... H04W 16/10; H04W 16/14; H04W 24/02; H04W 24/08; H04W 72/0453;
(Continued)

(56) References Cited

U.S. PATENT DOCUMENTS 6,850,252 B1    2/2005   Hoffberg
6,990,087 B2    1/2006   Rao et al.
(Continued)

FOREIGN PATENT DOCUMENTS

WO    2018204917 A1    11/2018

OTHER PUBLICATIONS

Digital Global Systems, U.S. Appl. No. 18/137,765, filed Apr. 21, 2023, Non-Provisional Patent Application; Entire Document.
(Continued)

*Primary Examiner* — Shane D Woolwine
(74) *Attorney, Agent, or Firm* — NEO IP

(57) ABSTRACT

Systems, methods, and apparatuses for providing dynamic, prioritized spectrum utilization management. The system includes at least one monitoring sensor, at least one data analysis engine, at least one application, a semantic engine, a programmable rules and policy editor, a tip and cue server, and/or a control panel. The tip and cue server is operable utilize the environmental awareness from the data processed by the at least one data analysis engine in combination with additional information to create actionable data.

10 Claims, 52 Drawing Sheets
(18 of 52 Drawing Sheet(s) Filed in Color)

Related U.S. Application Data continuation of application No. 17/901,330, filed on Sep. 1, 2022, now Pat. No. 11,576,050, which is a continuation of application No. 17/461,267, filed on Aug. 30, 2021, now Pat. No. 11,445,378, which is a continuation of application No. 17/085,635, filed on Oct. 30, 2020, now Pat. No. 11,395,149.

(60) Provisional application No. 63/018,929, filed on May 1, 2020.

(51) Int. Cl.
| | |
|---|---|
| *H04W 72/0453* | (2023.01) |
| *G06N 20/00* | (2019.01) |
| *H04W 24/02* | (2009.01) |
| *G06N 20/20* | (2019.01) |
| *G06N 20/10* | (2019.01) |
| *G06F 30/27* | (2020.01) |
| *G06N 3/02* | (2006.01) |
| *G06N 5/022* | (2023.01) |
| *G06N 5/04* | (2023.01) |
| *H04W 24/08* | (2009.01) |
| *H04W 16/14* | (2009.01) |
| *H04L 41/0894* | (2022.01) |
| *G06N 3/042* | (2023.01) |
| *G06N 3/045* | (2023.01) |

(52) U.S. Cl.
CPC ............ *G06N 5/04* (2013.01); *G06N 20/00* (2019.01); *G06N 20/10* (2019.01); *G06N 20/20* (2019.01); *H04L 41/0893* (2013.01); *H04W 24/02* (2013.01); *H04W 72/0453* (2013.01); *G06N 3/042* (2023.01); *G06N 3/045* (2023.01); *H04L 41/0894* (2022.05); *H04W 16/14* (2013.01); *H04W 24/08* (2013.01)

(58) Field of Classification Search
CPC . G06F 30/27; G06N 3/02; G06N 3/04; G06N 3/042; G06N 3/045; G06N 5/022; G06N 5/04; G06N 20/00; G06N 20/10; G06N 20/20; H04L 41/0893; H04L 41/0894; Y04S 40/00
See application file for complete search history.

(56) References Cited

U.S. PATENT DOCUMENTS

| | | |
|---|---|---|
| 7,190,937 B1 | 3/2007 | Sullivan et al. |
| 7,269,151 B2 | 9/2007 | Diener et al. |
| 8,229,368 B1 | 7/2012 | Immendorf et al. |
| 8,254,393 B2 | 8/2012 | Horvitz |
| 8,972,311 B2 | 3/2015 | Srikanteswara et al. |
| 9,246,576 B2 | 1/2016 | Yanai et al. |
| 9,356,727 B2 | 5/2016 | Immendorf et al. |
| 9,408,210 B2 | 8/2016 | Pikhletsky et al. |
| 9,439,078 B2 | 9/2016 | Menon et al. |
| 9,538,528 B2 | 1/2017 | Wagner et al. |
| 9,572,055 B2 | 2/2017 | Immendorf et al. |
| 9,578,516 B2 | 2/2017 | Liu et al. |
| 9,635,669 B2 | 4/2017 | Gormley et al. |
| 9,674,836 B2 | 6/2017 | Gormley et al. |
| 9,686,789 B2 | 6/2017 | Gormley et al. |
| 9,769,834 B2 | 9/2017 | Immendorf et al. |
| 9,819,441 B2 | 11/2017 | Immendorf et al. |
| 9,900,899 B2 | 2/2018 | Jiang et al. |
| 9,923,700 B2 | 3/2018 | Gormley et al. |
| 9,942,775 B2 | 4/2018 | Yun et al. |
| 10,070,444 B2 | 9/2018 | Markwart et al. |
| 10,104,559 B2 | 10/2018 | Immendorf et al. |
| 10,194,324 B2 | 1/2019 | Yun et al. |
| 10,218,490 B1 | 2/2019 | Yang et al. |
| 10,338,118 B1 | 7/2019 | Kempke et al. |
| 10,389,616 B2 | 8/2019 | Ryan et al. |
| 10,397,742 B2 | 8/2019 | Wootton et al. |
| 10,402,689 B1 | 9/2019 | Bogdanovych et al. |
| 10,477,342 B2 | 11/2019 | Williams |
| 10,536,210 B2 | 1/2020 | Zhao et al. |
| 10,541,712 B1 | 1/2020 | Ayala et al. |
| 10,582,401 B2 | 3/2020 | Mengwasser et al. |
| 10,592,683 B1 | 3/2020 | Lim et al. |
| 10,605,890 B1 | 3/2020 | Yun et al. |
| 10,700,721 B2 | 6/2020 | Ayala et al. |
| 10,701,574 B2 | 6/2020 | Gormley et al. |
| 10,784,974 B2 | 9/2020 | Menon |
| 10,798,597 B2 | 10/2020 | Wolcott et al. |
| 10,812,992 B1 | 10/2020 | Tran et al. |
| 10,813,102 B2 | 10/2020 | Yun et al. |
| 10,917,797 B2 | 2/2021 | Menon et al. |
| 11,012,340 B2 | 5/2021 | Ryan et al. |
| 11,018,784 B2 | 5/2021 | Ryan et al. |
| 11,018,957 B1 | 5/2021 | Ezra et al. |
| 11,019,514 B2 | 5/2021 | Ayala et al. |
| 11,032,014 B2 | 6/2021 | O'Shea et al. |
| 11,035,972 B2 | 6/2021 | Colombo et al. |
| 11,101,903 B2 | 8/2021 | Yun |
| 11,190,946 B1 | 11/2021 | Montalvo |
| 11,259,189 B2 | 2/2022 | Montalvo et al. |
| 11,272,372 B2 | 3/2022 | Montalvo et al. |
| 11,277,161 B2 | 3/2022 | Ayala et al. |
| 11,277,750 B2 | 3/2022 | Montalvo et al. |
| 11,284,267 B2 | 3/2022 | Montalvo et al. |
| 11,310,676 B2 | 4/2022 | Gormley et al. |
| 11,349,582 B2 | 5/2022 | Yun et al. |
| 11,394,475 B1 | 7/2022 | Vaca et al. |
| 11,395,149 B2 | 7/2022 | Montalvo |
| 11,445,378 B2 | 9/2022 | Montalvo et al. |
| 11,490,262 B2 | 11/2022 | Montalvo et al. |
| 11,540,295 B2 | 12/2022 | Yun et al. |
| 11,570,627 B1 | 1/2023 | Montalvo |
| 11,576,050 B2 | 2/2023 | Montalvo et al. |
| 11,582,613 B2 | 2/2023 | Montalvo et al. |
| 11,588,562 B2 | 2/2023 | Garcia et al. |
| 11,637,641 B1 | 4/2023 | Garcia et al. |
| 11,751,068 B2 | 9/2023 | Ponnampalam et al. |
| 2004/0028003 A1 | 2/2004 | Diener et al. |
| 2004/0142696 A1 | 7/2004 | Saunders et al. |
| 2009/0254572 A1 | 10/2009 | Redlich et al. |
| 2010/0075704 A1 | 3/2010 | McHenry et al. |
| 2011/0217943 A1 | 9/2011 | Ashworth et al. |
| 2012/0120887 A1 | 5/2012 | Deaton et al. |
| 2013/0315112 A1 | 11/2013 | Gormley et al. |
| 2013/0322279 A1 | 12/2013 | Chincholi et al. |
| 2013/0331114 A1 | 12/2013 | Gormley et al. |
| 2014/0162711 A1 | 6/2014 | Miller et al. |
| 2014/0185580 A1 | 7/2014 | Fang et al. |
| 2014/0204766 A1 | 7/2014 | Immendorf et al. |
| 2014/0206279 A1 | 7/2014 | Immendorf et al. |
| 2014/0206343 A1 | 7/2014 | Immendorf et al. |
| 2014/0279820 A1 | 9/2014 | MacPherson |
| 2014/0301216 A1 | 10/2014 | Immendorf et al. |
| 2014/0302796 A1 | 10/2014 | Gormley et al. |
| 2014/0335879 A1 | 11/2014 | Immendorf et al. |
| 2014/0347213 A1 | 11/2014 | Nguyen et al. |
| 2015/0016429 A1 | 1/2015 | Menon et al. |
| 2015/0215794 A1 | 7/2015 | Gormley et al. |
| 2015/0215949 A1 | 7/2015 | Gormley et al. |
| 2015/0233998 A1 | 8/2015 | Chen et al. |
| 2015/0245374 A1 | 8/2015 | Mitola et al. |
| 2015/0289265 A1 | 10/2015 | Gormley et al. |
| 2015/0296386 A1 | 10/2015 | Menon et al. |
| 2015/0348341 A1 | 12/2015 | Baxley et al. |
| 2015/0350914 A1 | 12/2015 | Baxley et al. |
| 2016/0050690 A1 | 2/2016 | Yun et al. |
| 2016/0127931 A1 | 5/2016 | Baxley et al. |
| 2016/0366685 A1 | 12/2016 | Gormley et al. |
| 2017/0026860 A1 | 1/2017 | Fuller et al. |
| 2017/0041802 A1 | 2/2017 | Sun et al. |
| 2017/0064564 A1 | 3/2017 | Yun et al. |
| 2017/0148467 A1 | 5/2017 | Franklin et al. |

(56) References Cited

U.S. PATENT DOCUMENTS

| | | | |
|---|---|---|---|
| 2017/0156149 A1 | 6/2017 | Lin et al. | |
| 2017/0187450 A1 | 6/2017 | Jalali | |
| 2017/0238201 A1 | 8/2017 | Gormley et al. | |
| 2017/0245280 A1 | 8/2017 | Yi et al. | |
| 2017/0280411 A1 | 9/2017 | Noonan | |
| 2017/0310450 A1 | 10/2017 | Galeev et al. | |
| 2017/0313426 A1* | 11/2017 | Morin | H04W 4/30 |
| 2018/0054490 A1 | 2/2018 | Wadhwa et al. | |
| 2018/0070362 A1 | 3/2018 | Ryan et al. | |
| 2018/0295607 A1 | 10/2018 | Lindoff et al. | |
| 2018/0316627 A1 | 11/2018 | Cui et al. | |
| 2018/0324595 A1 | 11/2018 | Shima | |
| 2018/0352441 A1 | 12/2018 | Zheng et al. | |
| 2018/0376006 A1 | 12/2018 | Russell et al. | |
| 2019/0052294 A1 | 2/2019 | Abdelmonem | |
| 2019/0052381 A1 | 2/2019 | Abdelmonem | |
| 2019/0129407 A1 | 5/2019 | Cella et al. | |
| 2019/0199756 A1 | 6/2019 | Correnti et al. | |
| 2019/0327006 A1* | 10/2019 | Mody | G06F 3/0485 |
| 2019/0339688 A1 | 11/2019 | Cella et al. | |
| 2019/0342202 A1 | 11/2019 | Ryan et al. | |
| 2019/0385373 A1* | 12/2019 | Mittleman | G08B 29/18 |
| 2020/0007249 A1 | 1/2020 | Derr et al. | |
| 2020/0021323 A1 | 1/2020 | Cyzs et al. | |
| 2020/0036459 A1 | 1/2020 | Menon | |
| 2020/0059800 A1 | 2/2020 | Menon et al. | |
| 2020/0068573 A1 | 2/2020 | Drozd et al. | |
| 2020/0081484 A1 | 3/2020 | Lee et al. | |
| 2020/0145032 A1 | 5/2020 | Ayala et al. | |
| 2020/0145852 A1 | 5/2020 | Ayala et al. | |
| 2020/0153467 A1 | 5/2020 | Ayala et al. | |
| 2020/0153535 A1 | 5/2020 | Kankanamge et al. | |
| 2020/0186265 A1 | 6/2020 | Yun | |
| 2020/0187213 A1 | 6/2020 | Yun et al. | |
| 2020/0196270 A1 | 6/2020 | Kleinbeck et al. | |
| 2020/0213006 A1 | 7/2020 | Graham et al. | |
| 2020/0215695 A1 | 7/2020 | Cristache | |
| 2020/0217882 A1 | 7/2020 | Lee et al. | |
| 2020/0242922 A1 | 7/2020 | Dulberg et al. | |
| 2020/0274629 A1* | 8/2020 | Wilson | H04B 7/0413 |
| 2020/0311666 A1 | 10/2020 | Gray et al. | |
| 2020/0329382 A1* | 10/2020 | Sahoo | H04W 16/10 |
| 2020/0336228 A1 | 10/2020 | Ryan et al. | |
| 2020/0344619 A1 | 10/2020 | Gormley et al. | |
| 2020/0412749 A1 | 12/2020 | Rollet | |
| 2021/0037540 A1 | 2/2021 | Tsuchiya et al. | |
| 2021/0042830 A1 | 2/2021 | Burke | |
| 2021/0045127 A1 | 2/2021 | Yun et al. | |
| 2021/0058146 A1 | 2/2021 | Eichen | |
| 2021/0119848 A1 | 4/2021 | Casas et al. | |
| 2021/0127284 A1 | 4/2021 | Abdelmonem et al. | |
| 2021/0182283 A1 | 6/2021 | Carney et al. | |
| 2021/0194912 A1 | 6/2021 | Ward et al. | |
| 2021/0203576 A1 | 7/2021 | Padfield et al. | |
| 2021/0250790 A1 | 8/2021 | Seeber | |
| 2021/0288731 A1 | 9/2021 | Yun et al. | |
| 2021/0314081 A1 | 10/2021 | Shattil et al. | |
| 2021/0390329 A1 | 12/2021 | Ren et al. | |
| 2021/0392504 A1 | 12/2021 | Montalvo et al. | |
| 2021/0405173 A1 | 12/2021 | Elias et al. | |
| 2021/0409959 A1 | 12/2021 | Montalvo et al. | |
| 2021/0409960 A1 | 12/2021 | Montalvo et al. | |
| 2022/0007197 A1 | 1/2022 | Montalvo et al. | |
| 2022/0022045 A1 | 1/2022 | Montalvo | |
| 2022/0078622 A1 | 3/2022 | Montalvo | |
| 2022/0174499 A1 | 6/2022 | Montalvo et al. | |
| 2022/0191704 A1 | 6/2022 | Montalvo et al. | |
| 2022/0201495 A1 | 6/2022 | Montalvo | |
| 2022/0201496 A1 | 6/2022 | Montalvo et al. | |
| 2022/0206447 A1 | 6/2022 | Osborn et al. | |
| 2022/0210659 A1 | 6/2022 | Montalvo et al. | |
| 2022/0371705 A1 | 11/2022 | Poikonen et al. | |
| 2023/0084157 A1 | 3/2023 | Montalvo | |
| 2023/0084904 A1 | 3/2023 | Montalvo et al. | |
| 2023/0086476 A1 | 3/2023 | Montalvo | |
| 2023/0090727 A1 | 3/2023 | Yun et al. | |
| 2023/0110731 A1 | 4/2023 | Montalvo et al. | |
| 2023/0118290 A1 | 4/2023 | Montalvo et al. | |
| 2023/0119145 A1 | 4/2023 | Montalvo et al. | |
| 2023/0121345 A1 | 4/2023 | Montalvo et al. | |
| 2023/0123122 A1 | 4/2023 | Montalvo et al. | |
| 2023/0124382 A1 | 4/2023 | Montalvo et al. | |
| 2023/0124491 A1 | 4/2023 | Montalvo et al. | |
| 2023/0124883 A1 | 4/2023 | Montalvo | |
| 2023/0176669 A1 | 6/2023 | Gupta et al. | |
| 2023/0211493 A1 | 7/2023 | Cristache | |
| 2023/0254204 A1 | 8/2023 | Mansfield | |

OTHER PUBLICATIONS

Digital Global Systems, U.S. Appl. No. 18/142,923, filed May 3, 2023, Non-Provisional Patent Application; Entire Document.

Digital Global Systems, U.S. Appl. No. 18/143,366, filed May 4, 2023, Non-Provisional Patent Application; Entire Document.

Digital Global Systems, U.S. Appl. No. 18/195,715, filed May 10, 2023, Non-Provisional Patent Application; Entire Document.

Digital Global Systems, U.S. Appl. No. 18/199,119, filed May 18, 2023, Non-Provisional Patent Application; Entire Document.

Digital Global Systems, U.S. Appl. No. 18/315,846, filed May 11, 2023, Non-Provisional Patent Application; Entire Document.

International Search Report and Written Opinion dated Jul. 27, 2021 issued by the International Application Division, Korean Intellectual Property Office as International Searching Authority in connection with International Application No. PCT/US2021/027911 (9 pages).

R. Roy and T. Kailath, "ESPRIT—estimation of signal parameters via rotational invariance techniques," in IEEE Transactions on Acoustics, Speech, and Signal Processing, vol. 37, No. 7, pp. 984-995, Jul. 1989, doi: 10.1109/29.32276.

* cited by examiner

SYSTEM, METHOD, AND APPARATUS FOR PROVIDING DYNAMIC, PRIORITIZED SPECTRUM MANAGEMENT AND UTILIZATION

CROSS REFERENCES TO RELATED APPLICATIONS

This application is related to and claims priority from the following U.S. patents and patent applications. This application is a continuation of U.S. application Ser. No. 18/081,331, filed Dec. 14, 2022, which is a continuation of U.S. application Ser. No. 17/901,330, filed Sep. 1, 2022, which is a continuation of U.S. application Ser. No. 17/461,267, filed Aug. 30, 2021, which is a continuation of U.S. application Ser. No. 17/085,635, filed Oct. 30, 2020, which claims the benefit of U.S. Provisional Application No. 63/018,929, filed May 1, 2020. Each of the above listed applications is incorporated herein by reference in its entirety.

This application is also related to the following U.S. patent applications: U.S. patent application Ser. No. 18/199,119 filed May 18, 2023, U.S. patent application Ser. No. 17/695,370 filed Mar. 15, 2022, U.S. patent application Ser. No. 18/077,802 filed Dec. 8, 2022; U.S. patent application Ser. No. 18/081,331 filed Dec. 14, 2022; U.S. patent application Ser. No. 18/085,874 filed Dec. 21, 2022; U.S. patent application Ser. No. 18/143,366 filed May 4, 2023; U.S. patent application Ser. No. 18/137,765 filed Apr. 21, 2023; U.S. patent application Ser. No. 18/315,846 filed May 11, 2023; U.S. patent application Ser. No. 17/691,683 filed Mar. 10, 2022; U.S. patent application Ser. No. 18/142,923 filed May 3, 2023; U.S. patent application Ser. No. 18/195,715 filed May 10, 2023; and U.S. patent application Ser. No. 17/691,670 filed Mar. 10, 2022.

BACKGROUND OF THE INVENTION

1. Field of the Invention

The present invention relates to spectrum analysis and management for electromagnetic signals, and more particularly for providing dynamic, prioritized spectrum utilization management.

2. Description of the Prior Art

It is generally known in the prior art to provide wireless communications spectrum management for detecting devices and for managing the space. Spectrum management includes the process of regulating the use of radio frequencies to promote efficient use and gain net social benefit. A problem faced in effective spectrum management is the various numbers of devices emanating wireless signal propagations at different frequencies and across different technological standards. Coupled with the different regulations relating to spectrum usage around the globe effective spectrum management becomes difficult to obtain and at best can only be reached over a long period of time.

Another problem facing effective spectrum management is the growing need from spectrum despite the finite amount of spectrum available. Wireless technologies and applications or services that require spectrum have exponentially grown in recent years. Consequently, available spectrum has become a valuable resource that must be efficiently utilized. Therefore, systems and methods are needed to effectively manage and optimize the available spectrum that is being used.

Prior art patent documents include the following:

U.S. Patent Publication No. 2018/0352441 for Devices, methods, and systems with dynamic spectrum sharing by inventors Zheng, et al., filed Jun. 4, 2018 and published Dec. 6, 2018, is directed to devices, methods, and systems with dynamic spectrum sharing. A wireless communication device includes a software-defined radio, a spectrum sensing sub-system, a memory, and an electronic processor. The software-defined radio is configured to generate an input signal, and wirelessly communicate with one or more radio nodes using a traffic data channel and a broadcast control channel. The spectrum sensing sub-system is configured to sense local spectrum information from the input signal. The electronic processor is communicatively connected to the memory and the spectrum sensing sub-system and is configured to receive the local spectrum information from the spectrum sensing sub-system, receive spectrum information from the one or more radio nodes, and allocate resources for the traffic data channel based on the local spectrum information and the spectrum information that is received from the one or more radio nodes.

U.S. Patent Publication No. 2018/0295607 for Method and apparatus for adaptive bandwidth usage in a wireless communication network by inventors Lindoff, et al., filed Oct. 10, 2017 and published Oct. 11, 2018, is directed to reconfiguration of a receiver bandwidth of the wireless device is initiated to match the second scheduling bandwidth, wherein the second scheduling bandwidth is larger than a first scheduling bandwidth currently associated with the wireless device, and wherein the first and second scheduling bandwidths respectively define the bandwidth used for scheduling transmissions to the wireless device.

U.S. Pat. No. 9,538,528 for Efficient co-existence method for dynamic spectrum sharing by inventors Wagner, et al., filed Oct. 6, 2011 and issued Jan. 3, 2017, is directed to an apparatus that defines a set of resources out of a first number of orthogonal radio resources and controls a transmitting means to simultaneously transmit a respective first radio signal for each resource on all resources of the set. A respective estimated interference is estimated on each of the resources of the set when the respective first radio signals are transmitted simultaneously. A first resource of the set is selected if the estimated interference on the first resource exceeds a first predefined level and, in the set, the first resource is replaced by a second resource of the first number of resources not having been part of the set. Each of the controlling and the estimating, the selecting, and the replacing is performed in order, respectively, for a predefined time.

U.S. Pat. No. 8,972,311 for Intelligent spectrum allocation based on user behavior patterns by inventors Srikanteswara, et al., filed Jun. 26, 2012 and issued Mar. 3, 2015, is directed to a platform to facilitate transferring spectrum rights is provided that includes a database to ascertain information regarding available spectrum for use in wireless communications. A request for spectrum use from an entity needing spectrum may be matched with available spectrum. This matching comprises determining a pattern in user requests overtime to optimize spectrum allocation. The Cloud Spectrum Services (CSS) process allows entities to access spectrum they would otherwise not have; it allows the end user to complete their download during congested periods while maintaining high service quality; and it allows the holder of rental spectrum to receive compensation for an otherwise idle asset.

U.S. Pat. No. 10,536,210 for Interference suppressing method and device in dynamic frequency spectrum access system by inventors Zhao, et al., filed Apr. 14, 2016 and issued Jan. 14, 2020, is directed to an interference suppressing method and device in a dynamic frequency spectrum access (DSA) system. The system includes: a frequency spectrum management device, a primary system including a plurality of primary devices, and a secondary system including a plurality of secondary devices. The method includes: transmitting position information of each of the secondary devices to the frequency spectrum management device; determining, by the frequency spectrum management device, a weight factor for a specific secondary device according to the received position formation; and performing a second-stage precoding, and in the second-stage precoding, adjusting, by using the weight factor, an estimated power of the specific secondary device leaking to the other secondary device.

U.S. Pat. No. 10,582,401 for Large scale radio frequency signal information processing and analysis system by inventors Mengwasser, et al., filed Apr. 15, 2019 and issued Mar. 3, 2020, is directed to a large-scale radio frequency signal information processing and analysis system that provides advanced signal analysis for telecommunication applications, including band capacity and geographical density determinations and detection, classification, identification, and geolocation of signals across a wide range of frequencies and across broad geographical areas. The system may utilize a range of novel algorithms for bin-wise processing, Rayleigh distribution analysis, telecommunication signal classification, receiver anomaly detection, transmitter density estimation, transmitter detection and location, geolocation analysis, telecommunication activity estimation, telecommunication utilization estimation, frequency utilization estimation, and data interpolation.

U.S. Pat. No. 10,070,444 for Coordinated spectrum allocation and de-allocation to minimize spectrum fragmentation in a cognitive radio network by inventors Markwart, et al., filed Dec. 2, 2011 and issued Sep. 4, 2018, is directed to an apparatus and a method by which a fragmentation probability is determined which indicates a probability of fragmentation of frequency resources in at least one network section for at least one network operating entity. Moreover, an apparatus and a method by which frequency resources in at least one network section are allocated and/or de-allocated, priorities of frequency resources are defined for at least one network operating entity individually, and allocating and/or de-allocating of the frequency resources for the at least one network operating entity is performed based on the priorities. For allocating and/or de-allocating of the frequency resources, also the fragmentation probability may be taken into account.

U.S. Patent Publication No. 2020/0007249 for Wireless signal monitoring and analysis, and related methods, systems, and devices by inventors Derr, et al., filed Sep. 12, 2019 and published Jan. 2, 2020, is directed to wireless signal classifiers and systems that incorporate the same may include an energy-based detector configured to analyze an entire set of measurements and generate a first single classification result, a cyclostationary-based detector configured to analyze less than the entire set of measurements and generate a second signal classification result; and a classification merger configured to merge the first signal classification result and the second signal classification result. Ensemble wireless signal classification and systems and devices the incorporate the same are disclosed. Some ensemble wireless signal classification may include energy-based classification processes and machine learning-based classification processes. Incremental machine learning techniques may be incorporated to add new machine learning-based classifiers to a system or update existing machine learning-based classifiers.

U.S. Patent Publication No. 2018/0324595 for Spectral sensing and allocation using deep machine learning by inventor Shima, filed May 7, 2018 and published Nov. 8, 2018, is directed to methods and systems for identifying occupied areas of a radio frequency (RF) spectrum, identifying areas within that RF spectrum that are unusable for further transmissions, and identifying areas within that RF spectrum that are occupied but that may nonetheless be available for additional RF transmissions are provided. Implementation of the method then systems can include the use of multiple deep neural networks (DNNs), such as convolutional neural networks (CNN's), that are provided with inputs in the form of RF spectrograms. Embodiments of the present disclosure can be applied to cognitive radios or other configurable communication devices, including but not limited to multiple inputs multiple output (MIMO) devices and 5G communication system devices.

U.S. Patent Publication No. 2017/0041802 for Spectrum resource management device and method by inventors Sun, et al., filed May 27, 2015 and published Feb. 9, 2017, is directed to a spectrum resource management device: determines available spectrum resources of a target communication system, so that aggregation interference caused by the target communication system and a communication system with a low right against a communication system with a high right in a management area does not exceed an interference threshold of the communication system with a high right; reduces available spectrum resources of the communication system with a low right, so that the interference caused by the communication system with a low right against the target communication system does not exceed an interference threshold of the target communication system; and updates the available spectrum resources of the target communication system according to the reduced available spectrum resources of the communication system with a low right, so that the aggregation interference does not exceed the interference threshold of the communication system with a high right.

U.S. Pat. No. 9,900,899 for Dynamic spectrum allocation method and dynamic spectrum allocation device by inventors Jiang, et al., filed Mar. 26, 2014 and issued Feb. 20, 2018, is directed to a dynamic spectrum allocation method and a dynamic spectrum allocation device. In the method, a centralized node performs spectrum allocation and transmits a spectrum allocation result to each communication node, so that the communication node operates at a corresponding spectrum resource in accordance with the spectrum allocation result and performs statistics of communication quality measurement information. The centralized node receives the communication quality measurement information reported by the communication node, and determines whether or not it is required to trigger the spectrum re-allocation for the communication node in accordance with the communication quality measurement information about the communication node. When it is required to trigger the spectrum re-allocation, the centralized node re-allocates the spectrum for the communication node.

U.S. Pat. No. 9,578,516 for Radio system and spectrum resource reconfiguration method thereof by inventors Liu, et al., filed Feb. 7, 2013 and issued Feb. 21, 2017, is directed to a radio system and a spectrum resource reconfiguration method thereof. The method comprises: a Reconfigurable Base Station (RBS) divides subordinate nodes into groups according to attributes of the subordinate nodes, and sends a reconfiguration command to a subordinate node in a designated group, and the RBS and the subordinate node execute reconfiguration of spectrum resources according to the reconfiguration command; or, the RBS executes reconfiguration of spectrum resources according to the reconfiguration command; and a subordinate User Equipment (UE) accessing to a reconfigured RBS after interruption. The reconfiguration of spectrum resources of a cognitive radio system can be realized.

U.S. Pat. No. 9,408,210 for Method, device and system for dynamic frequency spectrum optimization by inventors Pikhletsky, et al., filed Feb. 25, 2014 and issued Aug. 2, 2016, is directed to a method, a device and a system for dynamic frequency spectrum optimization. The method includes: predicting a traffic distribution of terminal(s) in each cell of multiple cells; generating multiple frequency spectrum allocation schemes for the multiple cells according to the traffic distribution of the terminal(s) in each cell, wherein each frequency spectrum allocation scheme comprises frequency spectrum(s) allocated for each cell; selecting a frequency spectrum allocation scheme superior to a current frequency spectrum allocation scheme of the multiple cells from the multiple frequency spectrum allocation schemes according to at least two network performance indicators of a network in which the multiple cells are located; and allocating frequency spectrum(s) for the multiple cells using the selected frequency spectrum allocation scheme. This improves the utilization rate of the frequency spectrum and optimizes the multiple network performance indicators at the same time.

U.S. Pat. No. 9,246,576 for Apparatus and methods for dynamic spectrum allocation in satellite communications by inventors Yanai, et al., filed Mar. 5, 2012 and issued Jan. 26, 2016, is directed to a communication system including Satellite Communication apparatus providing communication services to at least a first set of communicants, the first set of communicants including a first plurality of communicants, wherein the communication services are provided to each of the communicants in accordance with a spectrum allocation corresponding thereto, thereby to define a first plurality of spectrum allocations apportioning a first predefined spectrum portion among the first set of communicants; and Dynamic Spectrum Allocations apparatus operative to dynamically modify at least one spectrum allocation corresponding to at least one of the first plurality of communicants without exceeding the spectrum portion.

U.S. Pat. No. 8,254,393 for Harnessing predictive models of durations of channel availability for enhanced opportunistic allocation of radio spectrum by inventor Horvitz, filed Jun. 29, 2007 and issued Aug. 28, 2012, is directed to a proactive adaptive radio methodology for the opportunistic allocation of radio spectrum is described. The methods can be used to allocate radio spectrum resources by employing machine learning to learn models, via accruing data over time, that have the ability to predict the context-sensitive durations of the availability of channels. The predictive models are combined with decision-theoretic cost-benefit analyses to minimize disruptions of service or quality that can be associated with reactive allocation policies. Rather than reacting to losses of channel, the proactive policies seek switches in advance of the loss of a channel. Beyond determining durations of availability for one or more frequency bands statistical machine learning also be employed to generate price predictions in order to facilitate a sale or rental of the available frequencies, and these predictions can be employed in the switching analyses. The methods can be employed in non-cooperating distributed models of allocation, in centralized allocation approaches, and in hybrid spectrum allocation scenarios.

U.S. Pat. No. 6,990,087 for Dynamic wireless resource utilization by inventors Rao, et al., filed Apr. 22, 2003 and issued Jan. 24, 2006, is directed to a method for dynamic wireless resource utilization includes monitoring a wireless communication resource; generating wireless communication resource data; using the wireless communication resource data, predicting the occurrence of one or more holes in a future time period; generating hole prediction data; using the hole prediction data, synthesizing one or more wireless communication channels from the one or more predicted holes; generating channel synthesis data; receiving data reflecting feedback from a previous wireless communication attempt and data reflecting a network condition; according to the received data and the channel synthesis data, selecting a particular wireless communication channel from the one or more synthesized wireless communication channels; generating wireless communication channel selection data; using the wireless communication channel selection data, instructing a radio unit to communicate using the selected wireless communication channel; and instructing the radio unit to discontinue use of the selected wireless communication channel after the communication has been completed.

U.S. Pat. No. 10,477,342 for Systems and methods of using wireless location, context, and/or one or more communication networks for monitoring for, preempting, and/or mitigating pre-identified behavior by inventor Williams, filed Dec. 13, 2017 and issued Nov. 12, 2019, is directed to systems and methods of using location, context, and/or one or more communication networks for monitoring for, preempting, and/or mitigating pre-identified behavior. For example, exemplary embodiments disclosed herein may include involuntarily, automatically, and/or wirelessly monitoring/mitigating undesirable behavior (e.g., addiction related undesirable behavior, etc.) of a person (e.g., an addict, a parolee, a user of a system, etc.). In an exemplary embodiment, a system generally includes a plurality of devices and/or sensors configured to determine, through one or more communications networks, a location of a person and/or a context of the person at the location; predict and evaluate a risk of a pre-identified behavior by the person in relation to the location and/or the context; and facilitate one or more actions and/or activities to mitigate the risk of the pre-identified behavior, if any, and/or react to the pre-identified behavior, if any, by the person.

SUMMARY OF THE INVENTION

The present invention relates to spectrum analysis and management for electromagnetic signals, and more particularly for providing dynamic, prioritized spectrum utilization management. Furthermore, the present invention relates to spectrum analysis and management for electromagnetic (e.g., radio frequency (RF)) signals, and for automatically identifying baseline data and changes in state for signals from a multiplicity of devices in a wireless communications spectrum, and for providing remote access to measured and analyzed data through a virtualized computing network. In an embodiment, signals and the parameters of the signals are identified and indications of available frequencies are presented to a user. In another embodiment, the protocols of signals are also identified. In a further embodiment, the modulation of signals, data types carried by the signals, and estimated signal origins are identified.

It is an object of this invention to prioritize and manage applications in the wireless communications spectrum, while also optimizing application performance.

In one embodiment, the present invention provides a system for dynamic, prioritized spectrum utilization management in an electromagnetic environment including at least one monitoring sensor operable to monitor the electromagnetic environment, thereby creating measured data, at least one data analysis engine for analyzing the measured data, at least one application, a semantic engine including a programmable rules and policy editor, and a tip and cue server, wherein the at least one data analysis engine includes a detection engine and a learning engine, wherein the detection engine is operable to automatically detect at least one signal of interest, and wherein the learning engine is operable to learn the electromagnetic environment, wherein the at least one application includes a survey occupancy application and a resource brokerage application, wherein the survey occupancy application is operable to determine occupancy in frequency bands and schedule occupancy in at least one frequency band, and wherein the resource brokerage application is operable to optimize resources to improve performance of at least one customer application and/or at least one customer device, wherein the programmable rules and policy editor includes at least one rule and/or at least one policy, and wherein one or more of the at least one rule and/or the at least one policy is defined by at least one customer, wherein the tip and cue server is operable to use analyzed data from the at least one data analysis engine to create actionable data, wherein each of the at least one customer application is assigned a priority, and wherein the priority and the one or more of the at least one rule and/or the at least one policy are used to dynamically allocate the at least one frequency band in the electromagnetic spectrum.

In another embodiment, the present invention provides a system for dynamic, prioritized spectrum utilization management in an electromagnetic environment including at least one monitoring sensor operable to monitor the electromagnetic environment, thereby creating measured data, at least one data analysis engine for analyzing the measured data, at least one application, a semantic engine including a programmable rules and policy editor, and a tip and cue server, wherein the at least one data analysis engine includes a detection engine, an identification engine, a classification engine, a geolocation engine, and a learning engine, wherein the detection engine is operable to automatically detect at least one signal of interest, and wherein the learning engine is operable to learn the electromagnetic environment, wherein the at least one application includes a survey occupancy application and a resource brokerage application, wherein the survey occupancy application is operable to determine occupancy in frequency bands and schedule occupancy in at least one frequency band, and wherein the resource brokerage application is operable to optimize resources to improve performance of at least one customer application and/or at least one customer device, wherein the programmable rules and policy editor includes at least one rule and/or at least one policy, and wherein one or more of the at least one rule and/or the at least one policy is defined by at least one customer, wherein the tip and cue server is operable to use analyzed data from the at least one data analysis engine to create actionable data, wherein each of the at least one customer application is assigned a priority, and wherein the priority and the one or more of the at least one rule and/or the at least one policy are used to dynamically allocate the at least one frequency band in the electromagnetic spectrum.

In yet another embodiment, the present invention provides a method for dynamic, prioritized spectrum utilization management in an electromagnetic environment including providing a semantic engine including a programmable rules and policy editor, wherein the programmable rules and policy editor includes at least one rule and/or at least one policy, and wherein one or more of the at least one rule and/or the at least one policy is defined by at least one customer, monitoring the electromagnetic environment using at least one monitoring sensor, thereby creating measured data, analyzing the measured data using at least one data analysis engine, thereby creating analyzed data, wherein the at least one data analysis engine includes a detection engine and a learning engine, learning the electromagnetic environment using the learning engine, automatically detecting at least one signal of interest using the detection engine, determining occupancy in frequency bands and scheduling occupancy in at least one frequency band using a survey occupancy application, optimizing resources to improve performance of at least one customer application and/or at least one customer device using a resource brokerage application, assigning a priority to each of the at least one customer application, and dynamically allocating the at least one frequency band in the electromagnetic spectrum based on the priority and the one or more of the at least one rule and/or the at least one policy.

In still another embodiment, the present invention provides a method for dynamic, prioritized spectrum utilization management in an electromagnetic environment including providing a semantic engine including a programmable rules and policy editor, wherein the programmable rules and policy editor includes at least one rule and/or at least one policy, and wherein one or more of the at least one rule and/or the at least one policy is defined by at least one customer, monitoring the electromagnetic environment using at least one monitoring sensor, thereby creating measured data, analyzing the measured data using at least one data analysis engine, thereby creating analyzed data, wherein the at least one data analysis engine includes a detection engine, a classification engine, an identification engine, a geolocation engine, and a learning engine, learning the electromagnetic environment using the learning engine, automatically detecting at least one signal of interest using the detection engine, classifying the at least one signal of interest using the classification engine, identifying the at least one signal of interest using the identification engine, determining a location of the at least one signal of interest using the geolocation engine, determining occupancy in frequency bands and scheduling occupancy in at least one frequency band using a survey occupancy application, optimizing resources to improve performance of at least one customer application and/or at least one customer device using a resource brokerage application, assigning a priority to each of the at least one customer application, and dynamically allocating the at least one frequency band in the electromagnetic spectrum based on the priority and the one or more of the at least one rule and/or the at least one policy.

These and other aspects of the present invention will become apparent to those skilled in the art after a reading of the following description of the preferred embodiment when considered with the drawings, as they support the claimed invention.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Figure 1:
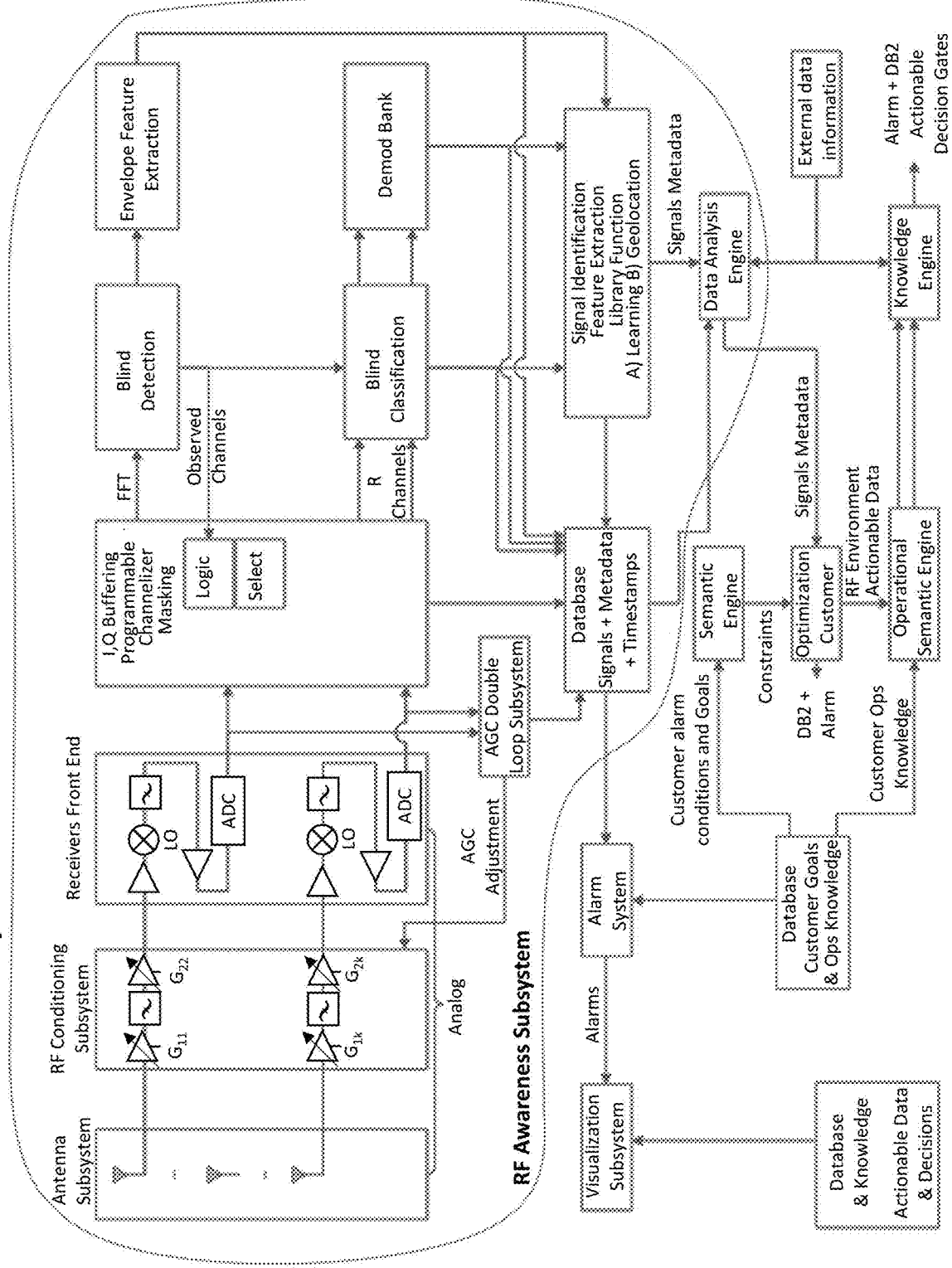
FIG. 1 illustrates one embodiment of an RF awareness and analysis system.

The present invention is generally directed to spectrum analysis and management for electromagnetic signals, and more particularly for providing dynamic, prioritized spectrum utilization management.

In one embodiment, the present invention provides a system for dynamic, prioritized spectrum utilization management in an electromagnetic environment including at least one monitoring sensor operable to monitor the electromagnetic environment, thereby creating measured data, at least one data analysis engine for analyzing the measured data, at least one application, a semantic engine including a programmable rules and policy editor, and a tip and cue server, wherein the at least one data analysis engine includes a detection engine and a learning engine, wherein the detection engine is operable to automatically detect at least one signal of interest, and wherein the learning engine is operable to learn the electromagnetic environment, wherein the at least one application includes a survey occupancy application and a resource brokerage application, wherein the survey occupancy application is operable to determine occupancy in frequency bands and schedule occupancy in at least one frequency band, and wherein the resource brokerage application is operable to optimize resources to improve performance of at least one customer application and/or at least one customer device, wherein the programmable rules and policy editor includes at least one rule and/or at least one policy, and wherein one or more of the at least one rule and/or the at least one policy is defined by at least one customer, wherein the tip and cue server is operable to use analyzed data from the at least one data analysis engine to create actionable data, wherein each of the at least one customer application is assigned a priority, and wherein the priority and the one or more of the at least one rule and/or the at least one policy are used to dynamically allocate the at least one frequency band in the electromagnetic spectrum.

In another embodiment, the present invention provides a system for dynamic, prioritized spectrum utilization management in an electromagnetic environment including at least one monitoring sensor operable to monitor the electromagnetic environment, thereby creating measured data, at least one data analysis engine for analyzing the measured data, at least one application, a semantic engine including a programmable rules and policy editor, and a tip and cue server, wherein the at least one data analysis engine includes a detection engine, an identification engine, a classification engine, a geolocation engine, and a learning engine, wherein the detection engine is operable to automatically detect at least one signal of interest, and wherein the learning engine is operable to learn the electromagnetic environment, wherein the at least one application includes a survey occupancy application and a resource brokerage application, wherein the survey occupancy application is operable to determine occupancy in frequency bands and schedule occupancy in at least one frequency band, and wherein the resource brokerage application is operable to optimize resources to improve performance of at least one customer application and/or at least one customer device, wherein the programmable rules and policy editor includes at least one rule and/or at least one policy, and wherein one or more of the at least one rule and/or the at least one policy is defined by at least one customer, wherein the tip and cue server is operable to use analyzed data from the at least one data analysis engine to create actionable data, wherein each of the at least one customer application is assigned a priority, and wherein the priority and the one or more of the at least one rule and/or the at least one policy are used to dynamically allocate the at least one frequency band in the electromagnetic spectrum.

In yet another embodiment, the present invention provides a method for dynamic, prioritized spectrum utilization management in an electromagnetic environment including providing a semantic engine including a programmable rules and policy editor, wherein the programmable rules and policy editor includes at least one rule and/or at least one policy, and wherein one or more of the at least one rule and/or the at least one policy is defined by at least one customer, monitoring the electromagnetic environment using at least one monitoring sensor, thereby creating measured data, analyzing the measured data using at least one data analysis engine, thereby creating analyzed data, wherein the at least one data analysis engine includes a detection engine and a learning engine, learning the electromagnetic environment using the learning engine, automatically detecting at least one signal of interest using the detection engine, determining occupancy in frequency bands and scheduling occupancy in at least one frequency band using a survey occupancy application, optimizing resources to improve performance of at least one customer application and/or at least one customer device using a resource brokerage application, assigning a priority to each of the at least one customer application, and dynamically allocating the at least one frequency band in the electromagnetic spectrum based on the priority and the one or more of the at least one rule and/or the at least one policy.

In still another embodiment, the present invention provides a method for dynamic, prioritized spectrum utilization management in an electromagnetic environment including providing a semantic engine including a programmable rules and policy editor, wherein the programmable rules and policy editor includes at least one rule and/or at least one policy, and wherein one or more of the at least one rule and/or the at least one policy is defined by at least one customer, monitoring the electromagnetic environment using at least one monitoring sensor, thereby creating measured data, analyzing the measured data using at least one data analysis engine, thereby creating analyzed data, wherein the at least one data analysis engine includes a detection engine, a classification engine, an identification engine, a geolocation engine, and a learning engine, learning the electromagnetic environment using the learning engine, automatically detecting at least one signal of interest using the detection engine, classifying the at least one signal of interest using the classification engine, identifying the at least one signal of interest using the identification engine, determining a location of the at least one signal of interest using the geolocation engine, determining occupancy in frequency bands and scheduling occupancy in at least one frequency band using a survey occupancy application, optimizing resources to improve performance of at least one customer application and/or at least one customer device using a resource brokerage application, assigning a priority to each of the at least one customer application, and dynamically allocating the at least one frequency band in the electromagnetic spectrum based on the priority and the one or more of the at least one rule and/or the at least one policy.

Traditional management of spectrum is static, based on licenses that are geographical and band specific. The Federal Communications Commission (FCC) has allocated spectrum into a table. Utilization is increased by slicing the spectrum into finer slices. Additionally, interference is limited by imposing penalties by strict geographical band utilization rules and licenses. However, these traditional methods of spectrum management do not work with increasing demand and new services coming out. The new services would have to be at higher frequencies (e.g., above 10 GHz), which is very expensive and requires costly transceiver with a limited distance range.

Spectrum is valuable because it is a finite resource. Further, the demand for spectrum is ever-increasing. The Shannon-Hartley theorem calculates the maximum rate at which information can be transmitted over a communications channel of a specified bandwidth in the presence of noise as follows:

$$C = BW \log_2(1+SNR)$$

where C is the channel capacity in bits per second, BW is the bandwidth of the channel in Hz, and SNR is the signal-to-noise ratio.

Early attempts at managing spectrum include developing technology that increases spectrum efficiency (i.e., maximizing SNR). Although this results in more bits per Hz, the logarithmic function limits the gains in channel capacity resulting from improving technology. Additional attempts at managing spectrum also include developing technology to enable use of alternate spectrum (e.g., free-space optical (FSO) communication). However, using alternate spectrum, such as higher frequencies, leads to smaller ranges, line of sight limitations, increased elevation of transmission structures, and/or expensive infrastructure.

The missing component to spectrum management is bandwidth management. Bandwidth management provides flexible utilization of the spectrum, enables management of spectrum resources and users, while allowing spectrum usage to be quantified. The majority of applications using the spectrum can coexist if each application knows about the spectrum needs of other applications and how they plan to use the spectrum. However, because the needs of each application are dynamic, a dynamic spectrum management system is needed. The present invention allows autonomous, dynamic sharing of the electromagnetic spectrum to allow maximum utilization by diverse applications according to specific utilization rules (dynamic and/or static) while maintaining minimum interference between applications. This requires new tools that provide dynamic environmental spectral awareness of all signals present in the electromagnetic (e.g., radio frequency (RF)) environment to properly execute utilization rules, which are operable to describe or facilitate sharing spectrum resources among several competing users or protect one service user from others, among others.

5G requires spectrum awareness. Larger blocks of spectrum are required to support higher speeds. Dynamic spectrum sharing is necessary to make the spectrum assets available. Further, visibility of spectrum activity is required to support reliability targets. Interference avoidance and resolution must be embedded. Internet of Things (IoT)/machine communication wireless dependency elevates the need for real-time RF visibility to avoid disruption and safety concerns.

The system of the present invention provides scalable processing capabilities at the edge. Edge processing is fast and reliable with low latency. Environmental sensing processes optimize collection and analytics, making data sets manageable. Advantageously, the system minimizes backhaul requirements, allowing for actionable data to be delivered faster and more efficiently.

Deep learning techniques extract and deliver knowledge from large data sets in near-real time. These deep learning techniques are critical for identifying and classifying signals. Edge analytics further allow third party data (e.g., social media, population information, real estate information, traffic information, geographic information system) to further enrich captured data sets. A semantic engine and inference reasoner leverages insights generated by machine learning and edge analytics. Ontologies are established allowing for the creation of knowledge operable to inform and direct actions and/or decisions.

Referring now to the drawings in general, the illustrations are for the purpose of describing one or more preferred embodiments of the invention and are not intended to limit the invention thereto.

The present invention provides systems, methods, and apparatuses for spectrum analysis and management by identifying, classifying, and cataloging at least one or a multiplicity of signals of interest based on electromagnetic spectrum measurements (e.g., radiofrequency spectrum measurements), location, and other measurements. The present invention uses real-time and/or near real-time processing of signals (e.g., parallel processing) and corresponding signal parameters and/or characteristics in the context of historical, static, and/or statistical data for a given spectrum, and more particularly, all using baseline data and changes in state for compressed data to enable near real-time analytics and results for individual monitoring sensors and for aggregated monitoring sensors for making unique comparisons of data.

The systems, methods, and apparatuses according to the present invention preferably are operable to detect in near real time, and more preferably to detect, sense, measure, and/or analyze in near real time, and more preferably to perform any near real time operations within about 1 second or less. In one embodiment, near real time is defined as computations completed before data marking an event change. For example, if an event happens every second, near real time is completing computations in less than one second. Advantageously, the present invention and its real time functionality described herein uniquely provide and enable the system to compare acquired spectrum data to historical data, to update data and/or information, and/or to provide more data and/or information on open space. In one embodiment, information (e.g., open space) is provided on an apparatus unit or a device that is occupying the open space. In another embodiment, the system compares data acquired with historically scanned (e.g., 15 min to 30 days) data and/or or historical database information in near-real time. Also, the data from each monitoring sensor, apparatus unit, or device and/or aggregated data from more than one monitoring sensor, apparatus unit, and/or device are communicated via a network to at least one server computer and stored on a database in a virtualized or cloud-based computing system, and the data is available for secure, remote access via the network from distributed remote devices having software applications (apps) operable thereon, for example by web access (mobile app) or computer access (desktop app). The at least one server computer is operable to analyze the data and/or the aggregated data.

The system is operable to monitor the electromagnetic (e.g., RF) environment via at least one monitoring sensor. The system is then operable to analyze data acquired from the at least one monitoring sensor to detect, classify, and/or identify at least one signal in the electromagnetic environment. The system is operable to learn the electromagnetic environment, which allows the system to extract environmental awareness. In a preferred embodiment, the system extracts environmental awareness by including customer goals. The environmental awareness is combined with the customer goals, customer defined policies, and/or rules (e.g., customer defined rules, government defined rules) to extract actionable information to help the customer optimize performance according to the customer goals. The actionable information is combined and correlated with additional information sources to enhance customer knowledge and user experience through dynamic spectrum utilization and prediction models.

The systems, methods, and apparatuses of the various embodiments enable spectrum utilization management by identifying, classifying, and cataloging signals of interest based on electromagnetic (e.g., radio frequency) measurements. In one embodiment, signals and parameters of the signals are identified. In another embodiment, indications of available frequencies are presented to a user and/or user equipment. In yet another embodiment, protocols of signals are also identified. In a further embodiment, the modulation of signals, data types carried by the signals, and estimated signal origins are identified. Identification, classification, and cataloging signals of interest preferably occurs in real time or near-real time.

Embodiments are directed to a spectrum monitoring unit that is configurable to obtain spectrum data over a wide range of wireless communication protocols. Embodiments also provide for the ability to acquire data from and send data to database depositories that are used by a plurality of spectrum management customers and/or applications or services requiring spectrum resources.

In one embodiment, the system includes at least one spectrum monitoring unit. Each of the at least one spectrum monitoring unit includes at least one monitoring sensor that is preferably in network communication with a database system and spectrum management interface. In one embodiment, the at least one spectrum monitoring unit and/or the at least one monitoring sensor is portable. In a preferred embodiment, one or more of the at least one spectrum monitoring unit and/or the at least one monitoring sensor is a stationary installation. The at least one spectrum monitoring unit and/or the at least one monitoring sensor is operable to acquire different spectrum information including, but not limited to, frequency, bandwidth, signal power, time, and location of signal propagation, as well as modulation type and format. The at least one spectrum monitoring unit is preferably operable to provide signal identification, classification, and/or geo-location. Additionally, the at least one spectrum monitoring unit preferably includes a processor to allow the at least one spectrum monitoring unit to process spectrum power density data as received and/or to process raw In-Phase and Quadrature (I/Q) complex data. Alternatively, the at least one spectrum monitoring unit and/or the at least one monitoring sensor transmits the data to at least one data analysis engine for storage and/or processing. In a preferred embodiment, the transmission of the data is via a backhaul operation. The spectrum power density data and/or the raw I/Q complex data are operable to be used to further signal processing, signal identification, and data extraction.

The system preferably is operable to manage and prioritize spectrum utilization based on five factors: frequency, time, spatial, signal space, and application goals.

The frequency range is preferably as large as possible. In one embodiment, the system supports a frequency range between 1 MHz and 6 GHz. In another embodiment, the system supports a frequency range with a lower limit of 9 kHz. In yet another embodiment, the system supports a frequency range with a higher limit of 12.4 GHz. In another embodiment, the system supports a frequency range with a higher limit of 28 GHz or 36 GHz. Alternatively, the system supports a frequency range with a higher limit of 60 GHz. In still another embodiment, the system supports a frequency range with a higher limit of 100 GHz. The system preferably has an instantaneous processing bandwidth (IPBW) of 40 MHz, 80 MHz, 100 MHz, or 250 MHz per channel.

The time range is preferably as large as possible. In one embodiment, the number of samples per dwell time in a frequency band is calculated. In one example, the system provides a minimum coverage of 2 seconds. The number of samples per dwell in time in the frequency band is calculated as follows:

$$N_s \geq (IPBW)(2)/\text{channel}$$

The storage required in a buffer is a minimum of 2 seconds per channel per dwell time, which is calculated as follows:

$$\text{storage} = (IPBW)(2)(2 \text{ Bytes})(\text{channels})/(\text{dwell time})$$

Spatial processing is used to divide an area of coverage by a range of azimuth and elevation angles. The area of coverage is defined as an area under a certain azimuth and range. This is implemented by antenna arrays processing, steerable beamforming, array processing, and/or directional antennas. In one embodiment, the directional antennas include at least one steerable electrical or mechanical antenna. Alternatively, the directional antennas include an array of steerable antennas. More antennas require more signal processing. Advantageously, spatial processing allows for better separation of signals, reduction of noise and interference signals, geospatial separation, increasing signal processing gains, and provides a spatial component to signal identification. Further, this allows for simple integration of geolocation techniques, such as time difference of arrival (TDOA), angle of arrival (AOA), and/or frequency difference of arrival (FDOA). This also allows for implementation of a geolocation engine, which will be discussed in detail infra.

Each signal has inherent signal characteristics including, but not limited to a modulation type (e.g., frequency modulation (FM), amplitude modulation (AM), quadrature phase-shift keying (QPSK), quadrature amplitude modulation (QAM), binary phase-shift keying (BPSK), etc.), a protocol used (e.g., no protocol for analog signals, digital mobile radio (DMR), land mobile radio (LMR), Project 25 (P25), NXDN, cellular, long-term evolution (LTE), universal mobile telecommunications system (UMTS), 5G), an envelope behavior (e.g., bandwidth (BW), center frequency (Fc), symbol rate, data rate, constant envelope, peak power to average power ratio (PAR), cyclostationary properties), an interference index, and statistical properties (e.g., stationary, cyclostationary, higher moment decomposition, non-linear decomposition (e.g., Volterra series to cover non-linearities, learning basic model).

The application goals are dependent on the particular application used within the system. Examples of applications used in the system include, but are not limited to, traffic management, telemedicine, virtual reality, streaming video for entertainment, social media, autonomous and/or unmanned transportation, etc. Each application is operable to be prioritized within the system according to customer goals. For example, traffic management is a higher priority application than streaming video for entertainment.

As previously described, the system is operable to monitor the electromagnetic (e.g., RF) environment, analyze the electromagnetic environment, and extract environmental awareness of the electromagnetic environment. In a preferred embodiment, the system extracts the environmental awareness of the electromagnetic environment by including customer goals. In another embodiment, the system uses the environmental awareness with the customer goals and/or user defined policies and rules to extract actionable information to help the customer optimize the customer goals. The system combines and correlates other information sources with the extracted actionable information to enhance customer knowledge through dynamic spectrum utilization and prediction models.

FIG. 1 illustrates one embodiment of an RF awareness and analysis system. The system includes an RF awareness subsystem. The RF awareness subsystem includes, but is not limited to, an antenna subsystem, an RF conditioning subsystem, at least one front end receiver, a programmable channelizer, a blind detection engine, a blind classification engine, an envelope feature extraction module, a demodulation bank, an automatic gain control (AGC) double loop subsystem, a signal identification engine, a feature extraction engine, a learning engine, a geolocation engine, a data analysis engine, and/or a database storing information related to at least one signal (e.g., metadata, timestamps, power measurements, frequencies, etc.). The system further includes an alarm system, a visualization subsystem, a knowledge engine, an operational semantic engine, a customer optimization module, a database of customer goals and operational knowledge, and/or a database of actionable data and decisions.

The antenna subsystem monitors the electromagnetic (e.g., RF) environment to produce monitoring data. The monitoring data is then processed through the RF conditioning subsystem before being processed through the front end receivers. The AGC double loop subsystem is operable to perform AGC adjustment. Data is converted from analog to digital by the front end receivers.

The digital data is then sent through the programmable channelizer, and undergoes I,Q buffering and masking. A fast Fourier transform (FFT) is performed and the blind detection engine performs blind detection. Additionally, the blind classification engine performs blind classification. Information (e.g., observed channels) is shared from the blind detection engine to the blind classification and/or the programmable channelizer (e.g., to inform logic and selection processes). Information from the blind detection engine is also sent to the envelope feature extraction module. Information from the blind classification engine is sent to the demodulation bank.

Information from the envelope feature extraction module, the demodulation bank, and/or the blind classification engine are operable to be used by the signal identification engine, the feature extraction engine, the learning engine, and/or the geolocation engine. Information from the AGC double loop subsystem, the I,Q buffer, masking, the programmable channelizer, the signal identification engine, the feature extraction engine, the learning engine, and the geolocation engine, the envelope feature extraction module, the demodulation bank, and/or the blind classification engine is operable to be stored in the database storing information related to the at least one signal (e.g., signal data, metadata, timestamps).

Information from the database (i.e., the database storing information related to the at least one signal), the signal identification engine, the feature extraction engine, the learning engine, and/or the geolocation engine is operable to be sent to the data analysis engine for further processing.

The alarm system includes information from the database storing information related to the at least one signal and/or the database of customer goals and operational knowledge. Alarms are sent from the alarm system to the visualization subsystem. In a preferred embodiment, the visualization subsystem customizes a graphical user interface (GUI) for each customer. The visualization system is operable to display information from the database of actionable data and decisions. In one embodiment, the alarms are sent via text message and/or electronic mail. In one embodiment, the alarms are sent to at least one internet protocol (IP) address.

The database of customer goals and operational knowledge is also operable to send information to a semantic engine (e.g., customer alarm conditions and goals) and/or an operational semantic engine (e.g., customer operational knowledge). The semantic engine translates information into constraints and sends the constraints to the customer optimization module, which also receives information (e.g., signal metadata) from the data analysis engine. The customer optimization module is operable to send actionable data related to the electromagnetic environment to the operational semantic engine. The customer optimization module is operable to discern which information (e.g., environmental information) has the largest statistically sufficient impact related to the customer goals and operation.

Figure 2:
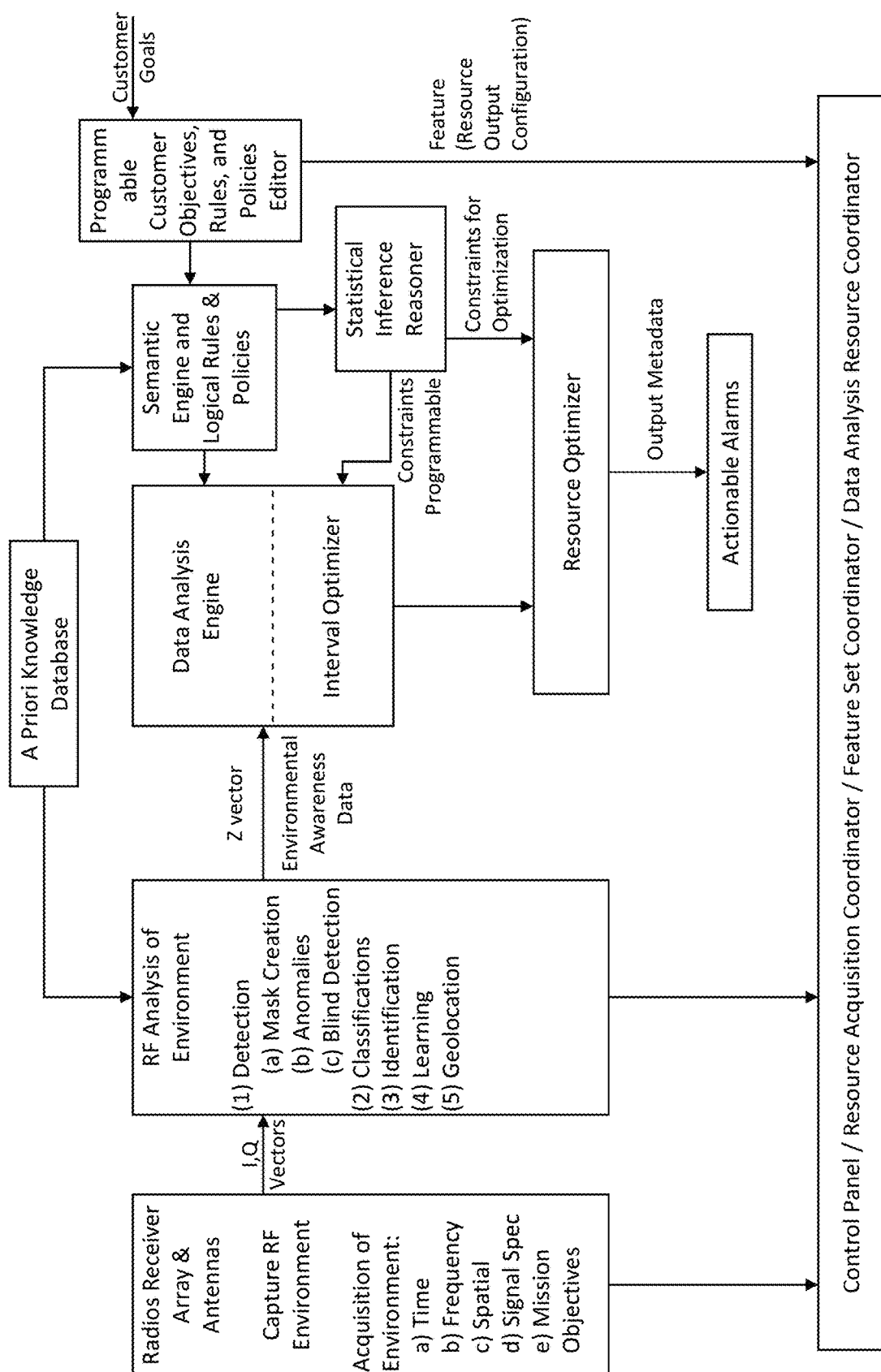
FIG. 2 illustrates another embodiment of the RF awareness and analysis system.

In one embodiment, the system includes at least one monitoring sensor, at least one data analysis engine, at least one application, a semantic engine, a programmable rules and policy editor, a tip and cue server, and/or a control panel as shown in FIG. 2.

The at least one monitoring sensor includes at least one radio server and/or at least one antenna. The at least one antenna is a single antenna (e.g., uni-directional or directional) or an antenna array formed of multiple antennas resonating at different frequency bands and configured in a 1D (linear), 2D (planar), or 3D (area) antenna configuration. The at least one monitoring sensor is operable to scan the electromagnetic (e.g., RF) spectrum and measure properties of the electromagnetic spectrum, including, but not limited to, receiver I/Q data. The at least one monitoring unit is preferably operable to autonomously capture the electromagnetic spectrum with respect to frequency, time, and/or space. In one embodiment, the at least one monitoring sensor is operable to perform array processing.

In another embodiment, the at least one monitoring sensor is mobile. In one embodiment, the at least one monitoring sensor is mounted on a vehicle or a drone. Alternatively, the at least one monitoring sensor is fixed. In one embodiment, the at least one monitoring sensor is fixed in or on a street light and/or a traffic pole. In yet another embodiment, the at least one monitoring sensor is fixed on top of a building.

In one embodiment, the at least one monitoring sensor is integrated with at least one camera. In one embodiment, the at least one camera captures video and/or still images.

In another embodiment, the at least one monitoring sensor includes at least one monitoring unit. Examples of monitoring units include those disclosed in U.S. Pat. Nos. 10,122,479, 10,219,163, 10,231,206, 10,237,770, 10,244,504, 10,257,727, 10,257,728, 10,257,729, 10,271,233, 10,299,149, 10,498,951, and 10,529,241, and U.S. Publication Nos. 20190215201, 20190364533, and 20200066132, each of which is incorporated herein by reference in its entirety.

In a preferred embodiment, the system includes at least one data analysis engine to process data captured by the at least one monitoring sensor. An engine is a collection of functions and algorithms used to solve a class of problems. The system preferably includes a detection engine, a classification engine, an identification engine, a geo-location engine, a learning engine, and/or a statistical inference and machine learning engine. For example, the geolocation engine is a group of functions and geolocation algorithms that are used together to solve multiple geolocation problems.

The detection engine is preferably operable to detect at least one signal of interest in the electromagnetic (e.g., RF) environment. In a preferred embodiment, the detection engine is operable to automatically detect the at least one signal of interest. In one embodiment, the automatic signal detection process includes mask creation and environment analysis using masks. Mask creation is a process of elaborating a representation of the electromagnetic environment by analyzing a spectrum of signals over a certain period of time. A desired frequency range is used to create a mask, and FFT streaming data is also used in the mask creation process. A first derivative is calculated and used for identifying possible maximum power values. A second derivative is calculated and used to confirm the maximum power values. A moving average value is created as FFT data is received during a time period selected by the user for mask creation. For example, the time period is 10 seconds. The result is an FFT array with an average of the maximum power values, which is called a mask.

The classification engine is preferably operable to classify the at least one signal of interest. In one embodiment, the classification engine generates a query to a static database to classify the at least one signal of interest based on its components. For example, the information stored in static database is preferably used to determine spectral density, center frequency, bandwidth, baud rate, modulation type, protocol (e.g., global system for mobile (GSM), code-division multiple access (CDMA), orthogonal frequency-division multiplexing (OFDM), LTE, etc.), system or carrier using licensed spectrum, location of the signal source, and/or a timestamp of the at least one signal of interest. In an embodiment, the static database includes frequency information gathered from various sources including, but not limited to, the Federal Communication Commission, the International Telecommunication Union, and data from users. In one example, the static database is an SQL database. The data store is operable to be updated, downloaded or merged with other devices or with its main relational database. In one embodiment, software application programming interface (API) applications are included to allow database merging with third-party spectrum databases that are only operable to be accessed securely. In a preferred embodiment, the classification engine is operable to calculate second, third, and fourth order cumulants to classify modulation schemes along with other parameters, including center frequency, bandwidth, baud rate, etc.

The identification engine is preferably operable to identify a device or an emitter transmitting the at least one signal of interest. In one embodiment, the identification engine uses signal profiling and/or comparison with known database(s) and previously recorded profile(s) to identify the device or the emitter. In another embodiment, the identification engine states a level of confidence related to the identification of the device or the emitter.

The geolocation engine is preferably operable to identify a location from which the at least one signal of interest is emitted. In one embodiment, the geolocation engine uses statistical approximations to remove error causes from noise, timing and power measurements, multipath, and non-line of sight (NLOS) measurements. By way of example, the following methods are used for geolocation statistical approximations and variances: maximum likelihood (nearest neighbor or Kalman filter); least squares approximation; Bayesian filter if prior knowledge data is included; and the like. In another embodiment, time difference of arrival (TDOA) and frequency difference of arrival (FDOA) equations are derived to assist in solving inconsistencies in distance calculations. In still another embodiment, angle of arrival (AOA) is used to determine geolocation. In yet another embodiment, power distribution ratio versus azimuth measurements are used to determine geolocation. In a preferred embodiment, geolocation is performed using Angle of Arrival (AOA), Time Difference of Arrival (TDOA), Frequency Difference of Arrival (FDOA), and power distribution ratio measurements. Several methods or combinations of these methods are operable to be used with the present invention because geolocation is performed in different environments, including but not limited to indoor environments, outdoor environments, hybrid (stadium) environments, inner city environments, etc.

The learning engine is preferably operable to learn the electromagnetic environment. In one embodiment, the learning engine uses statistical learning techniques to observe and learn an electromagnetic environment over time and identify temporal features of the electromagnetic environment (e.g., signals) during a learning period. In a preferred embodiment, the learning engine is operable to learn information from the detection engine, the classification engine, the identification engine, and/or the geolocation engine. In one embodiment, the learning function of the system is operable to be enabled and disabled. When the learning engine is exposed to a stable electromagnetic environment and has learned what is normal in the electromagnetic environment, it will stop its learning process. In a preferred embodiment, the electromagnetic environment is periodically reevaluated. In one embodiment, the learning engine reevaluates and/or updates the electromagnetic environment at a predetermined timeframe. In another embodiment, the learning engine reevaluates and/or updates the electromagnetic environment is updated after a problem is detected.

The statistical inference and machine learning (ML) engine utilizes statistical learning techniques and/or control theory to learn the electromagnetic environment and make predictions about the electromagnetic environment.

The survey occupancy application is operable to determine occupancy in frequency bands. In another embodiment, the survey occupancy application is operable to schedule occupancy in a frequency band. The survey occupancy application is also used to preprocess at least two signals that exist in the same band based on interference between the at least two signals.

The resource brokerage application is operable to optimize resources to improve application performance. In a preferred embodiment, the resource brokerage application is operable to use processed data from the at least one monitoring sensor and/or additional information to determine environmental awareness (e.g., environmental situational awareness). The environmental awareness and/or capabilities of a device and/or a resource are used to determine policies and/or reasoning to optimize the device and/or the resource. The resource brokerage application is operable to control the device and/or the resource. Additionally, the resource brokerage application is operable to control the at least one monitoring sensor.

The certification and compliance application is operable to determine if applications and/or devices are behaving according to rules and/or policies (e.g., customer policies and/or rules, government rules). In another embodiment, the certification and compliance application is operable to determine if the applications and/or the devices are sharing frequency bands according to the rules and/or the policies.

In yet another embodiment, the certification and compliance application is operable to determine if the applications and/or the devices are behaving according to non-interferences rules and/or policies.

The sharing application is operable to determine optimization of how applications and/or devices share the frequency bands. In a preferred embodiment, the sharing application uses a plurality of rules and/or policies (e.g., a plurality of customer rules and/or policies, government rules) to determine the optimization of how the applications and/or the devices share the frequency bands. Thus, the sharing application satisfies the plurality of rules and/or policies as defined by at least one customer and/or the government.

The statistical inference and prediction utilization application is operable to utilize predictive analytics techniques including, but not limited to, machine learning (ML), artificial intelligence (AI), neural networks (NNs), historical data, and/or data mining to make future predictions and/or models. The system is preferably operable to recommend and/or perform actions based on historical data, external data sources, ML, AI, NNs, and/or other learning techniques.

The semantic engine is operable to receive data in forms including, but not limited to, audio data, text data, video data, and/or image data. In one embodiment, the semantic engine utilizes a set of system rules and/or a set of system policies. In another embodiment, the set of system rules and/or the set of system policies is created using a prior knowledge database. The semantic engine preferably includes an editor and a language dictionary.

The semantic engine preferably further includes a programmable rules and policy editor. The programmable rules and policy editor is operable to include at least one rule and/or at least one policy. In one embodiment, the at least one rule and/or the at least one policy is defined by at least one customer. Advantageously, this allows the at least one customer to dictate rules and policies related to customer objectives.

The system further includes a tip and cue server. The tip and cue server is operable utilize the environmental awareness from the data processed by the at least one data analysis engine in combination with additional information to create actionable data. In a preferred embodiment, the tip and cue server utilizes information from a specific rule set (e.g., customer defined rule set), further enhancing the optimization capabilities of the system. The specific rule set is translated into optimization objectives, including constraints associated with signal characteristics. In a preferred embodiment, the tip and cue server is operable to activate at least one alarm and/or provide at least one report. In another embodiment, the tip and cue server is operable to activate the at least one alarm and/or provide the at least one report according to the specific rule set.

Advantageously, the system is operable to run autonomously and continuously. The system learns from the environment, and, without operator intervention, is operable to detect anomalous signals that either were not there before, or have changed in power or bandwidth. Once detected, the system is operable to send alerts (e.g., by text or email) and begin high resolution spectrum capture, or I/Q capture of the signal of interest. Additionally, the system is operable to optimize and prioritize applications using the learning engine.

Figure 3:
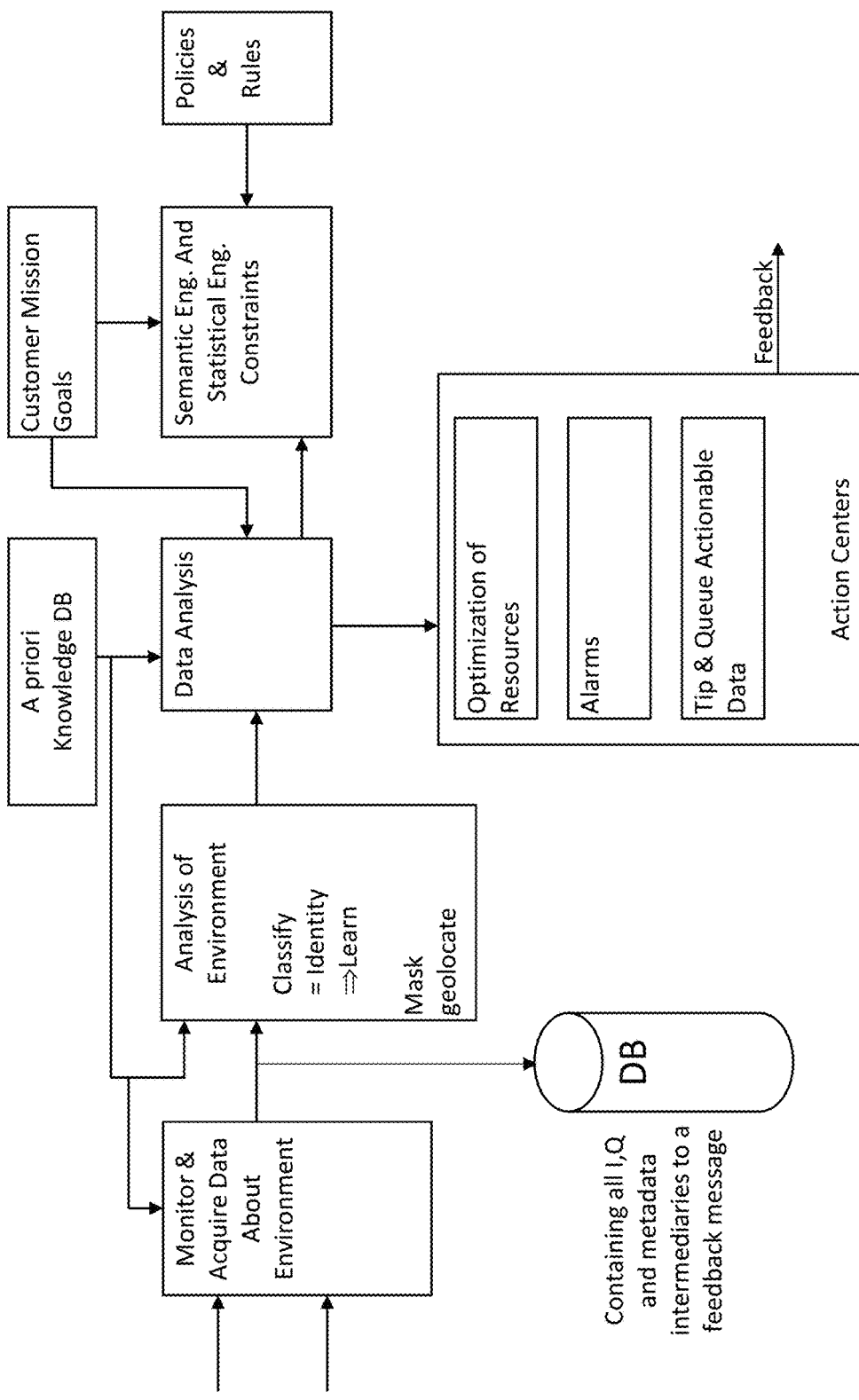
FIG. 3 is a flow diagram of the system according to one embodiment.

FIG. 3 is a flow diagram of the system according to one embodiment.

Figure 4:
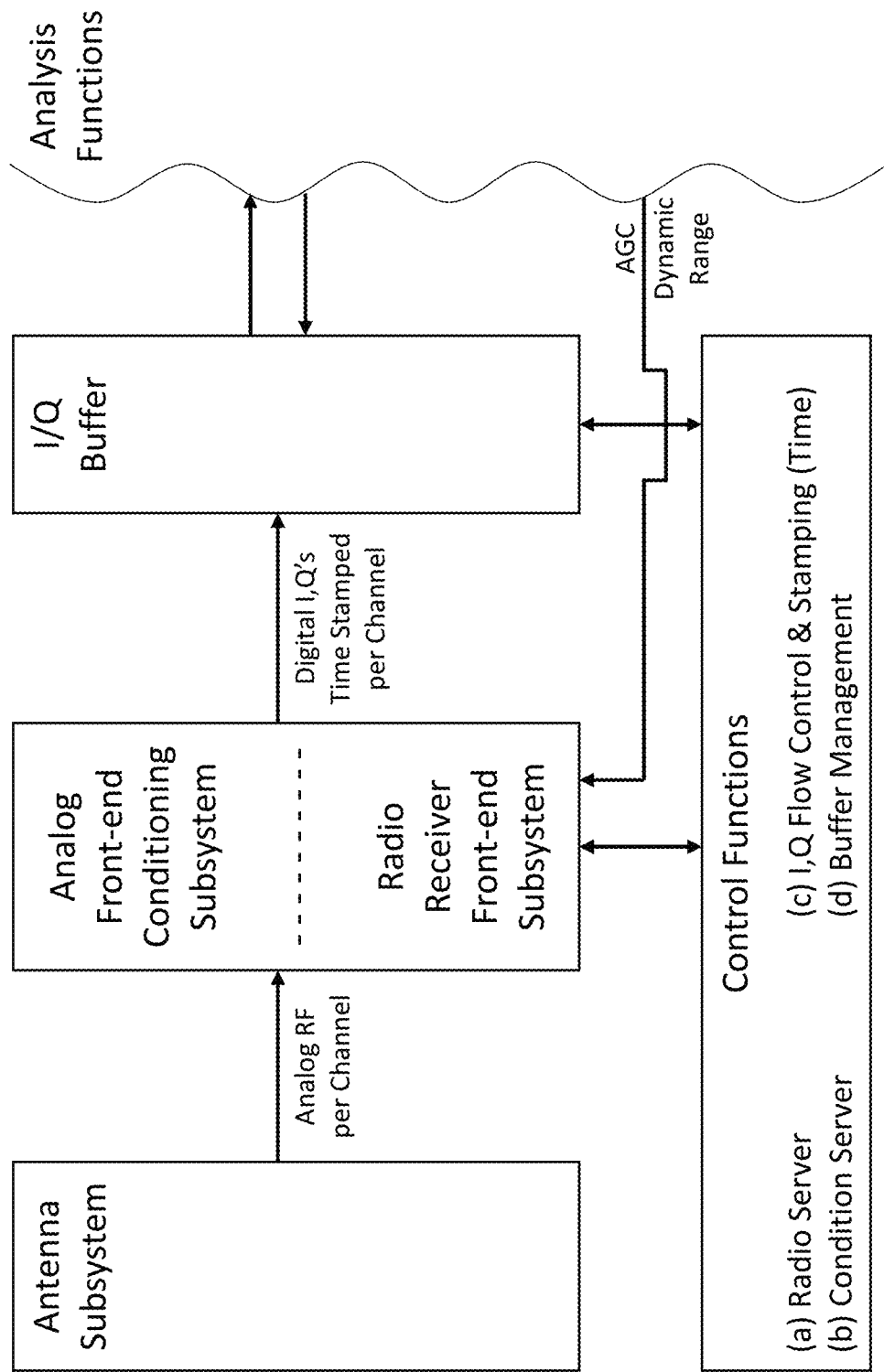
FIG. 4 illustrates the acquisition component of the system.

FIG. 4 illustrates the acquisition component of the system. The system includes an antenna subsystem including at least one antenna, an analog front-end conditioning system, a radio receiver front-end system, and a I/Q buffer. The system is operable to perform control functions including, but not limited to, controlling a radio server, conditioning the radio server, I/Q flow control and/or time stamping, and/or buffer management.

Figure 5:
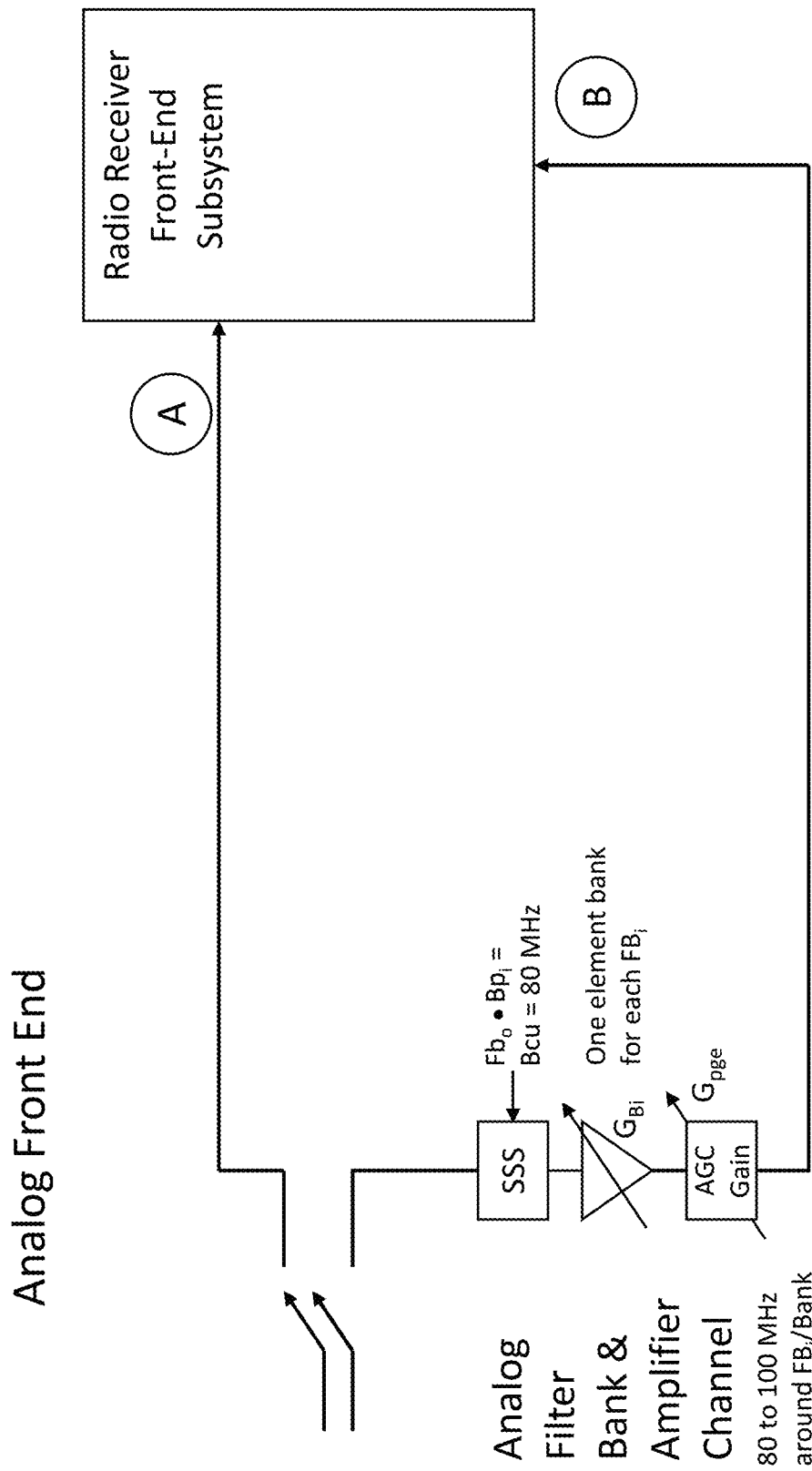
FIG. 5 illustrates one embodiment of an analog front end of the system.

FIG. 5 illustrates one embodiment of an analog front end of the system. In one embodiment, electromagnetic waves are sent directly to a radio receiver front-end subsystem as shown in Path A. Alternatively, the electromagnetic waves are sent through an analog filter bank and amplifier/channel with a filter (SSS), an amplifier (e.g., variable gain amplifier), and an automatic gain controller as shown in Path B before reaching the radio receiver front-end subsystem. In one embodiment, the BCU is 80 MHz. Alternatively, the BCU is 150 MHz. The radio receiver front-end subsystem is described in FIG. 6.

Figure 6:
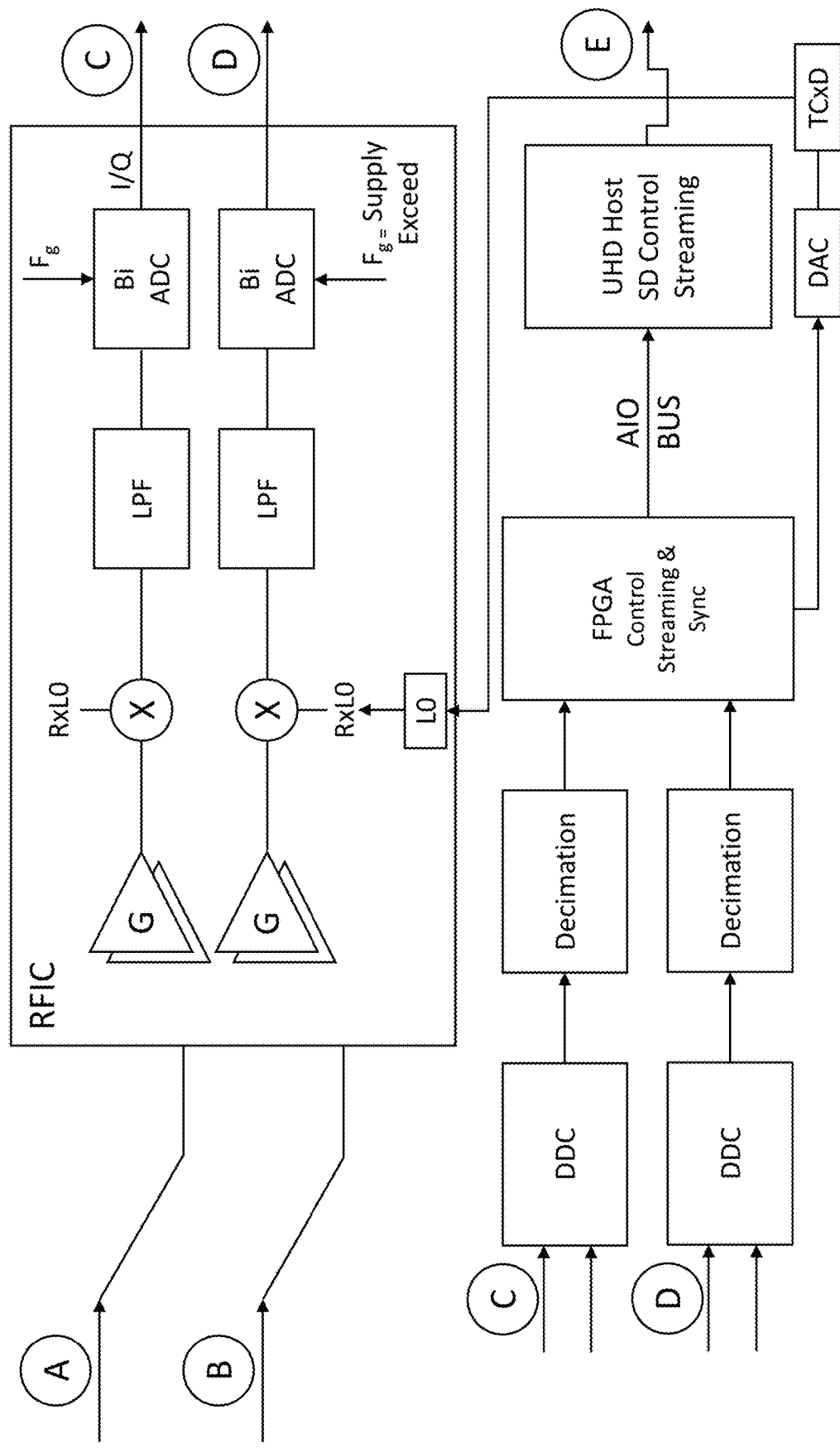
FIG. 6 illustrates one embodiment of a radio receiver front-end subsystem.

FIG. 6 illustrates one embodiment of a radio receiver front-end subsystem. Path A and Path B continue into a radio-frequency integrated circuit (RFIC), and then proceed to a digital down-converter (DDC) before downsampling (e.g., decimation) and moving through a field programmable gate array (FPGA). In one embodiment, signals from the FPGA are operable to be sent to a digital to analog converter (DAC). Alternatively, signals are sent via bus to a Universal Software Radio Peripheral hardware driver (UHD) host and SD controller before continuing to Path E, which is described in FIG. 7.

Figure 7:
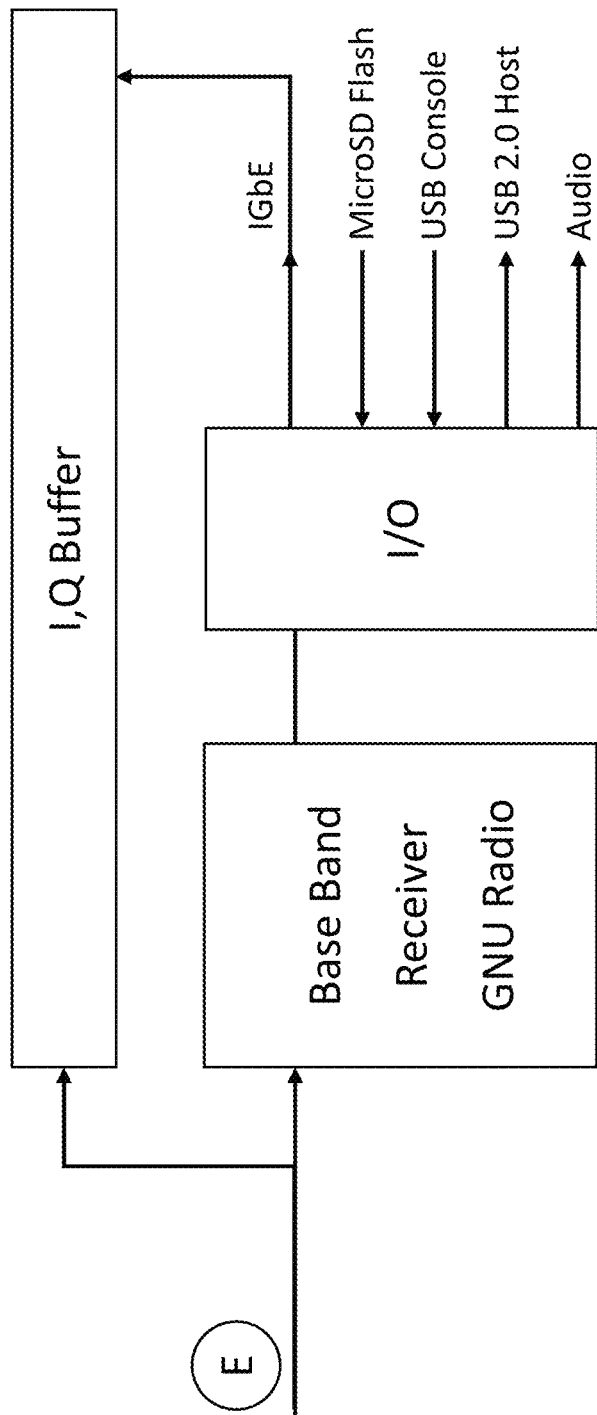
FIG. 7 continues the embodiment of the radio receiver front-end shown in FIG. 6.

FIG. 7 continues the embodiment of the radio receiver front-end shown in FIG. 6 after digitization. In one embodiment, Path E continues to the I,Q buffer. In another embodiment, Path E continues to a baseband receiver. In one embodiment, signals are further processed using signal processing software (e.g., GNU Radio software). In yet another embodiment, the baseband receiver is connected to inputs and/or outputs. In one embodiment, the inputs include, but are not limited to, MicroSD Flash memory and/or a Universal Serial Bus (USB) console. In one embodiment, the outputs include, but are not limited to, USB 2.0 host and/or audio. Alternatively, data from the baseband receiver is sent to the I,Q buffer via the IGbE port.

The system preferably uses multiple receiver channels for the front end. In one embodiment, there are 4 receiver channels. Alternatively, there are 8, 12, 16, or 32 receiver channels. I,Q data is preferably tagged by the receiver channel and receiver antenna (e.g., bandwidth, gain, etc.) and then stored in the I,Q buffer before analysis is completed.

Advantageously, the system is hardware agnostic. The system is operable to provide a suggestion for hardware for a particular frequency set. Additionally, the hardware agnostic nature of the system allows for established architecture to persist. The system is cost effective because it also allows for cheaper antennas to be used, as well as less expensive filters, because calibration can be done using the system rather than the antennas and/or filters, as well as post-ADC processing to rectify any performance loss. Because the system processes all signals present in the spectrum and their interrelationships to extract environmental awareness, so the analog front end does not require elaborate filtering to avoid interference and provide optimum dynamic range. Additionally, the analog front end does not require optimal antennas for all frequency bands and ranges to obtain environmental awareness.

Figure 8:
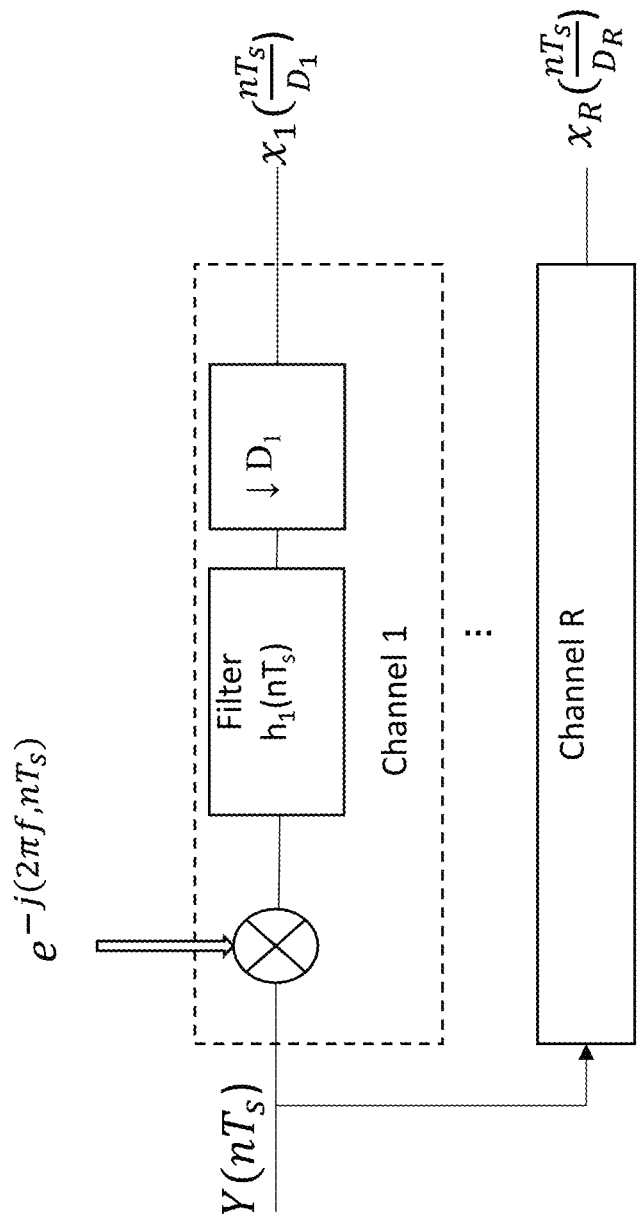
FIG. 8 is an example of a time domain programmable channelizer.

For a time domain programmable channelizer, all filters' impulse responses must be programmable and the number of filters must be programmable. Additionally, the channel bandwidth resolution must be programmable starting from a minimum bandwidth. The center frequency of each channel must also be programmable. Decimation is based on channel bandwidth and desired resolution. However, these requirements are difficult to implement for channels with variable bandwidth and center frequency. Wavelet filters can be used effectively if the center frequency and channel's bandwidth follow a tree structure (e.g., Harr and Deubauchi wavelets). FIG. 8 is an example of a time domain programmable channelizer.

Figure 9:
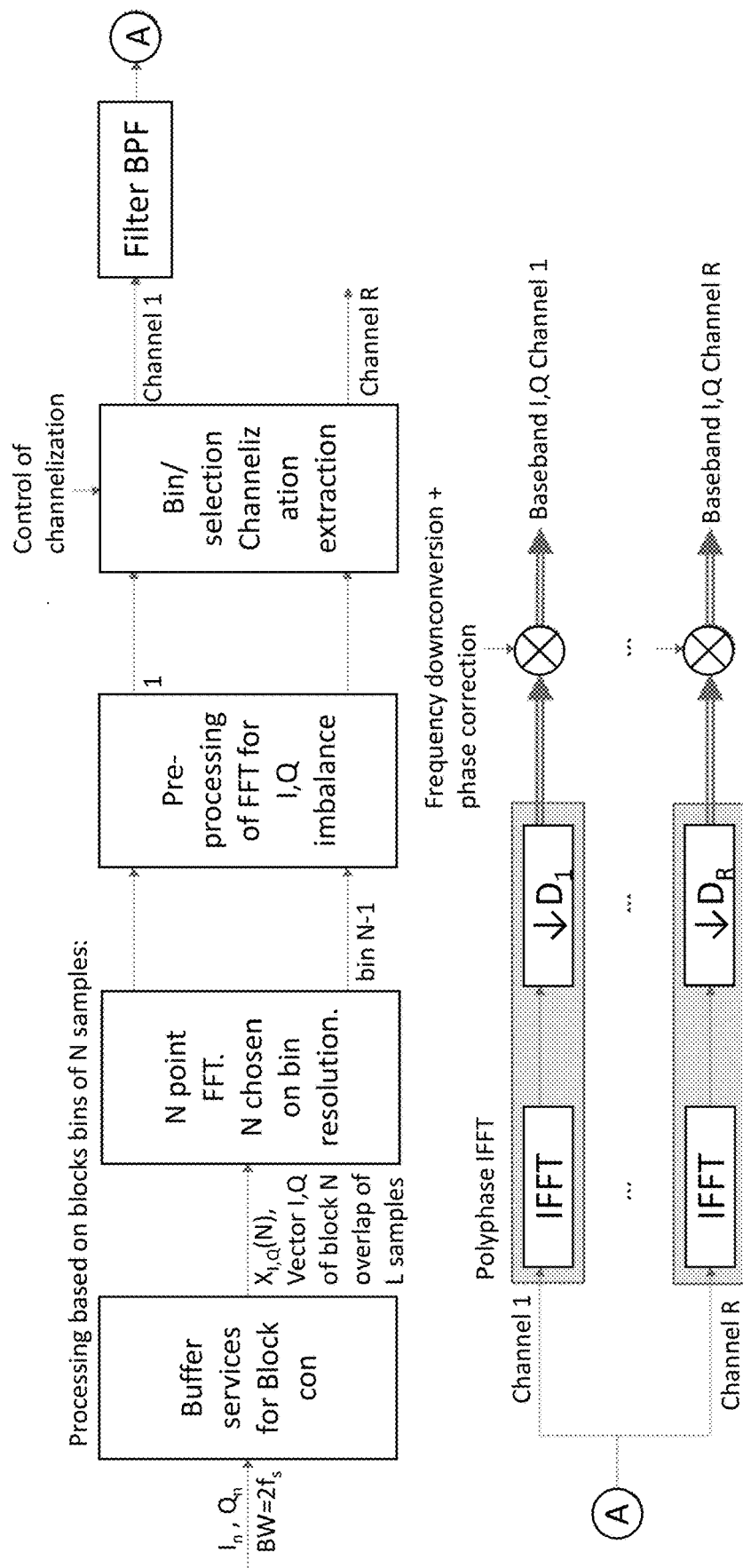
FIG. 9 is an example of a frequency domain programmable channelizer.

In a preferred embodiment, the system includes a frequency domain programmable channelizer as shown in FIG. 9. The programmable channelizer includes buffer services, preprocessing, bin selection, at least one band pass filter (BPF), an inverse fast Fourier transform (IFFT) function, decomposition, and/or frequency down conversion and phase correction to yield baseband I,Q for channels 1 through R. The IFFT function is done to obtain each decomposed channel I,Q at the proper sampling rate. Advantageously, the frequency domain programmable channelizer is more computationally efficient than a time domain programmable channelizer because each filter is just a vector in the frequency domain and the filtering operation is just a vector multiplication, decomposing the input signal into multiple channels of differing bandwidths is parsing the vector representing the input signal frequency domain content into a subvector of different length.

Figure 10:
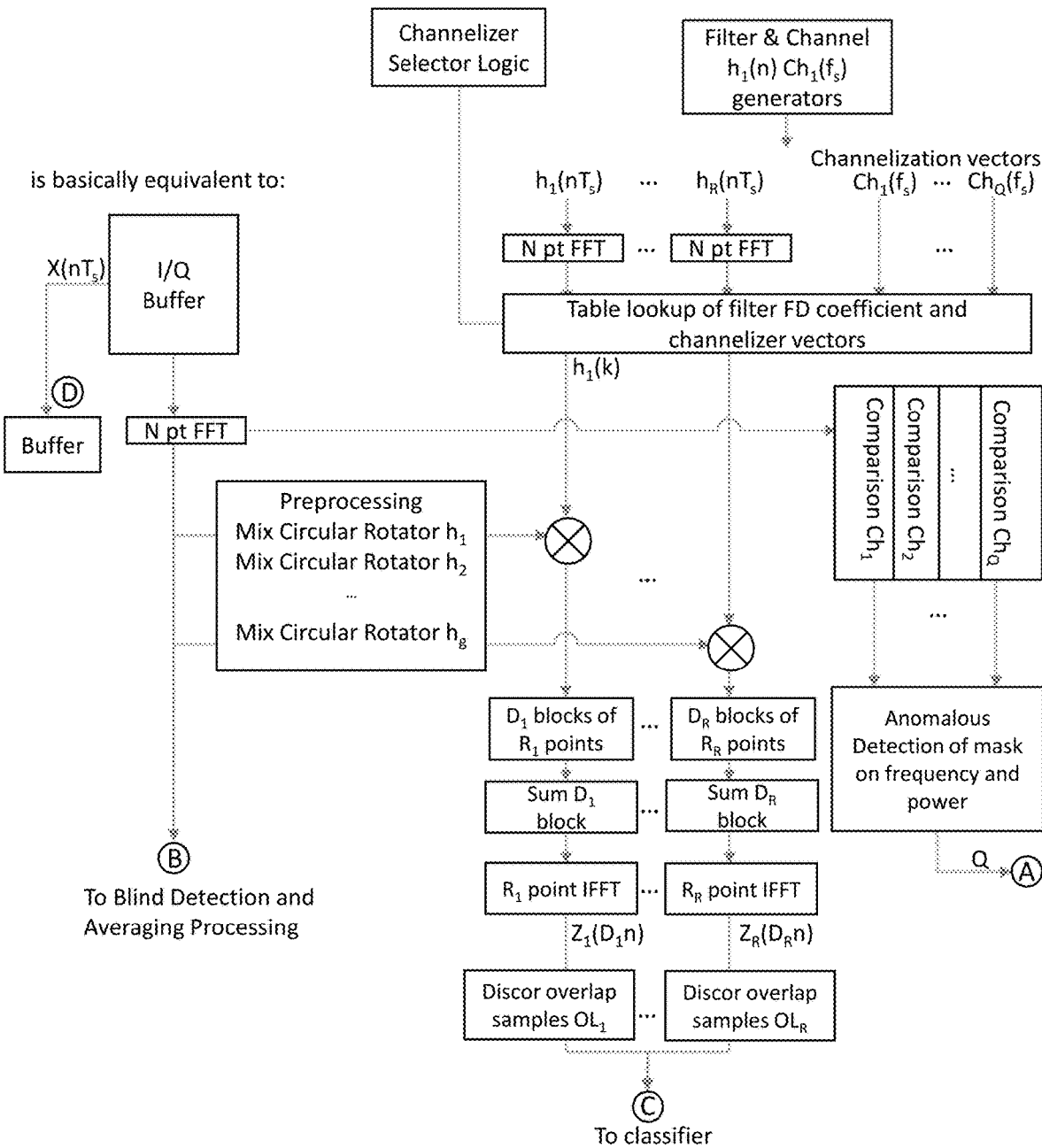
FIG. 10 is another embodiment of a programmable channelizer.

FIG. 10 is another embodiment of a programmable channelizer. Data enters the filter and channels generators with channelization selector logic for a table lookup of filter coefficient and channelization vectors. The programmable channelizer includes a comparison at each channel, which provides anomalous detection using a mask with frequency and power, which is then sent to the learning engine and/or the alarm system ("A"). Data processed with the FFT is sent to the blind detection engine and/or for averaging processing ("B"). Data from the table lookup of filter coefficient and channelization vectors undergoes preprocessing with a mix circular rotator to produce $D_1$ blocks of $R_1$ points. A sum is taken of the $D_1$ block, and an $R_1$ point IFFT is taken to produce discor overlap samples $OL_1$. This process occurs (e.g., in parallel) for $D_1$ blocks of $R_1$ points through $D_R$ blocks of $R_R$ points to produce $OL_1$ through $OL_R$, which are then sent to the classification engine ("C"). All data from the I,Q buffer is preferably stored in a buffered database ("D"). In one embodiment, the I,Q buffer is partitioned into N blocks with L oversamples. In one embodiment, the original sample rate is decimated by $D_i$.

Figure 11:
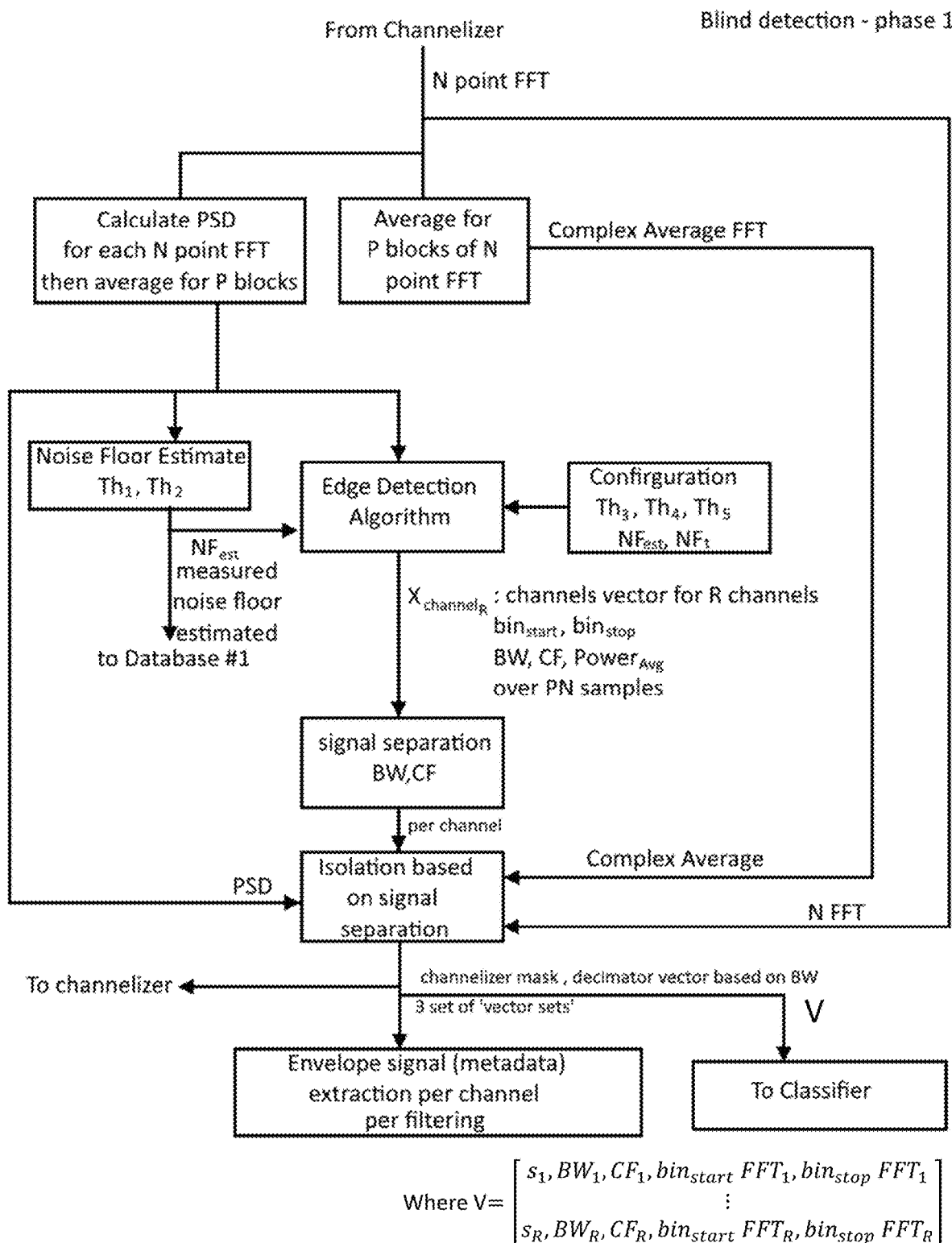
FIG. 11 illustrates one embodiment of a blind detection engine.

FIG. 11 illustrates one embodiment of a blind detection engine. Data from the programmable channelizer undergoes an N point FFT. A power spectral density (PSD) is calculated for each N point FFT and then a complex average FFT is obtained for the P blocks of N point FFT. The PSD is sent to a noise floor estimator, an edge detection algorithm, and/or an isolator. Noise floor estimates from the noise floor estimator are sent to the signal database. The edge detection algorithm passes information to a signal separator (e.g., bandwidth, center frequency). The isolator obtains information including, but not limited to, PSD, the bandwidth and center frequency per channel, the complex average FFT, and/or the N point FFT. Information from the isolator is sent to the programmable channelizer, the envelope feature extraction module, and/or the classification engine.

Figure 12:
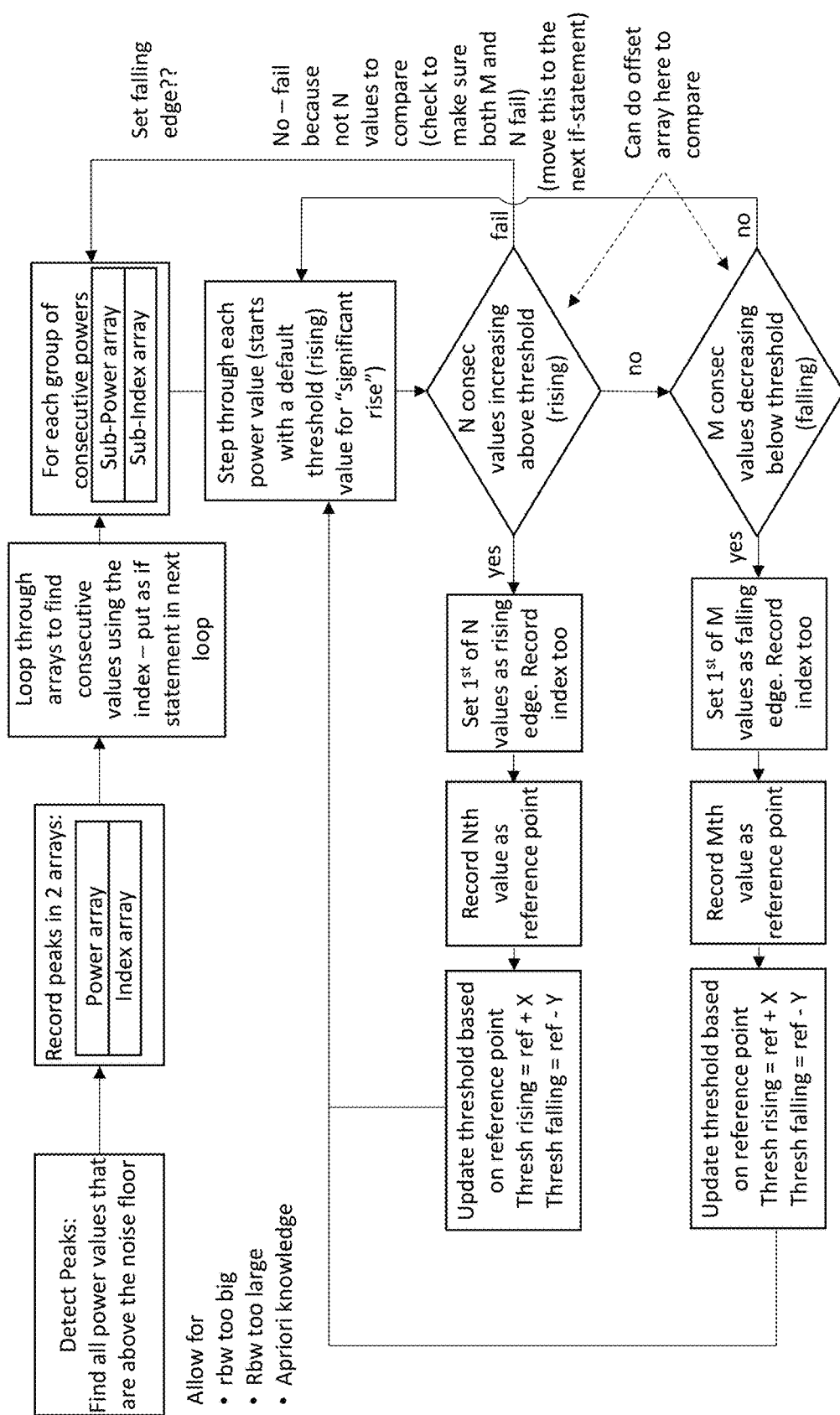
FIG. 12 illustrates an example of an edge detection algorithm.

FIG. 12 illustrates one embodiment of an edge detection algorithm. Peaks are detected for all power values above the noise floor. Peaks are recorded in a power array and/or an index array. Consecutive power values are found by looping through the arrays. For each group of consecutive power values, a sub-power array and/or a sub-index array are created. The blind detection engine steps through each power value starting with a default rising threshold. If N consecutive values are increasing above the rising threshold, a first value of N values is set as the rising edge and the index of the first value of N values is recorded. The Nth value is recorded as a rising reference point. The rising threshold is updated based on the rising reference point, and the blind detection engine continues to scan for rising values. If the blind detection engine does not detect rising values and detects M consecutive values decreasing below a falling threshold, a first value of M values is set as the falling edge and the index of the first value of M values is recorded. The Mth value is recorded as a falling reference point. The falling threshold is updated based on the falling reference point. In one embodiment, x is a value between 1 dB and 2.5 dB. In one embodiment, y is a value between 1 dB and 2.5 dB.

Figure 13:
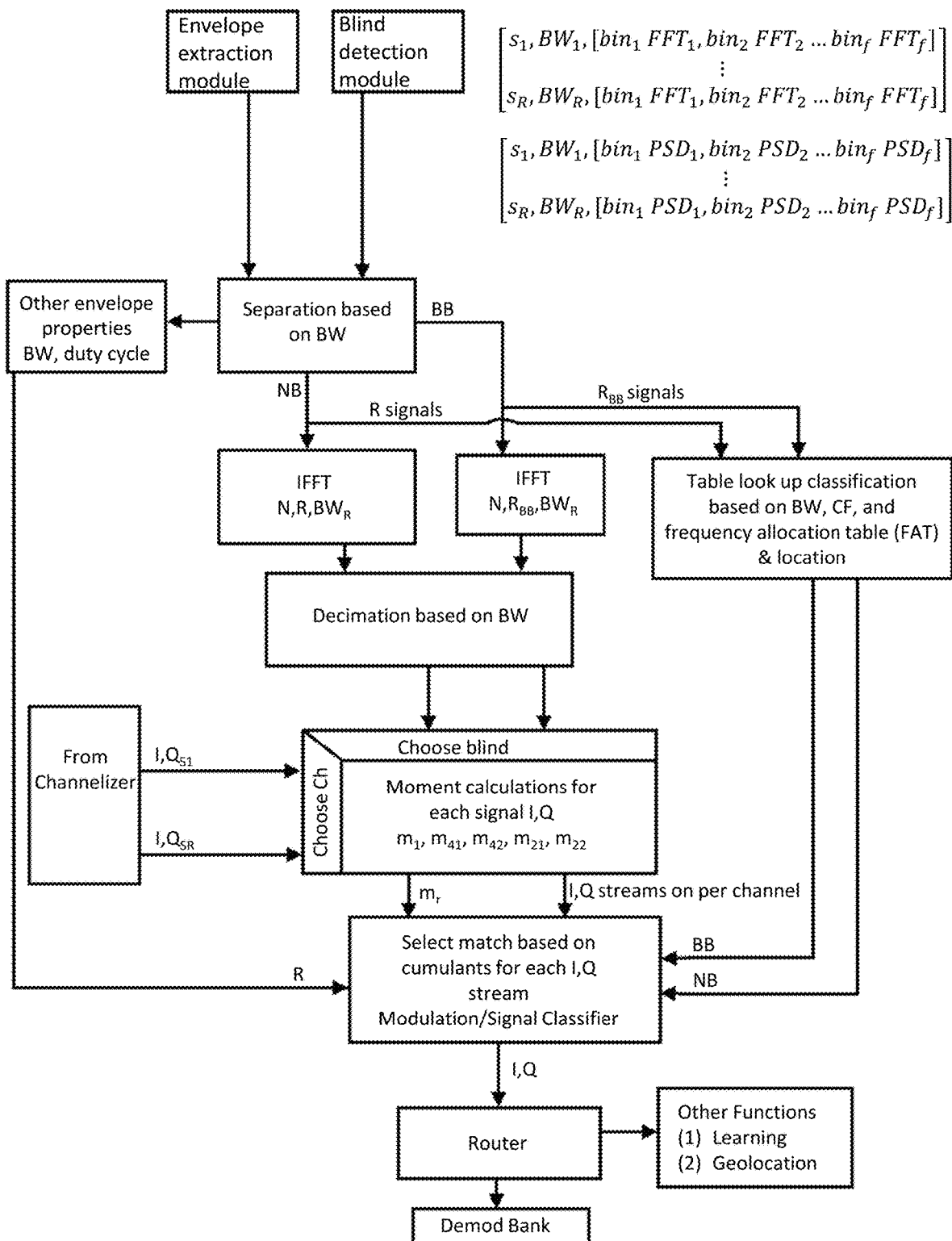
FIG. 13 illustrates an example of a blind classification engine.

The blind classification engine receives information from the blind detection engine as shown in FIG. 13. Signals are separated based on bandwidth and/or other envelope properties (e.g., duty cycle). An IFFT is performed on R signals for narrowband and/or broadband signals. Decimation is then performed based on bandwidth. Moment calculations are performed for each signal I,Q using the decimated values and/or information from the channelizer. In a preferred embodiment, the moment calculations include a second moment and/or a fourth moment for each signal. A match based on cumulants is selected for each I,Q stream, which is sent to the demodulation bank and/or the geolocation engine.

From the definitions of the second and fourth moments, the following equations are used to calculate the cumulants:

$$\hat{C}_{20} = \frac{1}{N}\sum_{n=1}^{n=N}|Y(n)|^2$$

$$\hat{C}_{21} = \frac{1}{N}\sum_{n=1}^{n=N}Y^2(n)$$

$$\hat{C}_{40} = \frac{1}{N}\sum_{n=1}^{n=N}Y^4(n) - 3\hat{C}_{20}^2$$

$$\hat{C}_{41} = \frac{1}{N}\sum_{n=1}^{n=N}Y^3(n)Y^*(n) - 3\hat{C}_{20}\hat{C}_{21}$$

$$\hat{C}_{42} = \frac{1}{N}\sum_{n=1}^{n=N}|Y(n)|^4 - |\hat{C}_{20}|^2 - 2\hat{C}_{21}^2$$

If it assumed that transmitted constellations are normalized to unity average power, which is easily completed by a power factor equal to 0 dB, this results in $\hat{C}_{21} \approx 1$. To calculate a normalized fourth moment is calculated using the following equation:

$$\hat{\hat{C}}_{4J} \triangleq \hat{C}_{4J}/\hat{C}_{21} \text{ for } J=0,1,2$$

Advantageously, normalizing the fourth moment cumulants removes any scaling power problems.

Figure 14:
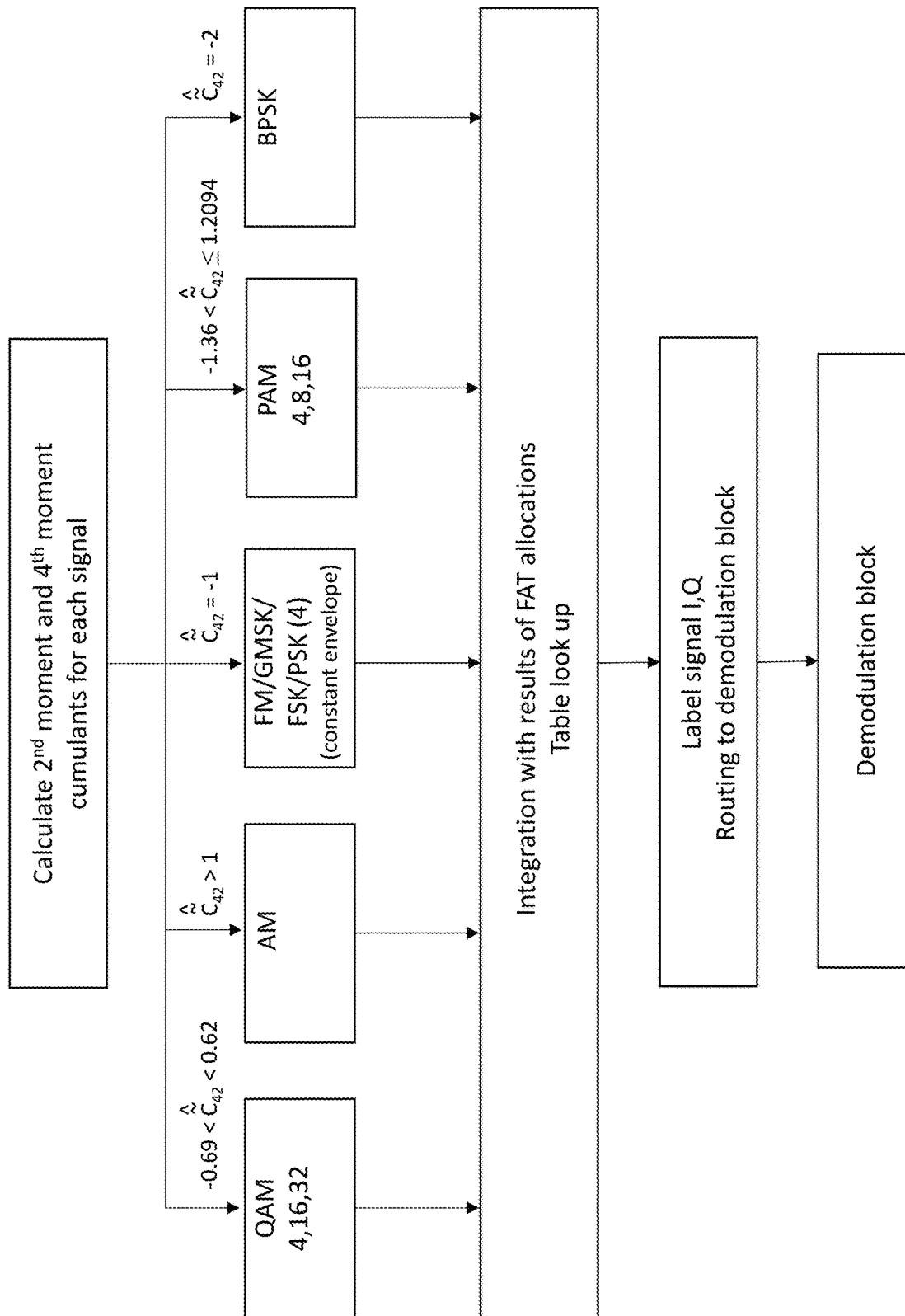
FIG. 14 illustrates details on selection match based on cumulants for modulation selection.

FIG. 14 illustrates details on selection match based on cumulants for modulation selection. As previously described, the cumulants preferably include a second moment and/or a fourth moment for each signal. For example, a fourth moment between −0.9 and 0.62 is a quadrature amplitude modulation (QAM) signal, a fourth moment greater than or equal to 1 is an amplitude modulation (AM) signal, a fourth moment equal to −1 is a constant envelope signal (e.g., frequency modulation (FM), Gaussian minimum-shift keying (GMSK), frequency-shift keying (FSK), or phase-shift keying (PSK)), a fourth moment between −1.36 and 1.209 is a pulse-amplitude modulation (PAM) signal, and a fourth moment equal to −2 is a binary phase-shift keying (BPSK) signal. A type is selected using a look up table, the signal I,Q is labeled with the type, and the information is sent to the demodulation bank.

Additional information about selection match based on cumulants for modulation selection is available in Table 1 below.

TABLE 1

| Type | $\tilde{C}_{40}$ | $\tilde{C}_{42}$ | $\sigma(\tilde{C}_{40})$ | $\sigma(\tilde{C}_{42})$ |
|---|---|---|---|---|
| AM | | >1.0 | | |
| FM | | −1 | | |
| GMSK | | −1 | | |
| FSK | | −1 | | |
| BPSK | −2.00 | −2.00 | 0 | 0 |
| PAM (4) | −1.36 | −1.36 | 2.56 | 2.56 |
| PAM (8) | −1.238 | −1.238 | 4.82 | 4.82 |
| PAM (16) | −1.2094 | −1.2094 | 5.52 | 5.52 |
| PSK (4) | −1.00 | −1.00 | | |
| QAM (4) | −0.68 | −0.68 | | |
| QAM (16) | −0.64 | −0.64 | 3.83 | 2.24 |
| QAM (32) | −0.61 | −0.61 | 3.89 | 2.31 |

Figure 15:
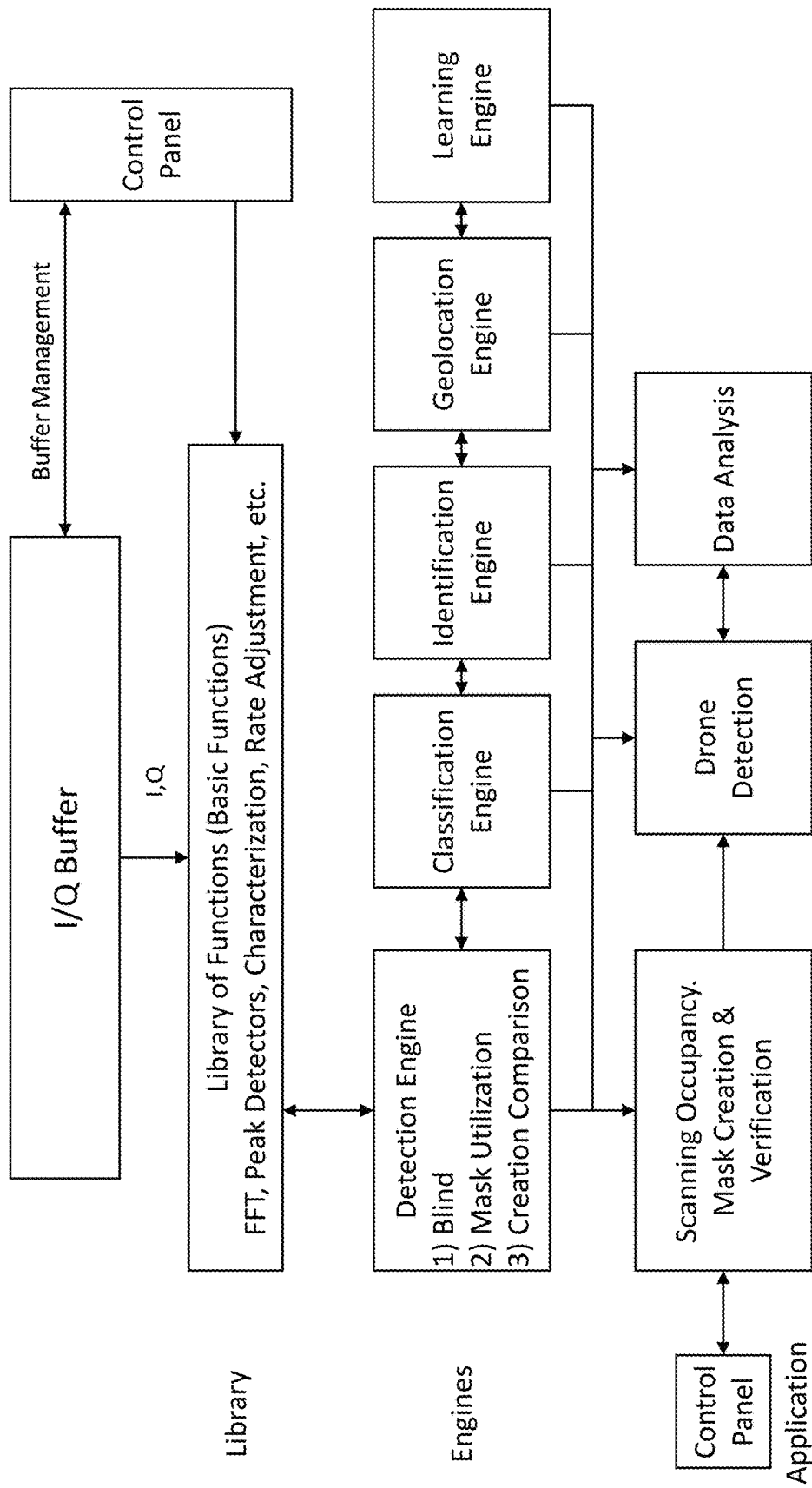
FIG. 15 illustrates a flow diagram according to one embodiment of the present invention.

FIG. 15 illustrates a flow diagram according to one embodiment of the present invention. Data in the I/Q buffer is processed using a library of functions. The library of functions includes, but is not limited to, FFT, peak detection, characterization, and/or rate adjustment. As previously described, the system preferably includes at least one data analysis engine. In one embodiment, the at least one data analysis engine includes a plurality of engines. In one embodiment, the plurality of engines includes, but is not limited to, a detection engine, a classification engine, an identification engine, a geolocation engine, and/or a learning engine. Each of the plurality of engines is operable to interact with the other engines in the plurality of engines. The system is operable to scan for occupancy of the spectrum, create a mask, detect drones, and/or analyze data.

The control panel manages all data flow between the I/Q buffer, library functions, the plurality of engines, applications, and user interface. A collection of basic functions and a particular sequence of operations are called from each of the plurality of engines. Each of the plurality of engines is operable to pass partially processed and/or analyzed data to other engines to enhance functionality of other engines and/or applications. The data from the engines are then combined and processed to build applications and/or features that are customer or market specific.

In one embodiment, a plurality of state machines performs a particular analysis for a customer application. In one embodiment, the plurality of state machines is a plurality of nested state machines. In another embodiment, one state machine is utilized per each engine application. The plurality of state machines is used to control flow of functions and/or an engine's input/output utilization to perform required analyses.

Figure 16:
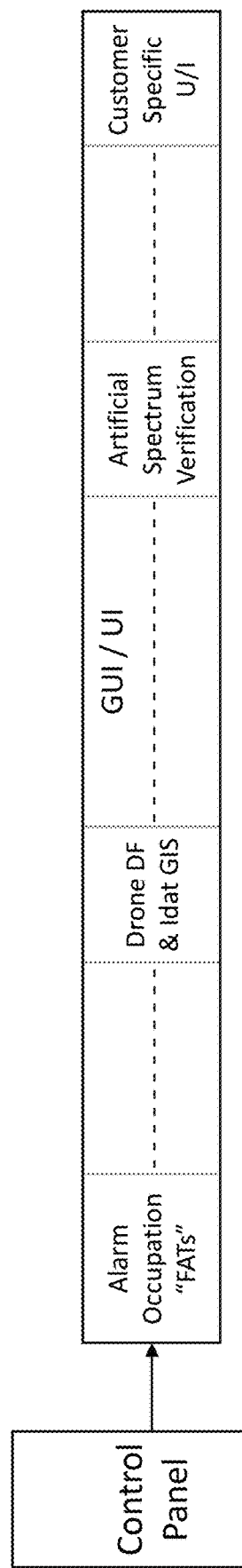
FIG. 16 illustrates control panel functions according to one embodiment.

FIG. 16 illustrates control panel functions according to one embodiment. The control panel is operable to detect occupation of the spectrum, activate an alarm, perform drone detection and direction finding, geolocation, artificial spectrum verification, and provide at least one user interface.

The at least one user interface is preferably a graphical user interface (GUI). The at least one user interface (UI) is operable to display output data from the plurality of engines and/or applications. In one embodiment, the at least one UI incorporates third party GIS for coordinate display information. The at least one UI is also operable to display alarms, reports, utilization statistics, and/or customer application statistics. In one embodiment, the at least one UI includes an administrator UI and at least one customer UI. The at least one customer UI is specific to each customer.

In one embodiment, the systems and methods of the present invention provide unmanned vehicle (e.g., drone) detection. The overall system is capable of surveying the spectrum from 20 MHz to at least 6 GHz, not just the common 2.4 GHz and 5.8 GHz bands as in the prior art. The systems and methods of the present invention are operable to detect UVs and their controllers by protocol.

In one embodiment, the systems and methods of the present invention maintain a state-of-the-art learning system and a protocol library for classifying detected signals by manufacturer and controller type. The state-of-the-art learning system and the protocol library are updated as new protocols emerge.

In one embodiment, classification by protocol chipset is utilized to provide valuable intelligence and knowledge for risk mitigation and threat defense. The valuable intelligence and knowledge include effective operational range, supported peripherals (e.g., external or internal camera, barometers, global positioning system (GPS) and dead reckoning capabilities), integrated obstacle avoidance systems, and interference mitigation techniques.

Advantageously, the system is operable to detect drones that are not in the protocol library. Further, the system is operable to detect drones without demodulating command and control protocols. In one embodiment, the system does not include a protocol library. New protocols and new drones are constantly being released. Additionally, a nefarious operator can switch out the chipset of a drone, which would leave an area vulnerable to the modified drone because a system would not be able to identify the signal as a drone if the protocol is not in the protocol library. In one embodiment, the system generates actionable data that indicates that at least one signal is behaving like a drone. The system performs blind detection, which allows the system to detect the drone signal without the protocol library. In one embodiment, the system is operable to detect drones by evaluating an envelope of the command and control signal. In one embodiment, the system detects the drone signal based on a duty cycle and/or changes in power levels of the signal envelope. In one example, an LTE signal is classified by the system as a drone when moving at a high velocity.

Figure 17:
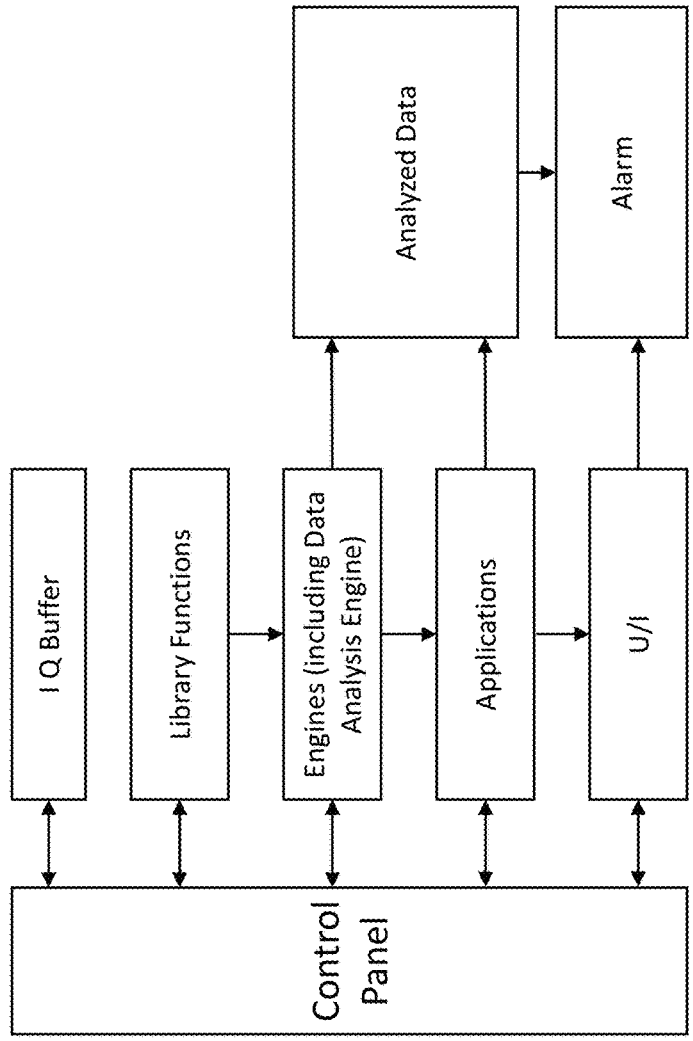
FIG. 17 illustrates one embodiment of an RF analysis sub-architecture of the system.

FIG. 17 illustrates one embodiment of an RF analysis sub-architecture of the system. The control panel interacts with the I/Q buffer, library functions, engines, applications, and/or user interface. The engines include a data analysis engine. Analyzed data from the data analysis engine results in an alarm when an alarm condition is met. The alarm is transmitted via text and/or email, or is visualized on a graphical user interface (GUI) of at least one remote device (e.g., smartphone, tablet, laptop computer, desktop computer).

Figure 18:
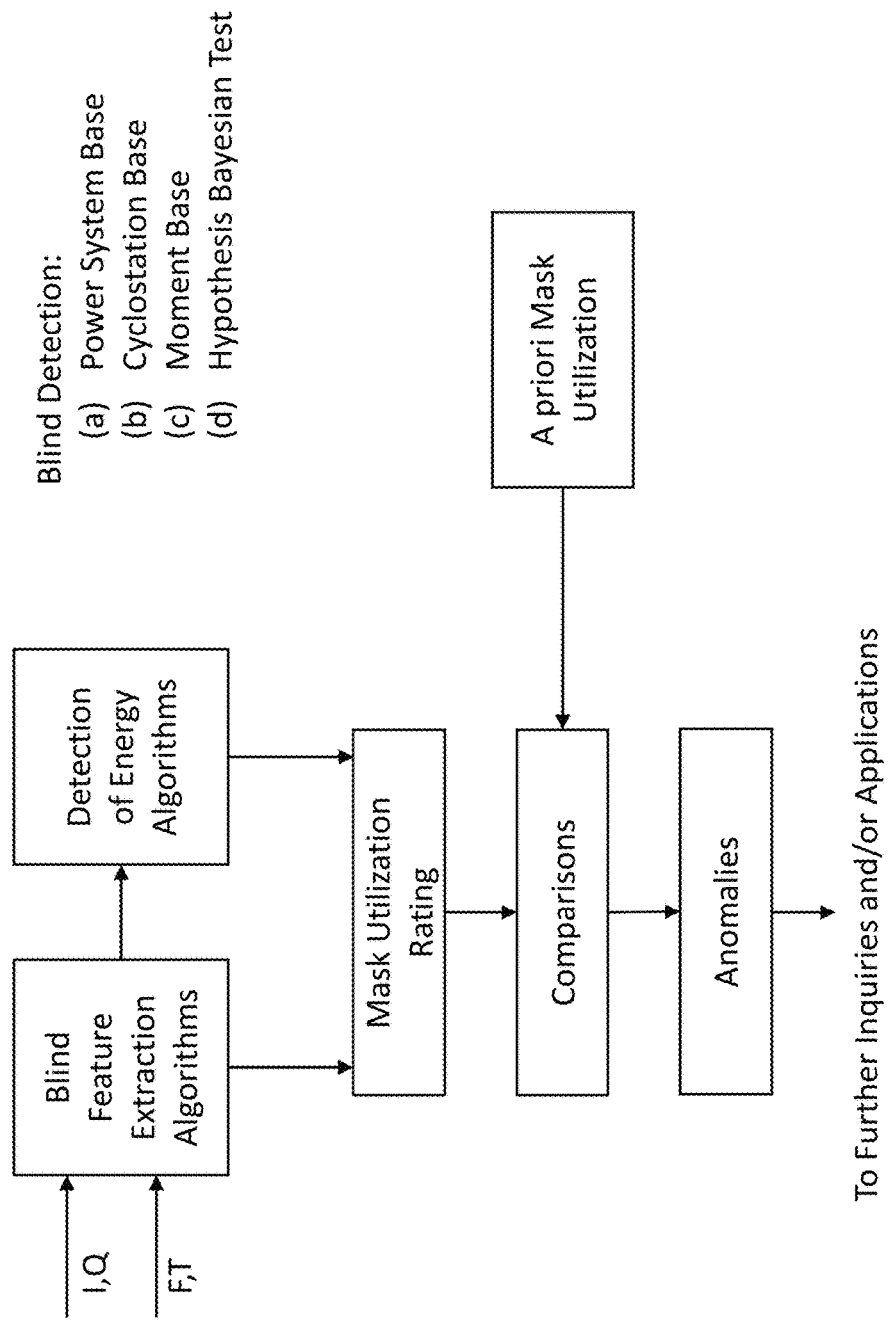
FIG. 18 illustrates one embodiment of a detection engine of the system.

FIG. 18 illustrates one embodiment of a detection engine of the system. The detection engine receives data from the at least one monitoring unit. the detection engine includes blind feature extraction algorithms. A mask is created. The detection engine then performs a mask utilization rating and the mask is compared to previous masks. Anomalies are then detected.

Figure 19:
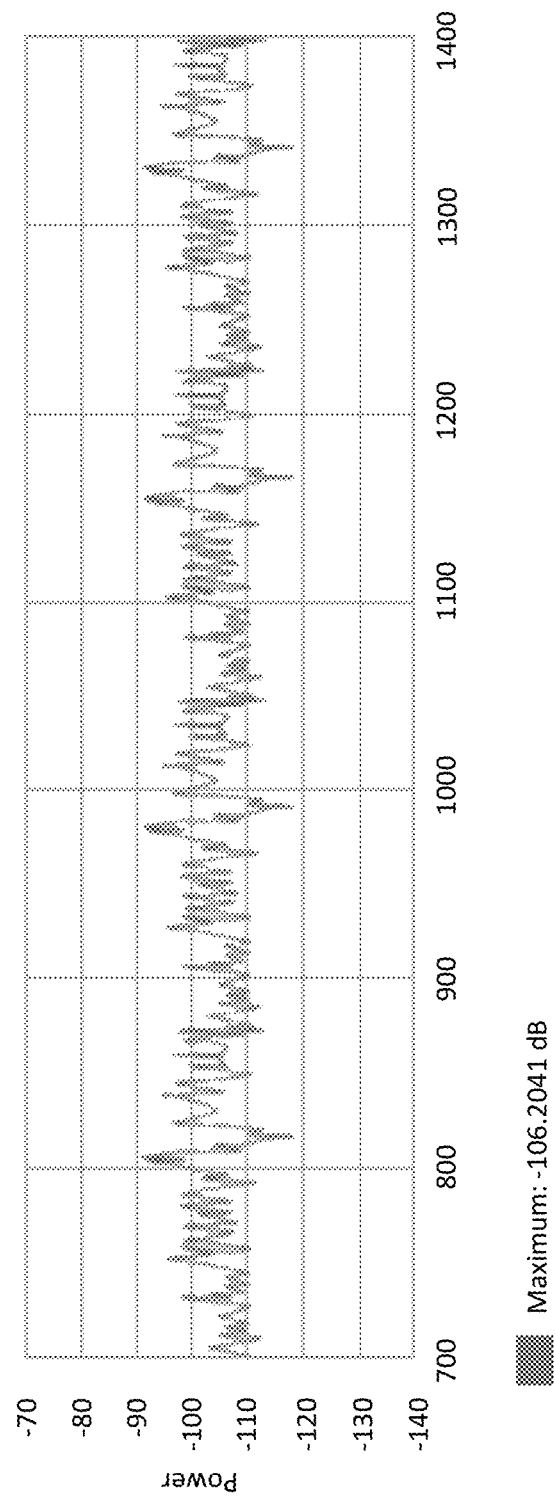
FIG. 19 illustrates a mask according to one embodiment of the present invention.

As previously described, in one embodiment, the data analysis engine is operable to perform mask creation and analyze an electromagnetic (e.g., RF) environment using masks. Mask creation is a process of elaborating a representation of an electromagnetic environment by analyzing a spectrum of signals over a certain period of time. A mask is created with a desired frequency range (e.g., as entered into the system via user input), and FFT streaming data is also used in the mask creation process. A first derivative is calculated and used for identifying maximum power values. A moving average value is created as FFT data is received during a selected time period for mask creation (e.g., via user input). For example, the time period is 10 seconds. The result is an FFT array with an average of maximum power values, which is called a mask. FIG. 19 illustrates a mask according to one embodiment of the present invention.

In one embodiment, the mask is used for electromagnetic environment analysis. In one embodiment, the mask is used for identifying potential unwanted signals in an electromagnetic (e.g., RF) environment. The system is operable to utilize masks based on a priori knowledge and/or masks based on expected behavior of the electromagnetic environment.

Each mask has an analysis time. During its analysis time, a mask is scanned and live FFT streaming data is compared against the mask before next mask arrives. If a value is detected over the mask range, a trigger analysis is performed. Each mask has a set of trigger conditions, and an alarm is triggered into the system if the trigger conditions are met. In one embodiment, there are three main trigger conditions including an alarm duration, a decibel (dB) offset, and a count. The alarm duration is a time window an alarm needs to appear to be considered a trigger condition. For example, the time window is 2 seconds. If a signal is seen for 2 seconds, it passes to the next condition. The dB offset is a threshold value (i.e., dB value) a signal needs to be above the mask to be considered as a potential alarm. The count is the number of times the first two conditions need to happen before an alarm is triggered into the system.

Figure 20:
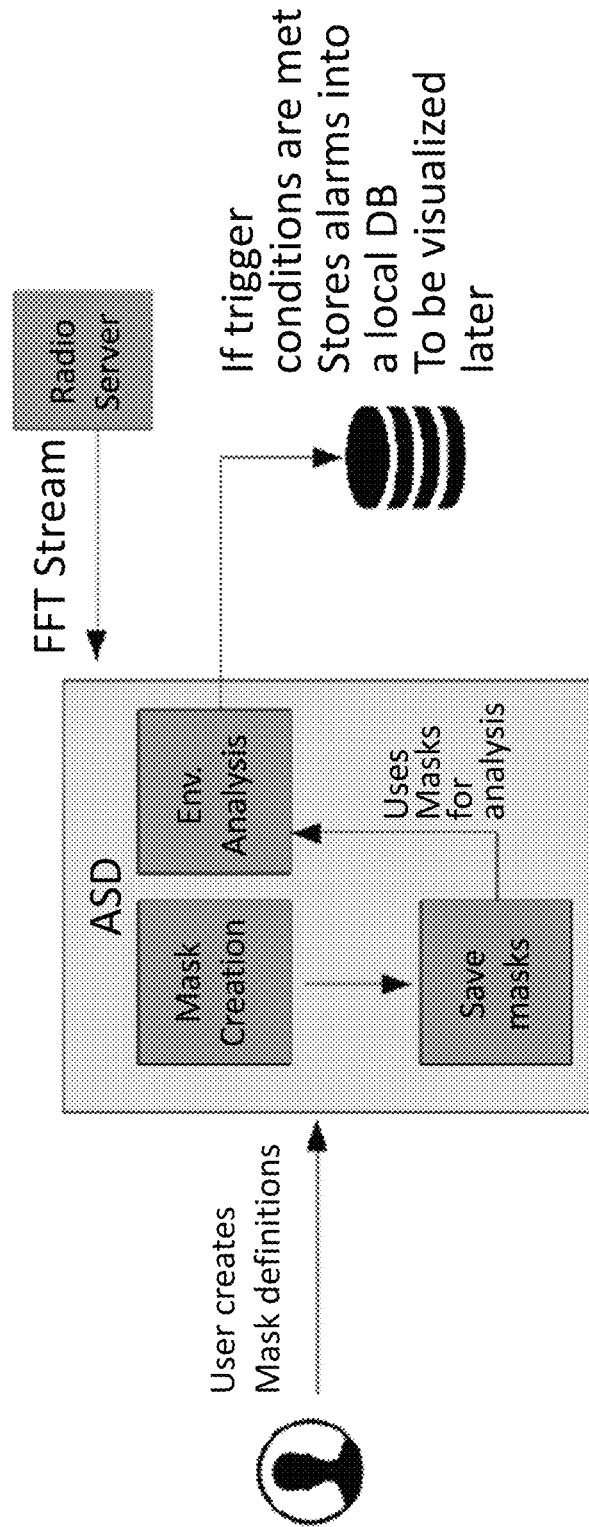
FIG. 20 illustrates a workflow of automatic signal detection according to one embodiment of the present invention.

FIG. 20 illustrates a workflow of automatic signal detection according to one embodiment of the present invention. A mask definition is specified by a user for an automatic signal detection process including creating masks, saving masks, and performing electromagnetic (e.g., RF) environment analysis based on the masks created and FFT data stream from a radio server. In one embodiment, if trigger conditions are met, alarms are triggered and stored to a local database for visualization.

Figure 21:
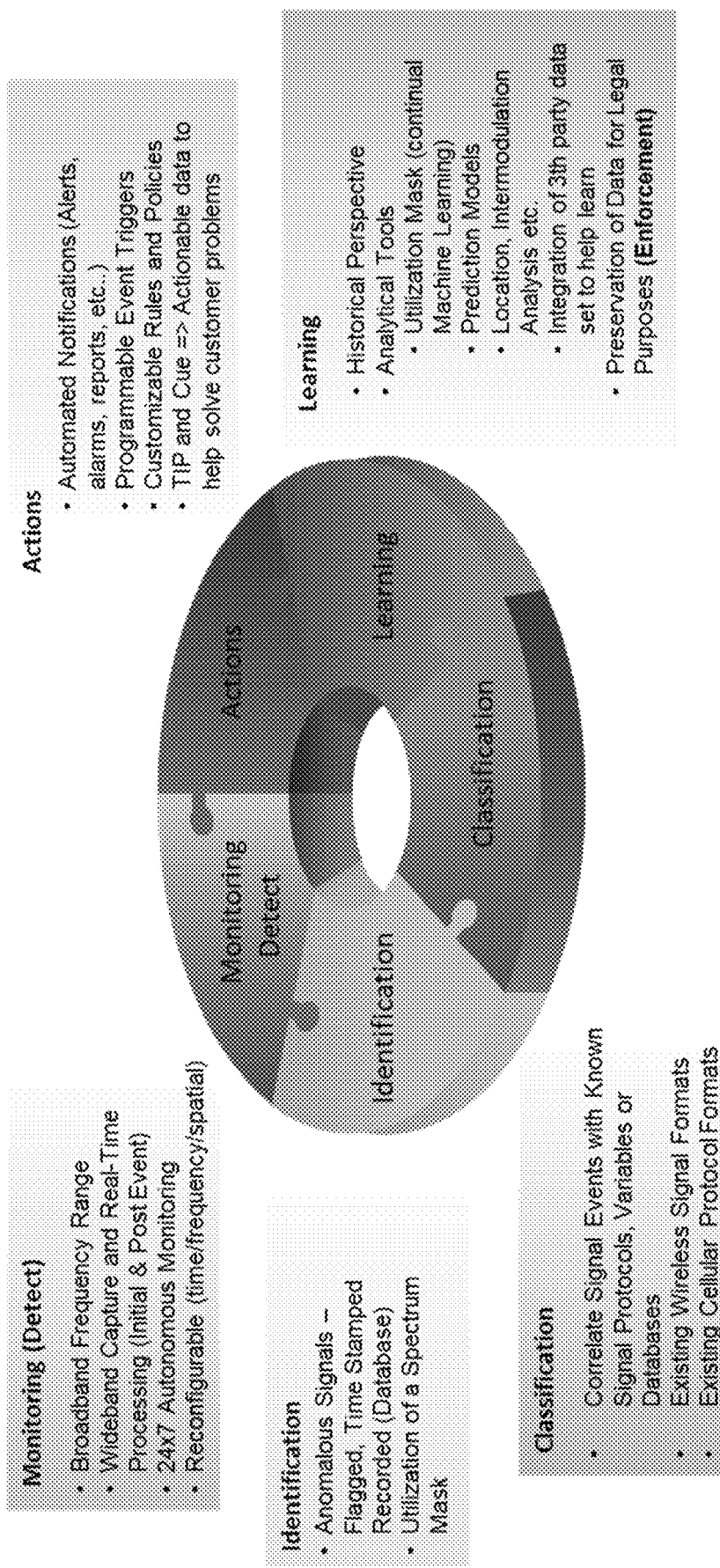
FIG. 21 illustrates components of a Dynamic Spectrum Utilization and Sharing model according to one embodiment of the present invention.

FIG. 21 illustrates components of a Dynamic Spectrum Utilization and Sharing model according to one embodiment of the present invention. By employing the Dynamic Spectrum Utilization and Sharing model, the present invention is operable to perform a plurality of radio frequency (RF) environmental awareness functionalities including, but not limited to, monitoring and/or detection, identification, and/or classification. Monitoring and/or detection functionalities include, but are not limited to, broadband frequency range detection, wideband capture in real-time or near-real-time, initial processing and/or post event processing, 24-hour autonomous monitoring, and/or reconfiguration options relating to time, frequency, and spatial settings. Identification functionalities include, but are not limited to, anomalous signal detection, anomalous signal flagging, anomalous signal time stamp recording, providing an anomalous signal database, and/or utilization of a spectrum mask. In one embodiment, the spectrum mask is a dynamic spectrum mask. Classification functionalities include, but are not limited to, correlating signal events with known signal protocols, correlating signal events with known variables, correlating signal events with known databases, correlating signal events with existing wireless signal formats, and/or correlating signal events with existing cellular protocol formats. Each of the aforementioned functionalities incorporates learning processes and/or procedures. These include, but are not limited to, historical data analysis, data preservation tools, and/or learning analytics. Incorporation of machine learning (ML), artificial intelligence (AI), and/or neural networks (NN) ensures that every aspect of detection, monitoring, identification, and/or classification is performed autonomously. This is compounded through the use of the learning analytics, enabling the use of utilization masks for continual ML, prediction modeling, location analysis, intermodulation analysis, and/or the integration of third-party data sets for increasing overall learning capabilities and/or functionalities of the platform. Moreover, these capabilities and/or functionalities are backed up through secure data preservation services, providing both a secure platform environment and/or data enforcement documentation (i.e., legal documents). Furthermore, the platform is operable to provide automated notifications, programmable event triggers, customizable rules and/or policies, and Tip and Cue practices. Automated notifications include, but are not limited to, alerts, alarms, and/or reports. Advantageously, this functionality enables the platform to react to specific rules and/or policies, as well as incorporating the platform's own awareness and knowledge, creating an optimized platform for any RF environment and/or mission.

Prediction models used by the platform provide an accurate insight into the dynamic spectrum allocation and utilization functionalities. These prediction models enable the platform to autonomously create forecasts for future spectrum usage. In addition, the prediction models used by the platform incorporate descriptive analytics, diagnostic analytics, predictive analytics, and/or prescriptive analytics. Descriptive analytics refers specifically to the data stored, analyzed, and/or used by the platform. Descriptive analytics provides data enabling the platform to act and/or provide a suggested action. Diagnostic analytics refers to how and/or why the descriptive analytics acted and/or suggested an action. Predictive analytics specifically refers to the utilization of techniques including, but not limited to, ML, AI, NNs, historical data, and/or data mining to make future predictions and/or models. Prescriptive analytics refers to the act and/or the suggested act generated by the descriptive analytics. Once this predictive model is in place, the platform is operable to recommend and/or perform actions based on historical data, external data sources, ML, AI, NNs, and/or other learning techniques.

Figure 22:
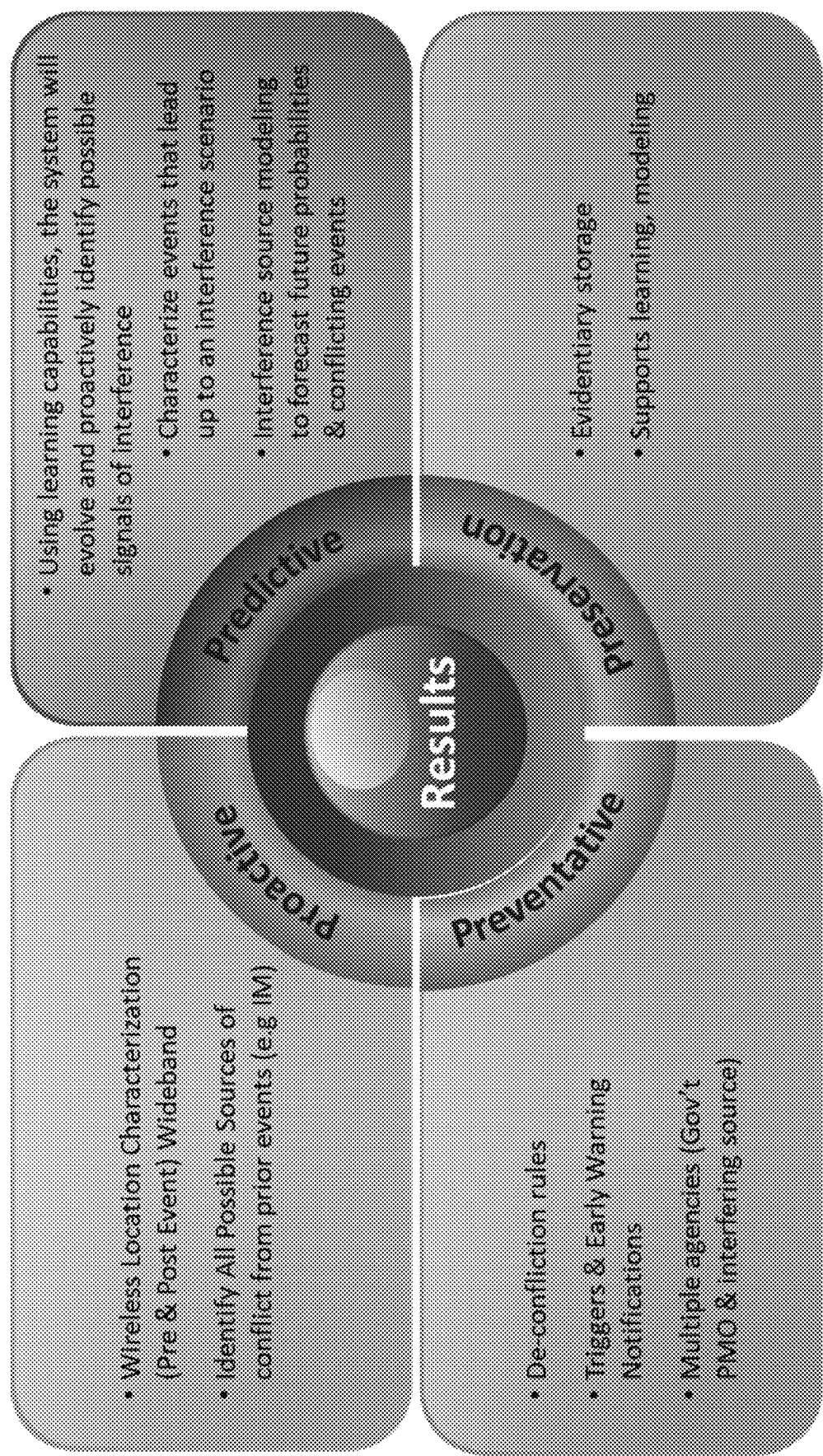
FIG. 22 illustrates a Results model provided by the system according to one embodiment of the present invention.

FIG. 22 illustrates a Results model according to one embodiment of the present invention. The Results model provided by the present invention is centered around four core practices: proactive, predictive, preventative, and preservation. The predictive practice refers to using the aforementioned learning functionalities and capabilities to evolve the platform, enabling the characterization of events that led up to an interference scenario and/or performing interference source modeling to forecast future probabilities and/or conflicting events. The predictive practice is intertwined with the platform remaining proactive, identifying possible signals of interference. While identifying possible signals of interference is a combination of the platform's predictive and proactive capabilities, the platform also remains proactive in performing wireless location characterization for both pre- and post-event scenarios. In addition, the platform's proactive capabilities include, but are not limited to, identifying all possible sources of conflict based on prior events. Furthermore, the platform also focuses on preventative practices. These include, but are not limited to, maintaining a set of de-confliction rules, providing trigger warning notifications and/or early warning notifications, and/or maintaining compatibility with multiple government agencies, including corresponding government project management offices (PMOs) and any interfering sources. In one embodiment, the platform automatically establishes the set of de-confliction rules, where the set of de-confliction rules are operable for editing. In one embodiment, the platform is operable to autonomously edit the set of de-confliction rules. In another embodiment, the platform enables editing of the set of de-confliction rules via user input. Finally, the platform includes preservation components and/or functionalities. These include, but are not limited to, evidentiary storage, learning capabilities, and modeling functionality. Each of these four core practices is interconnected within the platform, enabling dynamic spectrum utilization and sharing.

Geolocation

Geolocation is an additional aspect relating to electromagnetic (e.g., RF) analysis of an environment. The primary functions of the electromagnetic analysis of the environment include, but are not limited to, detection, classification, identification, learning, and/or geolocation. Additionally, the electromagnetic analysis is operable to output environmental awareness data.

The system includes a geolocation engine, operable to use both passive and/or active methods of radio geolocation. In general, radio geolocation refers to the geographic location of man-made emitter sources propagating using radio (electromagnetic) waves as they impinge upon a man-made geo-locator, or receiver. Passive radio geolocation requires no transmission of signals by a geo-locator, whereas active radio geolocation involves a geolocator transmitting signals that interact with an emitter source. Passive methods of geolocation include, but are not limited to, single directional beam antenna response, multidirectional beam antenna response (Amplitude Ratio), multi-antenna element response (Array Processing), line of bearing (LOB)-to-position solutions, and/or general optimization. Multi-antenna element response methods include, but are not limited to, phase interferometry, beamforming, conventional array manifold processing approaches, and/or high-resolution array manifold processing approaches using signals subspace. While these passive methods primarily apply to approaches for Direction Finding (DF) as spatial filtering, passive methods that apply to approaches other than DF as spatial filtering are operable for use by the system. DF refers to the process of estimating the direction of arrival of propagating emitter signals as they impinge on a receiver. Passive methods further include DF approaches based on general optimization including, but not limited to, digital pre-distortion (DPD), convex programming, and/or distributed swarm approaches.

In addition to the previously mentioned passive approaches, the system is operable to apply approaches based on ranging observations including, but not limited to, receiver signal strength indicators (RSSI), time of arrival (TOA), and/or time difference of arrival (TDOA) methods. RSSI approaches relate to the generation of observable data and/or location estimation. TOA and/or TDOA approaches relate to generating observable data from distributed multi antenna systems and/or single antenna systems, and/or location estimation using non-linear optimization and/or constraint linear optimization.

In a preferred embodiment, geolocation is performed using Angle of Arrival (AOA), Time Difference of Arrival (TDOA), Frequency Difference of Arrival (FDOA), and power distribution ratio measurements.

Figure 23:
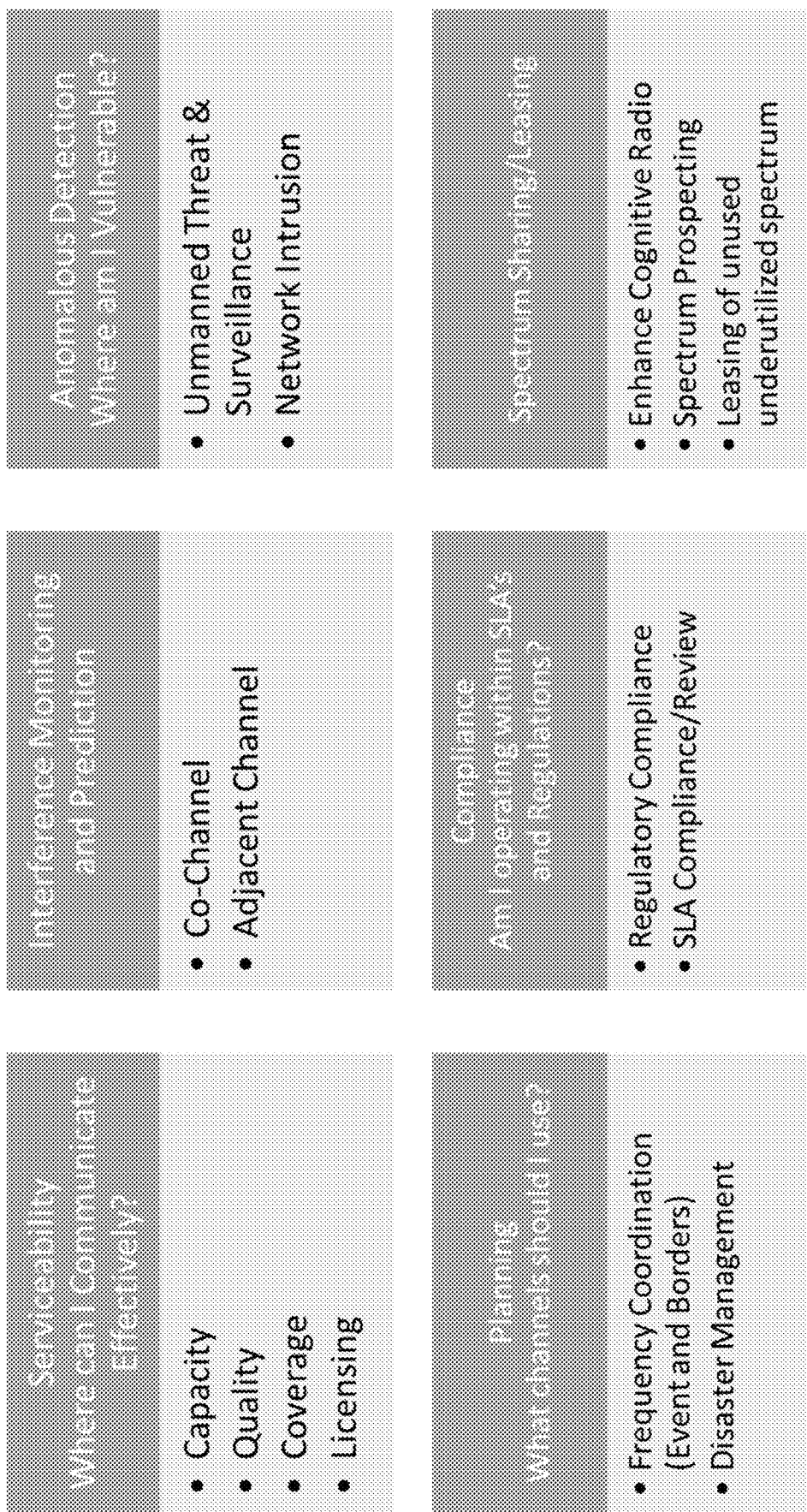
FIG. 23 is a table listing problems that are operable to be solved using the present invention.

FIG. 23 is a table listing problems that are operable to be solved using the present invention, including serviceability, interference, monitoring and prediction, anomalous detection, planning, compliance, and/or spectrum sharing or leasing.

Figure 24:
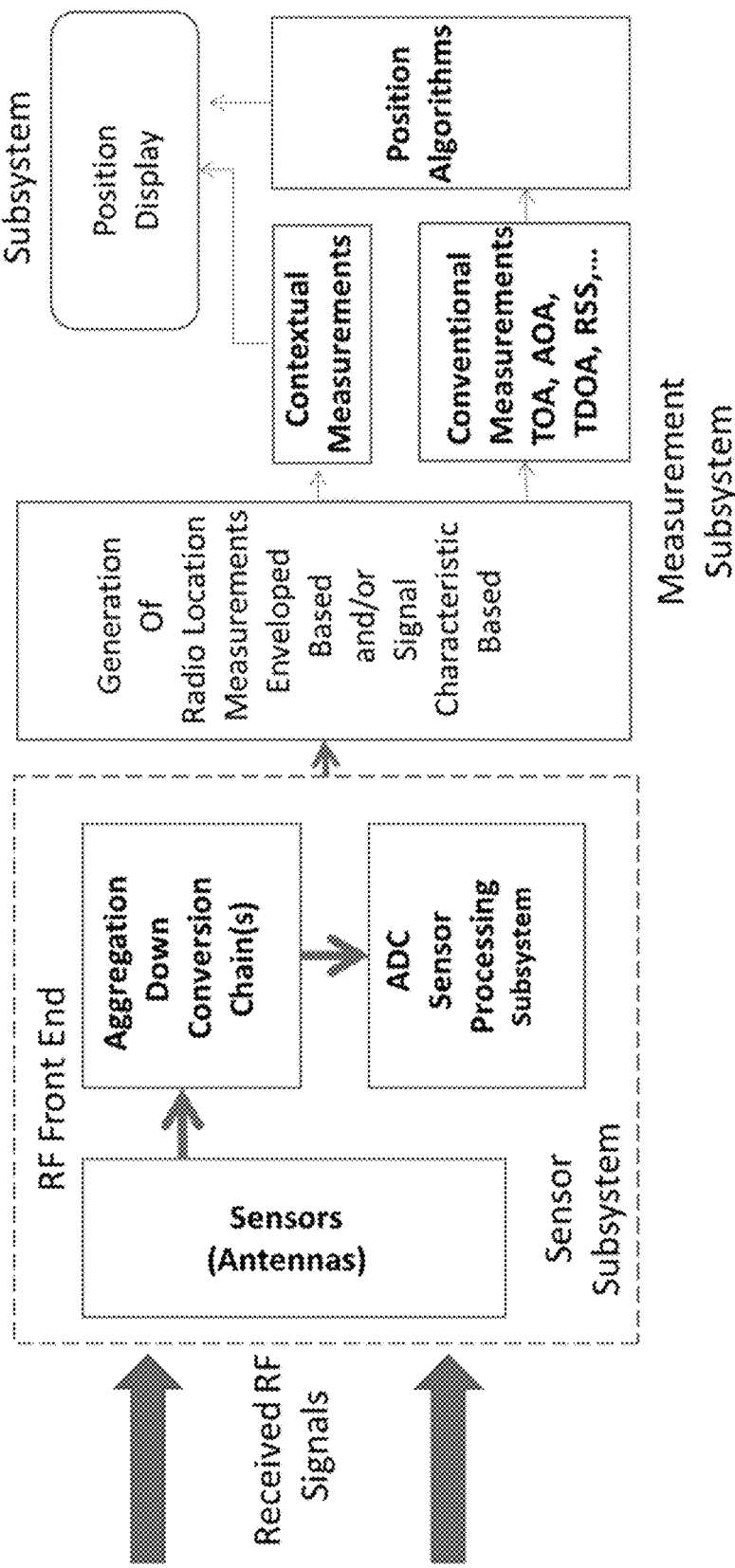
FIG. 24 illustrates a passive geolocation radio engine system view according to one embodiment of the present invention.

FIG. 24 illustrates a passive geolocation radio engine system view according to one embodiment of the present invention. First, a radio frequency (RF) front end receives at least one RF signal. The RF front end includes, but is not limited to, a set of sensors, a sensor subsystem, at least one analog to digital converter (ADC), and/or an ADC sensor processing subsystem. Once the at least one RF signal has been analyzed by the RF front end and/or the sensor subsystem, the at least one RF signal becomes at least one analyzed RF signal. The at least one analyzed RF signal is output to a measurement subsystem. The measurement subsystem is operable to generate radio location measurements. The radio location measurements are envelope-based and/or signal characteristic-based. The measurement subsystem is further operable to generate contextual measurements and/or conventional measurements relating to TOA, AOA, TDOA, receiver signal strength (RSS), RSSI, and/or FDOA. The generated conventional measurements are then analyzed using position algorithms, further enhancing measurement accuracy. Once the contextual measurements are generated and/or the conventional measurements are analyzed using position algorithms, the at least one analyzed RF signal is sent to a position engine subsystem. The position engine subsystem includes a position display. Each of the previously mentioned components, systems, and/or subsystems are operable for network communication.

The geolocation engine is operable to use a plurality of algorithms to determine a location of the at least one signal. The plurality of algorithms includes, but is not limited to, TDOA, FDOA, AOA, power level measurements, and/or graphical geolocation, which is described below. The geolocation is operable to autonomously decide what algorithm(s) to use to determine the location.

Figure 25:
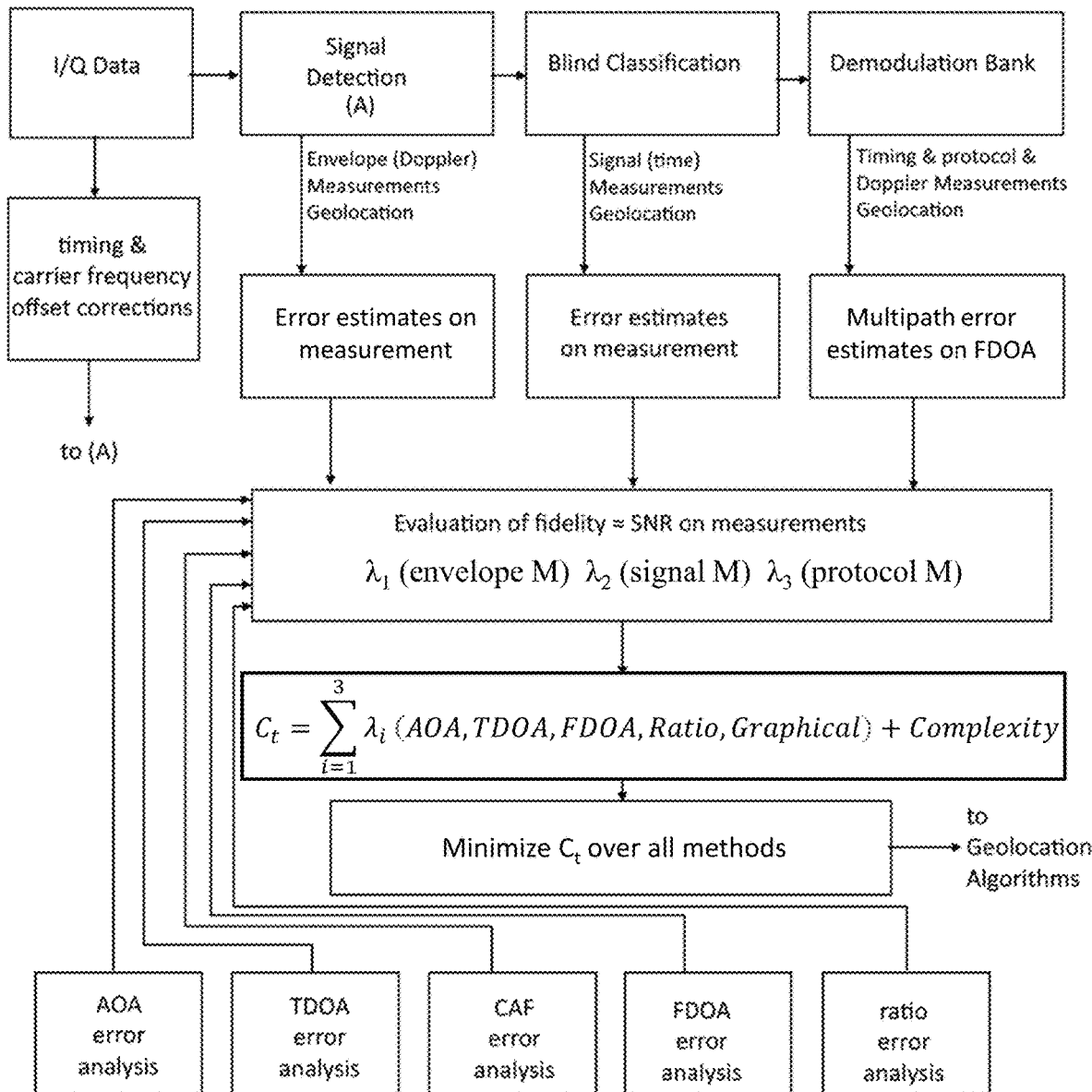
FIG. 25 illustrates one embodiment of an algorithm to select a geolocation method.

FIG. 25 illustrates one embodiment of a method to autonomously select one or more of the plurality of algorithms. Timing and carrier frequency offset corrections are performed on I,Q data and sent to the signal detection engine. The I,Q data (e.g., $I,Q_0$, $I,Q_1$, $I,Q_2$, $I,Q_3$) is sent to the signal detection engine. Information from the signal detection engine is sent to the blind classification engine. Information from the blind classification engine is sent to the demodulation bank. Error estimates are performed on envelope (Doppler) measurements from the signal detection engine, signal (time) domain measurements from the blind classification engine, and timing, protocol, and Doppler measurements from the demodulation bank. An evaluation of fidelity is approximately equal to an SNR of the envelope measurements ($\lambda_1$), signal measurements ($\lambda_2$), and protocol measurements ($\lambda_3$). Error analysis for AOA, TDOA, correlation ambiguity function (CAF) for graphical geolocation, FDOA, and power ratio are used in the evaluation of fidelity. $C_t$ is calculated and minimized over all methods to select the at least one geolocation method, where $C_t$ is the cost function to be minimized and t denotes a time block used to calculate the geolocation solution.

In one embodiment, the geolocation engine uses graphical geolocation techniques. An area is pictorially represented in a grid. Resolution of the grid determines a position in space. The system is operable to detect the at least one signal in the space and determine a location of the at least one signal using the graphical geolocation techniques. In one embodiment, outputs (e.g., location) to a non-linear equation are used to determine possible inputs (e.g., power measurements). The possible outputs are placed on a two-dimensional map. Inputs are then mapped to form a hypothesis of possible outputs. In one embodiment, the graphical geolocation techniques include an image comparison between the two-dimensional map of the possible outputs and the signal data. In another embodiment, the graphical geolocation techniques further include topology (e.g., mountains, valleys, buildings, etc.) to create a three-dimensional map of the possible outputs. The graphical geolocation techniques in this embodiment include an image comparison between the three-dimensional map of the possible outputs and the signal data.

The geolocation engine is operable to make use of spinning DF, through the use of rotating directional antennas and estimating the direction of arrival of an emitter. The rotating directional antennas measure the received power as a function of the direction, calculating a local maximum assumed direction of the emitter. The geolocation engine is also operable to account for any transient signals that escape detection based on rotation speed. This is accomplished by using at least one broad antenna, reducing the chance of the system missing a signal, as well as reducing angular resolution. Practical considerations for these calculations include, but are not limited to, antenna rotation speed ($\bar{\omega}$), a rate of arrival of signals ($\gamma$), and/or a spatial sampling rate ($F_{PS}$).

The system is further operable to use amplitude ratio methods for geolocation. These methods involve a multi-lobe amplitude comparison. This is performed using a set of fixed directional antennas pointing in different directions. A ratio corresponding to two responses is calculated, account for antenna patterns. This ratio is used to obtain a direction estimate. By not using moving parts and/or antennas, the system is more responsive to transient signals. However, this does require accurate antenna patterns, as these patterns also control system resolution.

General antenna array processing assumes that a signal, s(t), remains coherent as it impinges at each antenna in the array. This enables the delay ($\tau_m$) of the signal at an m-th sensor relative to the signal at the origin of the coordinate system can be expressed as:

$$\tau_m = -(q_m \sin(\theta) + r_m \cos(\theta))/c$$

Where c is the propagation of light and $\ominus$ is the angle of the signal impinging in the sensor relative to the r-axis. Since the signal is assumed to have a Taylor series decomposition, the propagation delay, $\tau_m$, is equivalent to the phase shift of:

$$\varphi_m = -w\tau_m =\!> e^{j\varphi_m}$$

Thus, the vector x(t) of antenna responses can be written as:

$$\begin{bmatrix} x_1(t) \\ \vdots \\ x_M(t) \end{bmatrix} = \begin{bmatrix} e^{j\varphi_1} \\ \vdots \\ e^{j\varphi_M} \end{bmatrix} e^{j(wt+\phi)}$$

Where $$\varphi_M(w, \theta) = [q_m\sin(\theta) + r_m\cos(\theta)]w/c$$

More generally, the sensor has different directionality and frequency characteristics which are modeled by applying different gains and phases to the model above, where the gain and phase of the m-th sensor is denoted as: $g_m(w, \theta)$ and $\phi_m(w, \theta)$ Then, the above equation for x(t) can be expressed as:

$$\begin{bmatrix} x_1(t) \\ \vdots \\ x_M(t) \end{bmatrix} = \begin{bmatrix} g_1(w, \theta)e^{j\phi_1(w,\theta)}e^{j\varphi_1} \\ \vdots \\ g_M(w, \theta)e^{j\phi_M(w,\theta)}e^{j\varphi_M} \end{bmatrix} e^{j(wt+\phi)} = a(w, \theta)e^{j(wt+\phi)}$$

Where $a(w, \theta)$ is known as the array response vector.

The collection of all array response vectors for all angles $\ominus$ and all frequencies, w, is known as an array manifold (i.e., a vector space). In general, if the array manifold is known and it is free of ambiguities, then obtaining the k−1 angles ($\theta_1 \ldots \theta_{k-1}$) of k−1 signals if their corresponding array response vector are linearly independent is performed by correlating x(t) with the array response vector of the appropriate angle. In one embodiment, ambiguities refer to the array manifold lacking rank deficiencies to k if the system is trying to resolve k−1 directions at the same frequency. The array manifold does not typically have a simple analytical form and thus the array manifold is approximated using discrete angles for each frequency of interest.

In more general cases, where multiple sinusoidal signals arrive at the array with additive noise, then the x(t) can be expressed as:

$$x(t) = \sum_{i=1}^{I} a(w, \theta_i)s_i(t) + n(t)$$

$$s_i(t) = e^{j(w_i t + \beta_i)} =$$

$$[a(w, \theta_1) \cdots a(w, \theta_I)][s_1(t) \cdots s_I(t)]^T + n(t) = A(w, \Theta)s(t) + n(t)$$

In one embodiment, additive noise refers to thermal noise from sensors and associated electronics, background noise from the environment, and/or other man-made interference sources including, but not limited to, diffuse signals.

Where one or more signals are non-sinusoidal (i.e., broadband), the equivalent can be expressed by its Taylor series over the relevant frequencies. However, when looking for a narrow frequency band of interest, the system is operable to assume an array response vector, $a(w, \theta)$, is approximately constant with respect to w over all angles, $\ominus$. This implies that the reciprocal of the time required for the signal to propagate across the array is much less than the bandwidth of the signal. If sensor characteristics do not vary significantly across bandwidth, then the dependency on w can be dropped off of the array response vector and/or matrix, resulting in:

$$x(t)=A(\Theta)s(t)+n(t)$$

For example, in an antenna array using a uniform linear array (ULA), a signal source, $s(t)=e^{j(wt+\phi)}$, impinges in the ULA at angle $\ominus$. Thus, if the received signal at a first sensor is $x_1(t)=s(t)$, then it is delayed at sensor m by:

$$x_m(t) = e^{-jw\left(\frac{(m-1)d\sin(\theta)}{c}\right)}s(t)$$

In vector form, this is represented as:

$$x(t) = \begin{bmatrix} 1 \\ e^{-jw\left(\frac{d\sin(\theta)}{c}\right)} \\ \vdots \\ e^{-jw\left(\frac{(M-1)d\sin(\theta)}{c}\right)} \end{bmatrix} s(t) = a(w, \theta)s(t)$$

If there are source signals received by the ULA, then:

$$x(t)=A(\Theta)s(t)+n(t)$$

Where $$A(\Theta) = \begin{bmatrix} 1 & \cdots & 1 \\ e^{-jw\left(\frac{d\sin(\theta_1)}{c}\right)} & \cdots & e^{-jw\left(\frac{d\sin(\theta_I)}{c}\right)} \\ \vdots & \vdots & \vdots \\ e^{-jw\left(\frac{(M-1)d\sin(\theta_1)}{c}\right)} & \cdots & e^{-jw\left(\frac{(M-1)d\sin(\theta_M)}{c}\right)} \end{bmatrix}$$

x(t) is the received signal vector (M by 1), s(t)=[$s_1$(t) ... $s_1$(t)]$^T$ is the source signal vector (I by 1), n(t) is the noise signal vector (M by 1), and A(Θ)=[a(w, $\theta_1$), ..., a(w, $\theta_I$)] a (M by I) matrix=>Array manifold. In this example, typical assumptions include, but are not limited to, sources of signal(s) are independent and narrow band in relation to dimensions of the ULA (d, Md) and around the same max frequency, all antenna elements are the same, $$d < \frac{\lambda_{max}}{2}$$

to avoid rank ambiguities, the system can resolve M−1 direction angles without rank, and/or noises are uncorrelated.

In another example, array processing is performed for DF using beamforming. Given knowledge of the array manifold, the array can be maneuvered by taking linear combinations of each element response. This is similar to how a fixed, single antenna can be maneuvered mechanically. Thus, y(t)=$w^H$x(t), where w is interpreted as a Finite Impulse Response (FIR) of a filter in the spatial domain. To calculate the power of y(t), assuming a discretization to N samples, the system uses the following:

$$P_y = \langle |y(n)|^2 \rangle_N = w^H \langle x(n)x(n)^H \rangle_N w = w^H R_{xx} w$$

Where $\langle . \rangle_N$ denotes the time averaging over N sample times and $R_{xx}$ is the measured spatial autocorrelation matrix of the received array output data.

In another example, array processing is performed for DF using beamforming, where $$R_{xx} = \langle x(n)x^H(n) \rangle_n \text{ and } R_{xx} = \langle (A(\Theta)s(n)+n(n))(A(\Theta)s(n)+n(n))^H \rangle_N$$

In one embodiment, the system assumes a source signal is uncorrelated to a noise source, resulting in:

$$R_{xx} = A(\Theta) R_{ss} A^H(\Theta) R_{nn}$$

Thus, the power of the linear combination and/or spatial filtering of the array vector response elements are expressed as:

$$P_y = w^H (A(\Theta) R_{ss} A^H(\Theta) + R_{nn}) w$$

In examples where array processing for DF is performed using beamforming, for a single unit magnitude sinusoid impinging the array at angle $\theta_o$ with no noise becomes:

$$P_y(\theta) = w^H a(\theta_o) a^H(\theta_o) w = |w^H a(\theta_o)|^2$$

Accounting for the Cauchy-Schwarz inequality $|w^H a(\theta_o)|^2 \le \|w\|^2 \|a(\theta_o)\|^2$ for all vectors w with equality if, and only if, w is proportional to a($\theta_o$), the spatial filter that matches the array response at the direction of arrival, $\theta_o$, produces a maximum value for $P_y(\theta)$.

In addition, DF can be accomplished by searching over all possible angles to maximize $P_y(\theta)$, and/or search over all filters w that are proportional to some array vectors responding to an impinging angle $\theta$, a($\theta$), where Max {$P_y(\theta)$}$_{over\ all\ angles => filters\ w=a(\theta)}$. When this method is used, the system behaves like a spinning DF system where the resulting beam is changing for each search angle. Advantageously, this method encounters no blind spots due to the rotational and/or rate of arrival of the source signal.

Moreover, when the system is using beamforming techniques and/or processes, the system is operable to search for multiple directions of arrival of different sources with resolutions depending on the width of the beam formed and the height of the sidelobes. For example, a local maximum of the average filter output power is operable to be shifted away from the true direction of arrival (DOA) of a weak signal by a strong source of interference in the vicinity of one of the sidelobes. Alternatively, two closely spaced signals results in only one peak or two peaks in the wrong location.

In yet another example, array processing for DF is performed using a Capon Minimum Variance Distortionless Response (MVDR) approach. This is necessary in cases where multiple source signals are present. The system obtains more accurate estimates of the DOA when formatting the array beam using degrees of freedom to form a beam in the "look" direction and any remaining degrees of freedom to from "nulls" in remaining directions. The result is a simultaneous beam and null forming filter. Forming nulls in other directions is accomplished by minimizing $P_y(\theta)$ while constraining a beam in the look direction. This avoids the trivial solution of w=0. Thus:

$$\min_{over\ all\ w} P_y(\theta) \text{ subject to } w^H a(\theta)=1$$

The resulting filter, $w_c(\theta)$, is shown as:

$$w_c(\theta) = (a^H(\theta) R_{xx}^{-1} a(\theta))^{-1} R_{xx}^{-1} a(\theta)$$

Using this filter, the filter output power is expressed as:

$$P_{yc}(\theta) = w_c^H(\theta) R_{xx} w_c(\theta) = (a^H(\theta) R_{xx}^{-1} a(\theta))^{-1}$$

Therefore, the Capon approach searches over all DOA angles that the above power has maximized, using $\max_{over\ all\ angles} (a^H(\theta) R_{xx}^{-1} a(\theta))^{-1}$. A Capon approach is able to discern multiple signal sources because while looking at signals impinging at 0, the system attenuates a signal arrive at fifteen degrees by a formed beam.

A Capon approach is one method for estimating an angular decomposition of the average power received by the array, sometimes referred to as a spatial spectrum of the array. The Capon approach is a similar approach to spectrum estimation and/or modeling of a linear system.

The system is further operable to employ additional resolution techniques including, but not limited to, Multiple Signal Classifier (MUSIC), Estimation of Signal Parameters via Rotational Invariance Technique (ESPRITE), and/or any other high-resolution DOA algorithm. These resolution techniques enable the system to find DOAs for multiple sources simultaneously. In addition, these resolution techniques generate high spatial resolution when compared with more traditional methods. In one embodiment, these techniques apply only when determining DOAs for narrowband signal sources.

For example, when using MUSIC-based methods, the system computes an N×N correlation matrix using $R_x = E\{x(t)x^H(t)\} = AR_sA^H + \sigma_0^2 I$, where $R_s = E\{s(t)s^H(t)\} = \text{diag}.\{\sigma_1^2, \ldots, \sigma_I^2\}$. If the signal sources are correlated so that $R_s$ is not diagonal, geolocation will still work while $R_s$ has full rank. However, if the signal sources are correlated such that $R_s$ is rank deficient, the system will then deploy spatial smoothing. This is important, as $R_s$ defines the dimension of the signal subspace. However, For N>I, the matrix $AR_sA^H$ is singular, where $\det[AR_sA^H] = \det[R_x - \sigma_0^2 I] = 0$. But this implies that $\sigma_0^2$ is an eigenvalue of $R_x$. Since the dimension of the null space $AR_sA^H$ is N–I, there are N–I such eigenvalues $\sigma_0^2$ of $R_x$. In addition, since both $R_x$ and $AR_sA^H$ are non-negative, there are I other eigenvalues $\sigma_i^2$ such that $\sigma_i^2 > \sigma_0^2 > 0$.

In a preferred embodiment, geolocation is performed using Angle of Arrival (AOA), Time Difference of Arrival (TDOA), Frequency Difference of Arrival (FDOA), and power distribution ratio measurements. Advantageously, using all four measurements to determine geolocation results in a more accurate determination of location. In many instances, only one type of geolocation measurement is available that forces the use of one particular approach (e.g., AOA, TDOA, FDOA), but in many cases geolocation measurements are operable to be derived from behavior of the signals, thus allowing for the use of multiple measurements (e.g., all four measurements) that are combined to obtain a more robust geolocation solution. This is especially important when most of the measurements associated with each approach are extremely noisy.

Learning Engine

In addition, the system includes a learning engine, operable to incorporate a plurality of learning techniques including, but not limited to, machine learning (ML), artificial intelligence (AI), deep learning (DL), neural networks (NNs), artificial neural networks (ANNs), support vector machines (SVMs), Markov decision process (MDP), and/or natural language processing (NLP). The system is operable to use any of the aforementioned learning techniques alone or in combination.

Advantageously, the system is operable for autonomous operation using the learning engine. In addition, the system is operable to continuously refine itself, resulting in increased accuracy relating to data collection, analysis, modeling, prediction, measurements, and/or output.

The learning engine is further operable to analyze and/or compute a conditional probability set. The conditional probability set reflects the optimal outcome for a specific scenario, and the specific scenario is represented by a data model used by the learning engine. This enables the system, when given a set of data inputs, to predict an outcome using a data model, where the predicted outcome represents the outcome with the least probability of error and/or a false alarm.

Without a learning engine, prior art systems are still operable to create parametric models for predicting various outcomes. However, these prior art systems are unable to capture all inputs and/or outputs, thereby creating inaccurate data models relating to a specific set of input data. This results in a system that continuously produces the same results when given completely different data sets. In contrast, the present invention utilizes a learning engine with a variety of fast and/or efficient computational methods that simultaneously calculate conditional probabilities that are most directly related to the outcomes predicted by the system. These computational methods are performed in real-time or near-real-time.

Additionally, the system employs control theory concepts and methods within the learning engine. This enables the system to determine if every data set processed and/or analyzed by the system represents a sufficient statistical data set.

Moreover, the learning engine includes a learning engine software development kit (SDK), enabling the system to prepare and/or manage the lifecycle of datasets used in any system learning application. Advantageously, the learning engine SDK is operable to manage system resources relating to monitoring, logging, and/or organizing any learning aspects of the system. This enables the system to train and/or run models locally and/or remotely using automated ML, AI, DL, and/or NN. The models are operable for configuration, where the system is operable to modify model configuration parameters and/or training data sets. By operating autonomously, the system is operable to iterate through algorithms and/or hyperparameter settings, creating the most accurate and/or efficient model for running predictive system applications. Furthermore, the learning engine SDK is operable to deploy webservices in order to convert any training models into services that can run in any application and/or environment.

Thus, the system is operable to function autonomously and/or continuously, refining every predictive aspect of the system as the system acquires more data. While this functionality is controlled by the learning engine, the system is not limited to employing these learning techniques and/or methods in only the learning engine component, but rather throughout the entire system. This includes RF fingerprinting, RF spectrum awareness, autonomous RF system configuration modification, and/or autonomous system operations and maintenance.

The learning engine uses a combination of physical models and convolutional neural networks algorithms to compute a set of possible conditional probabilities depicting the set of all possible outputs based on input measurements that provide the most accurate prediction of solution, wherein accurate means minimizing the false probability of the solution and also probability of error for the prediction of the solution.

Figure 26:
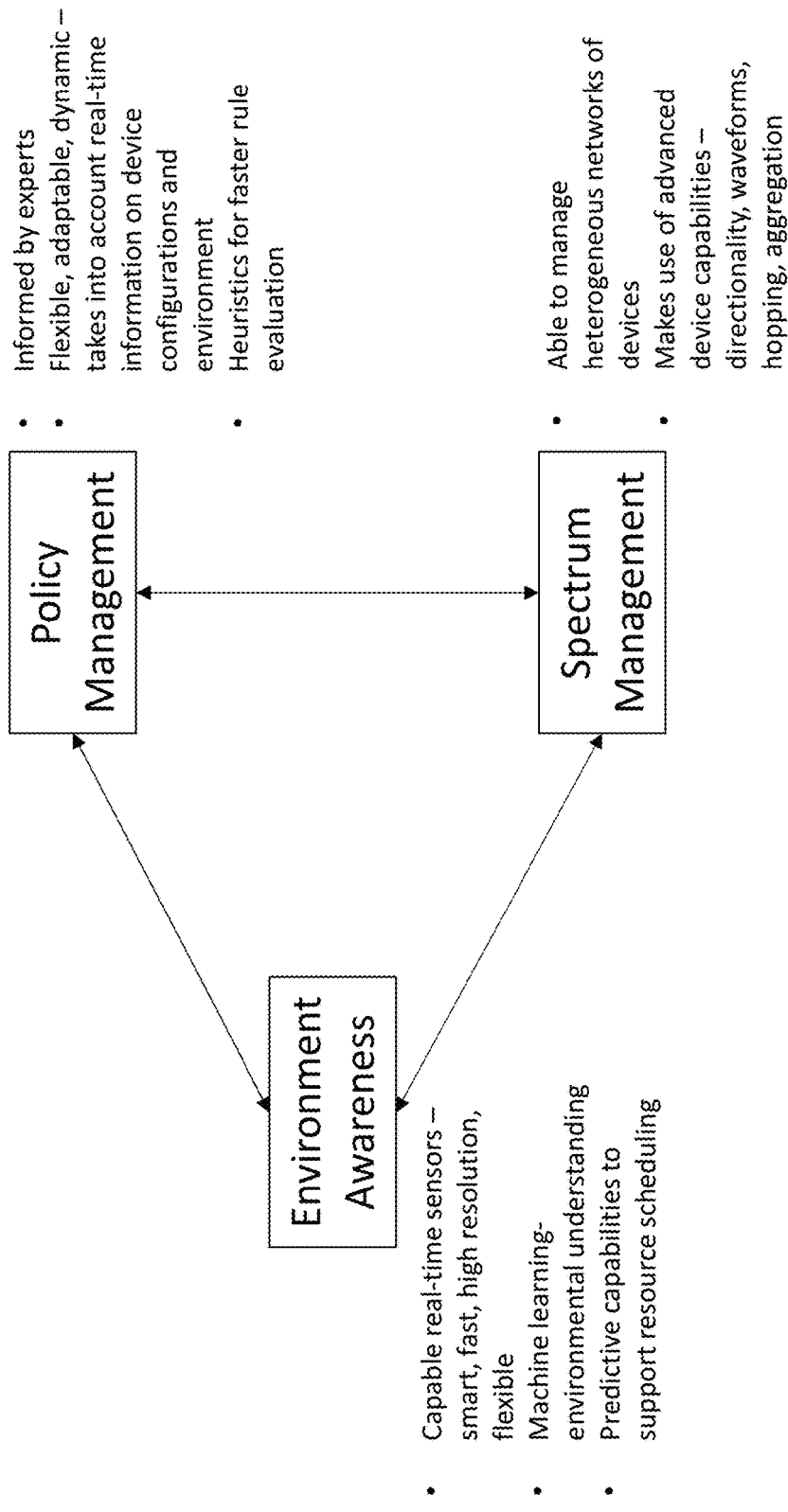
FIG. 26 is a diagram describing three pillars of a customer mission solution.

FIG. 26 is a diagram describing three pillars of a customer mission solution. The three pillars include environmental awareness, policy management, and spectrum management. The system obtains environmental awareness through a plurality of sensors. The plurality of sensors preferably captures real-time information about the electromagnetic environment. Additionally, the system includes machine learning and/or predictive algorithms to enhance environmental understanding and support resource scheduling. Policy management is flexible, adaptable, and dynamic, and preferably takes into account real-time information on device configurations and the electromagnetic environment. The system is preferably operable to manage heterogeneous networks of devices and applications. Spectrum management preferably makes use of advanced device capabilities including, but not limited to, directionality, waveforms, hopping, and/or aggregation.

Figure 27:
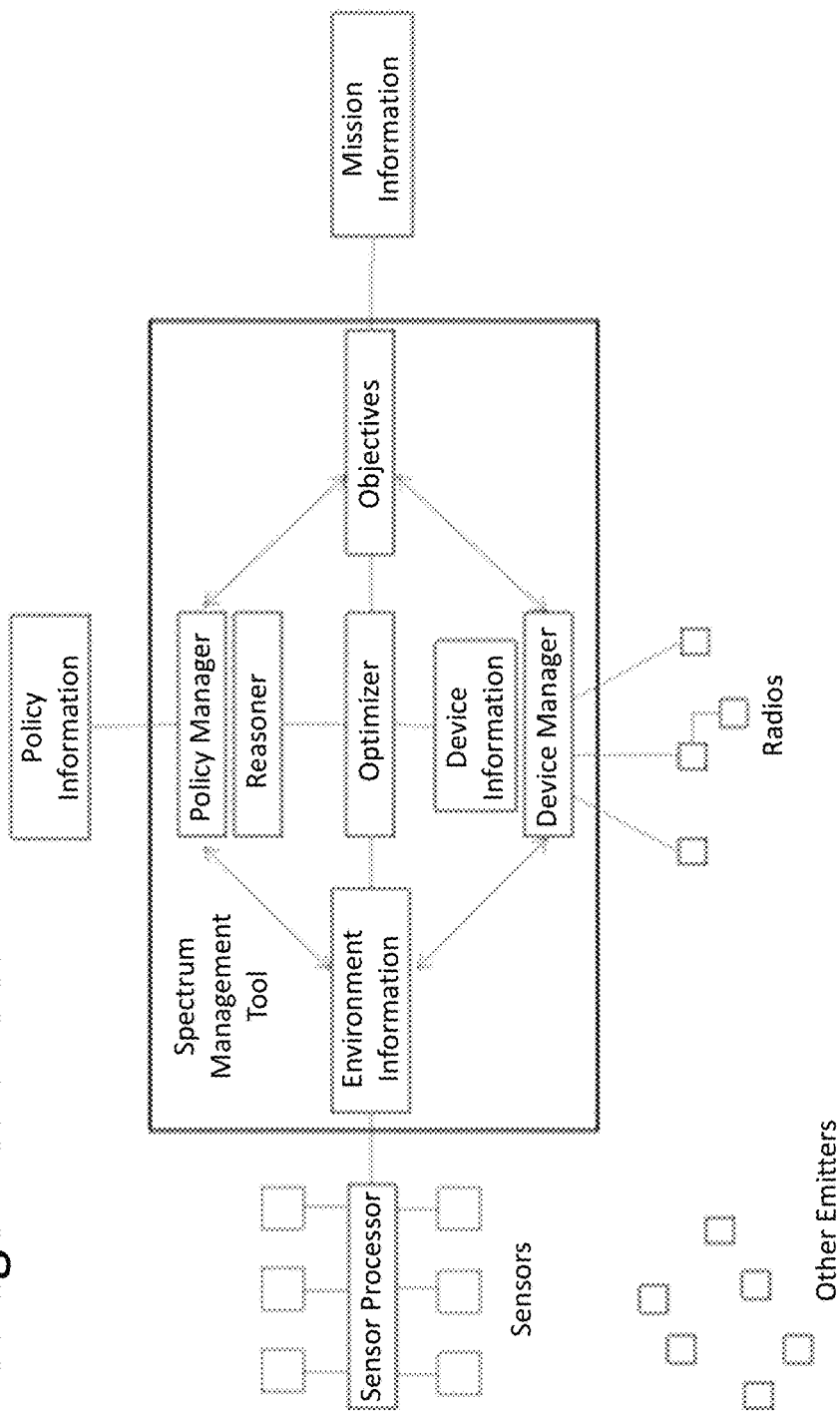
FIG. 27 is a block diagram of one example of a spectrum management tool.

FIG. 27 is a block diagram of one example of a spectrum management tool. The spectrum management tool includes environment information obtained from at least one monitoring sensor and at least one sensor processor. The spectrum management tool further includes a policy manager, a reasoner, an optimizer, objectives, device information, and/or a device manager. The objectives include information from a mission information database. The policy manager obtains information from a policy information database. In another embodiment, the policy manager uses information (e.g., from the policy information database, measurements of the electromagnetic environment) to create policies and/or rules for conditional allowance of resources per signal using the spectrum. These policies and/or rules are then passed to the reasoner to determine optimization conditional constraints to be used by the optimizer with the goal of optimizing the utilization of the spectrum (e.g., based on mission information and objectives) by all signals present according to the policies and/or rules. At the output of the optimizer, resources (bandwidth, power, frequency, modulation, spatial azimuth and elevation focus for transmitter/receiver (TX/RX) sources) as well as interference levels per application is recommended for each signal source. After that, the loop of collecting and environmental awareness is fed to the policy manger and the reasoner.

Figure 28:
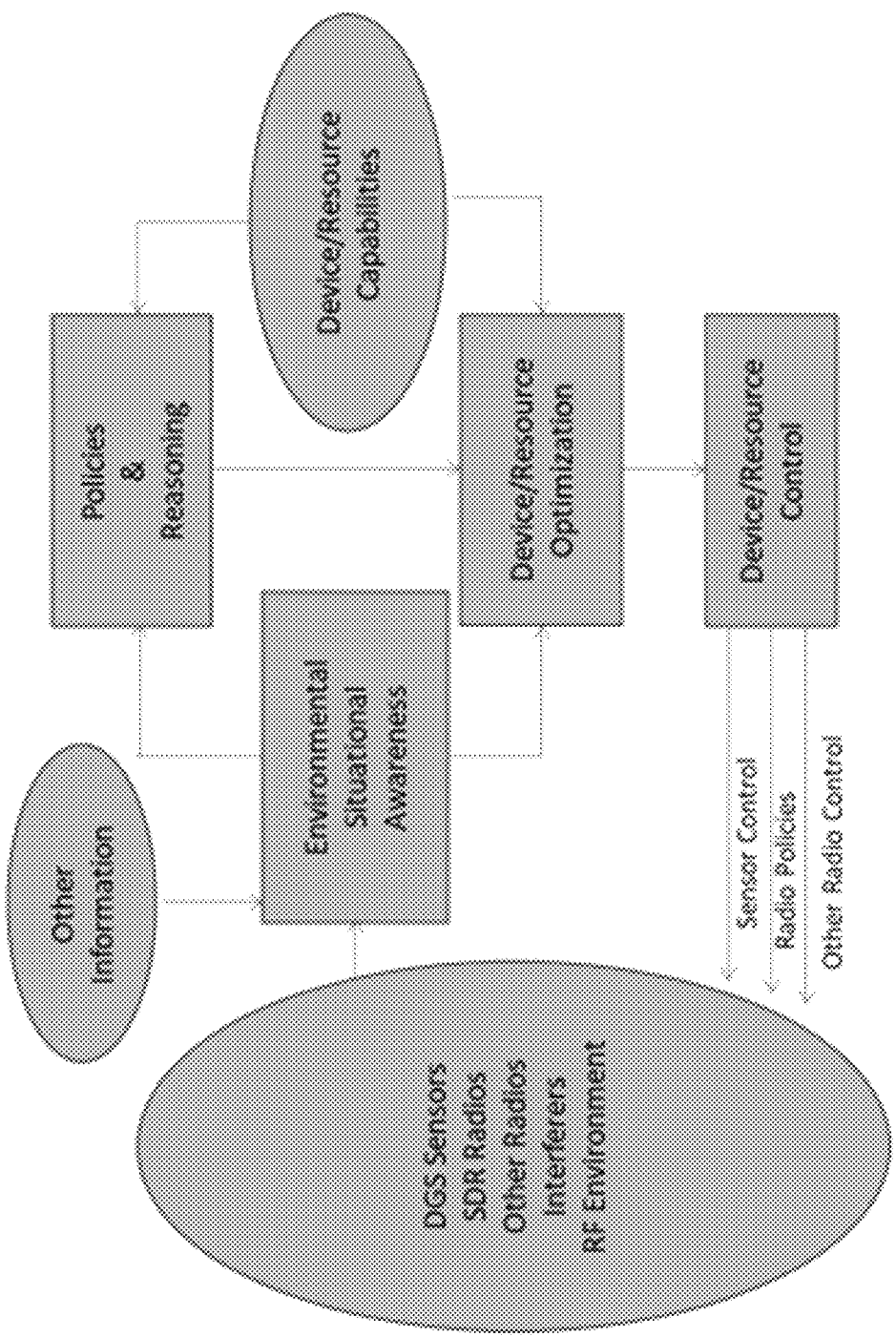
FIG. 28 is a block diagram of one embodiment of a resource brokerage application.

FIG. 28 is a block diagram of one embodiment of a resource brokerage application. As previously described, the resource brokerage application is preferably operable to use processed data from the at least one monitoring sensor and/or additional information to determine environmental awareness (e.g., environmental situational awareness). The environmental awareness and/or capabilities of a device and/or a resource are used to determine policies and/or reasoning to optimize the device and/or the resource. The resource brokerage application is operable to control the device and/or the resource. Additionally, the resource brokerage application is operable to control the at least one monitoring sensor.

Semantic Engine

Figure 29:
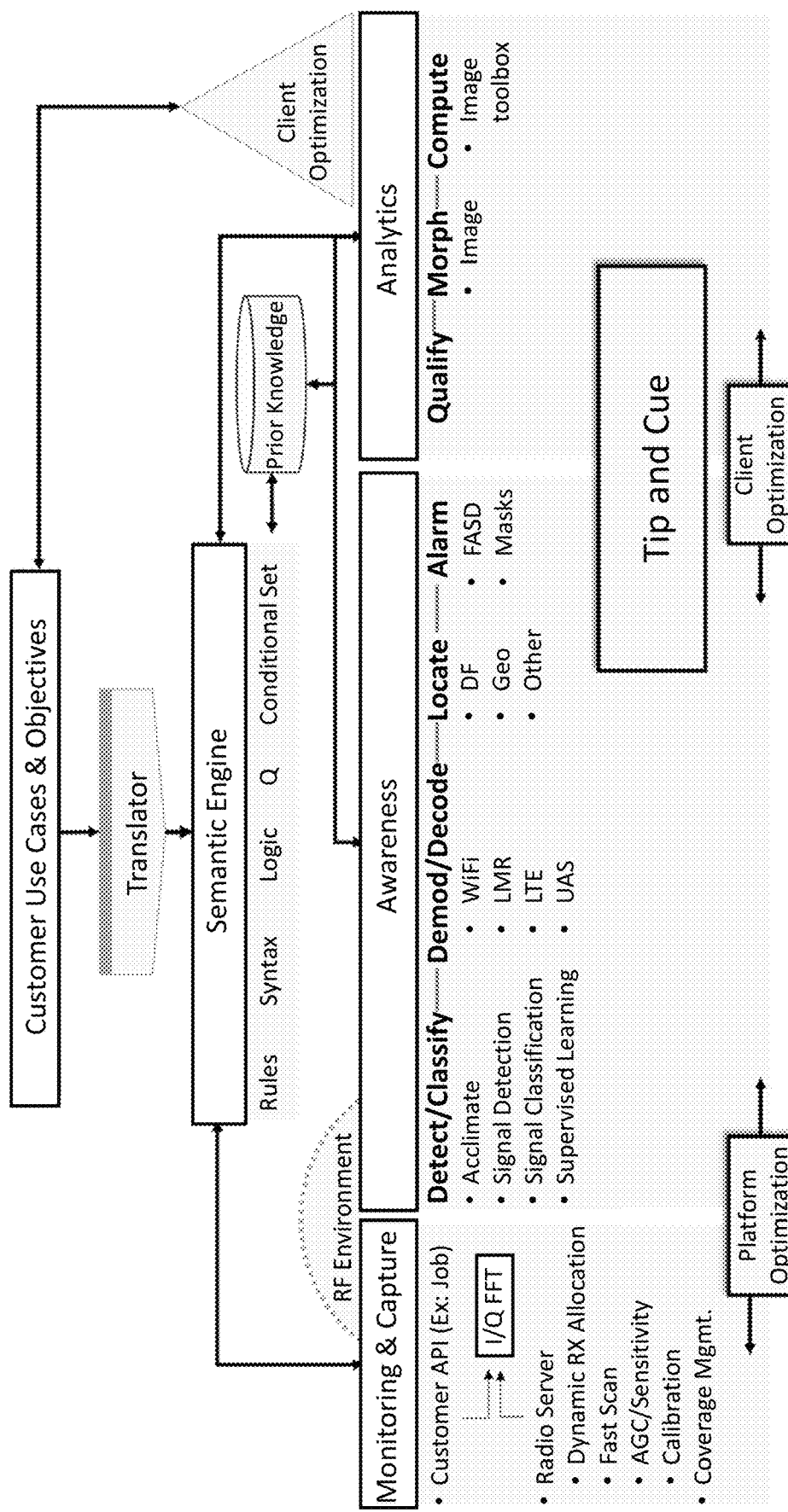
FIG. 29 illustrates another example of a system diagram including an automated semantic engine and translator.

The system further includes an automated semantic engine and/or translator as shown in FIG. 29. The translator is operable to receive data input including, but not limited to, at least one use case, at least one objective, and/or at least one signal. In one embodiment, the at least one use case is a single signal use case. In another embodiment, the at least one use case is a multiple-signal use case. Once the translator receives data input, the translator uses natural language processing (NLP), and/or similar data translation processes and techniques, to convert the data input into actionable data for the automated semantic engine.

By separating the data translation process from the automated semantic engine, the system is operable to provide more processing power once the data input is sent to the automated semantic engine, reducing the overall processing strain on the system.

The automated semantic engine includes a rule component, a syntax component, a logic component, a quadrature (Q) component, and/or a conditional set component. In addition, the semantic engine is operable for network communication with a prior knowledge database, an analytics engine, and/or a monitoring and capture engine. Data is initially sent to the automated semantic engine via the translator. The automated semantic engine is operable to receive data from the translator in forms including, but not limited to, audio data, text data, video data, and/or image data. In one embodiment, the automated semantic engine is operable to receive a query from the translator. The logic component and/or the rule component are operable to establish a set of system rules and/or a set of system policies, where the set of system rules and/or the set of system policies is created using the prior knowledge database.

Advantageously, the automated semantic engine is operable to run autonomously using any of the aforementioned learning and/or automation techniques. This enables the system to run continuously, without requiring user interaction and/or input, resulting in a system that is constantly learning and/or refining data inputs, creating more accurate predictions, models, and/or suggested actions.

Moreover, the automated semantic engine enables the system to receive queries, searches, and/or any other type of search-related function using natural language, as opposed to requiring a user and/or customer to adapt to a particular computer language. This functionality is performed using a semantic search via natural language processing (NLP). The semantic search combines traditional word searches with logical relationships and concepts.

In one embodiment, the automated semantic engine uses Latent Semantic Indexing (LSI) within the automated semantic engine. LSI organizes existing information within the system into structures that support high-order associations of words with text objects. These structures reflect the associative patterns found within data, permitting data retrieval based on latent semantic context in existing system data. Furthermore, LSI is operable to account for noise associated with any set of input data. This is done through LSI's ability to increase recall functionality, a constraint of traditional Boolean queries and vector space models. LSI uses automated categorization, assigning a set of input data to one or more predefined data categories contained within the prior knowledge database, where the categories are based on a conceptual similarity between the set of input data and the content of the prior knowledge database. Furthermore, LSI makes use of dynamic clustering, grouping the set of input data to data within the prior knowledge database using conceptual similarity without using example data to establish a conceptual basis for each cluster.

In another embodiment, the automated semantic engine uses Latent Semantic Analysis (LSA) within the automated semantic engine. LSA functionalities include, but are not limited to, occurrence matrix creation, ranking, and/or derivation. Occurrence matrix creation involves using a term-document matrix describing the occurrences of terms in a set of data. Once the occurrence matrix is created, LSA uses ranking to determine the most accurate solution given the set of data. In one embodiment, low-rank approximation is used to rank data within the occurrence matrix.

In another embodiment, the automated semantic engine uses semantic fingerprinting. Semantic fingerprinting converts a set of input data into a Boolean vector and creates a semantic map using the Boolean vector. The semantic map is operable for use in any context and provides an indication of every data match for the set of input data. This enables the automated semantic engine to convert any set of input data into a semantic fingerprint, where semantic fingerprints are operable to combine with additional semantic fingerprints, providing an accurate solution given the set of input data. Semantic fingerprint functionality further includes, but is not limited to, risk analysis, document search, classifier indication, and/or classification.

In yet another embodiment, the automated semantic engine uses semantic hashing. By using semantic hashing, the automated semantic engine maps a set of input data to memory addresses using a neural network, where semantically similar sets of data inputs are located at nearby addresses. The automated semantic engine is operable to create a graphical representation of the semantic hashing process using counting vectors from each set of data inputs. Thus, sets of data inputs similar to a target query can be found by accessing all of the memory addresses that differ by only a few bits from the address of the target query. This method extends the efficiency of hash-coding to approximate matching much faster than locality sensitive hashing.

In one embodiment, the automated semantic engine is operable to create a semantic map. The semantic map is used to create target data at the center of the semantic map, while analyzing related data and/or data with similar characteristics to the target data. This adds a secondary layer of analysis to the automated semantic engine, providing secondary context for the target data using similar and/or alternative solutions based on the target data. The system is operable to create a visualization of the semantic map.

Traditional semantic network-based search systems suffer from numerous performance issues due to the scale of an expansive semantic network. In order for the semantic functionality to be useful in locating accurate results, a system is required to store a high volume of data. In addition, such a vast network creates difficulties in processing many possible solutions to a given problem. The system of the present invention solves these limitations through the various learning techniques and/or processes incorporated within the system. When combined with the ability to function autonomously, the system is operable to process a greater amount of data than systems making use of only traditional semantic approaches.

By incorporating the automated semantic engine within the system, the system has a greater understanding of potential solutions, given a provided set of data. Semantic engines are regularly associated with semantic searches or searches with meaning or searches with understanding of overall meaning of the query, thus by understanding the searcher's intent and contextual meaning of the search to generate more relevant results. Semantic engines of the present invention, along with a spectrum specific ontology (vocabulary and operational domain knowledge), help automate spectrum utilization decisions based on dynamic observations and extracted environmental awareness, and create and extend spectrum management knowledge for multiple applications.

Tip and Cue Processes

The system uses a set of "tip and cue" processes, generally referring to detection, processing, and/or providing alerts using creating actionable data from acquired RF environmental awareness information in conjunction with a specific rule set, further enhancing the optimization capabilities of the system. The specific rule set is translated into optimization objectives, including constraints associated with signal characteristics. The tip and cue processes of the present invention produce actionable data to solve a plurality of user issues and/or objectives.

Tip and cue processes are performed by an awareness system. The awareness system is operable to receive input data including, but not limited to, a set of use cases, at least one objective, and/or a rule set. The input data is then analyzed by a translator component, where the translator component normalizes the input data. Once normalized, the input data is sent to a semantic engine. The semantic engine is necessary for analyzing unstructured data inputs. Thus, a semantic engine is necessary to understand data inputs and apply contextual analysis as well, resulting in a more accurate output result. This accuracy is primarily accomplished using the previously mentioned learning techniques and/or technologies.

The semantic engine uses the input data to create a set of updated rules, a syntax, a logic component, a conditional data set, and/or Quadrature (Q) data. The semantic engine is operable for network communication with components including, but not limited to, a prior knowledge database, an analytics engine, and/or a monitoring and capture engine. The monitoring and capture engine operates with an RF environment and includes a customer application programming interface (API), a radio server, and/or a coverage management component. The customer API and the radio server are operable to output a set of I-phase and Q-phase (I/Q) data using a Fast Fourier Transform (FFT). The set of I/Q data demonstrates the changes in amplitude and phase in a sine wave. The monitor and capture engine also serves as an optimization point for the system.

The awareness engine operates as both a platform optimization unit and a client optimization unit. The awareness engine is operable to perform functions including, but not limited to, detection, classification, demodulation, decoding, locating, and/or signaling alarms. The detection and/or classification functions assist with incoming RF data acclimation and further includes a supervised learning component, where the supervised learning component is operable to make use of any of the aforementioned learning techniques and/or technologies. The demodulation and/or decode functionalities are operable to access RF data from WIFI, Land Mobile Radio (LMR), Long Term Evolution (LTE) networks, and/or Unmanned Aircraft Systems (UAS). The location component of the awareness engine is operable to apply location techniques including, but not limited to, DF, geolocation, and/or Internet Protocol (IP) based location. The awareness engine is operable to signal alarms using FASD and/or masks. In one embodiment, the masks are dynamic masks.

The analytics engine is operable to perform functions including, but not limited to, data qualification, data morphing, and/or data computing.

The awareness engine, analytics engine, and the semantic engine are all operable for network communication with the prior knowledge database. This enables each of the previously mentioned engines to compare input and/or output with data already processed and analyzed by the system.

The various engines present within the Tip & Cue process further optimize client output in the form of dynamic spectrum utilization and/or allocation. The system uses the Tip & Cue process to provide actionable information and/or actionable knowledge to be utilized by at least one application to mitigate problems of the at least one application and/or to optimize services or goals of the at least one application.

In a preferred embodiment, each customer has a service level agreement (SLA) with the system manager that specifies usage of the spectrum. The system manager is operable act as an intermediary between a first customer and a second customer in conflicts regarding the spectrum. If signals of the first customer interfere with signals of the second customer in violation of one or more of SLAs, the system is operable to provide an alert to the violation. Data regarding the violation is stored in at least one database within the system, which facilitates resolution of the violation. The control plane is operable to directly communicate the first customer (i.e., customer in violation of SLA) and/or at least one base station to modify parameters to resolve the violation.

In one embodiment, the system is used to protect at least one critical asset. Each of the at least one critical asset is within a protection area. For example, a first critical asset is within a first protection area, a second critical asset is within a second protection area, etc. In one embodiment, the protection area is defined by sensor coverage from the at least one monitoring sensor. In other embodiments, the protection area is defined by sensor coverage from the at least one monitoring sensor, a geofence, and/or GPS coordinates. The system is operable to detect at least one signal within the protection area and send an alarm for the at least one signal when outside of allowed spectrum use within the protection area.

The system is further operable to determine what information is necessary to provide actionable information. For example, sensor processing requires a large amount of power. Embedding only the sensors required to provide sufficient variables for customer goals reduces computational and/or power requirements.

Figure 30:
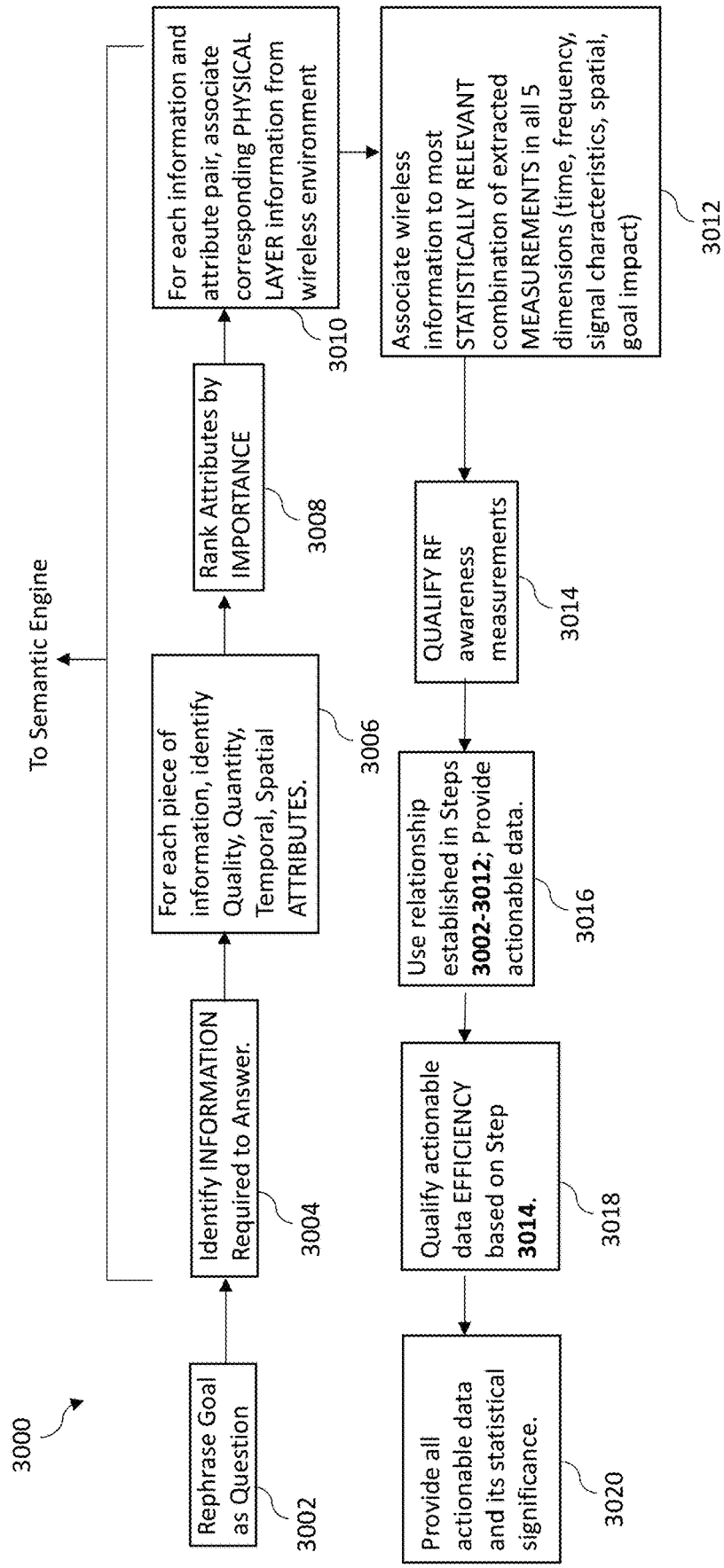
FIG. 30 illustrates a flow diagram of a method to obtain actionable data based on customer goals.
Figure 31:
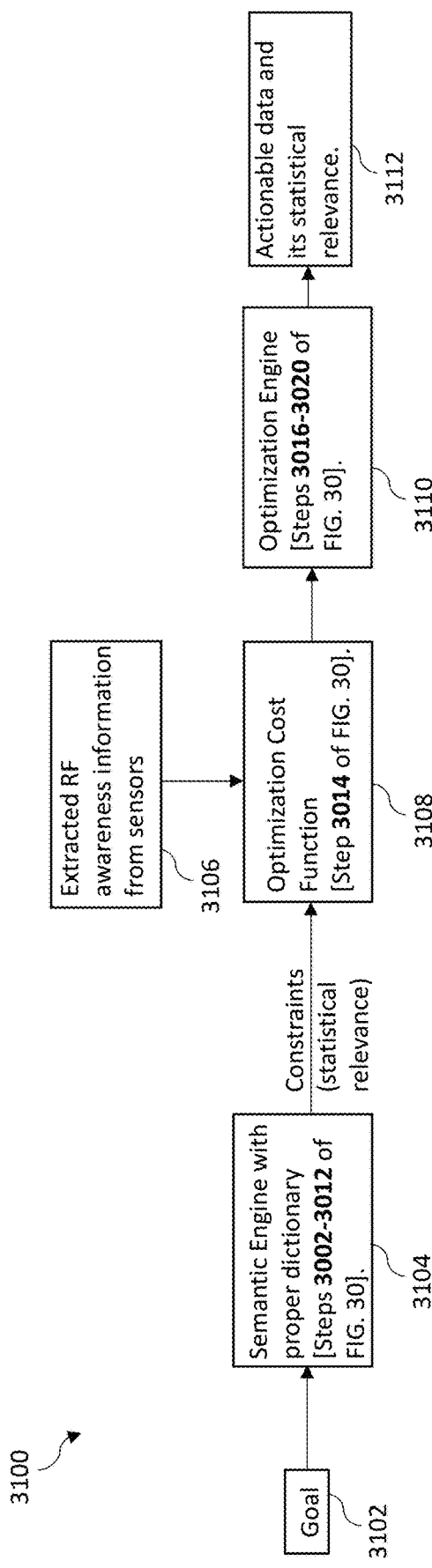
FIG. 31 illustrates a flow diagram of a method of implementation of actionable data and knowledge decision gates from total signal flow.
Figure 32:
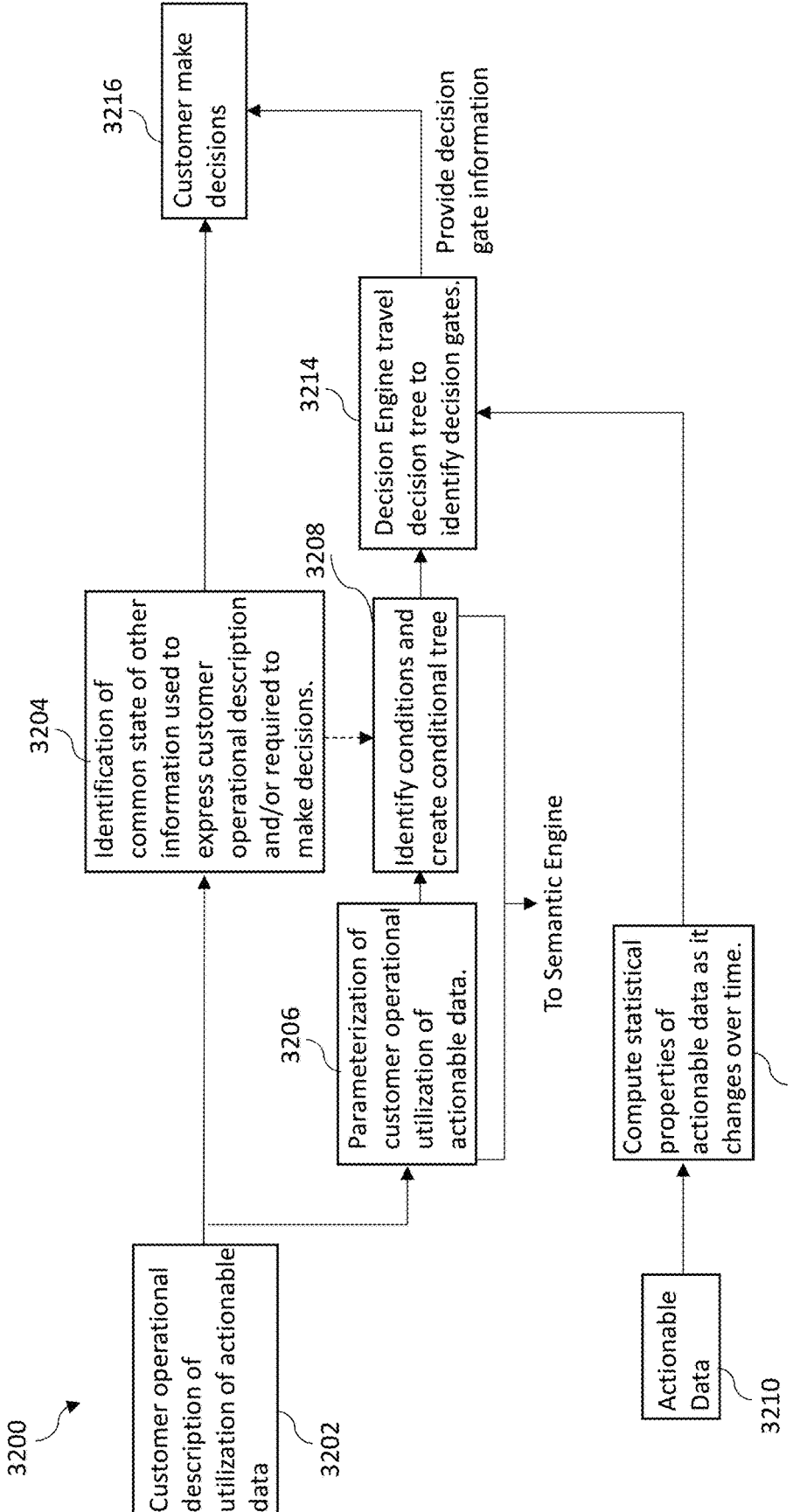
FIG. 32 illustrates a flow diagram of a method to identify knowledge decision gates based on operational knowledge.

FIGS. 30-32 are flow diagrams illustrating the process of obtaining actionable data and using knowledge decision gates. FIG. 30 illustrates a flow diagram of a method to obtain actionable data based on customer goals 3000. A goal is rephrased as a question in Step 3002. Information required to answer the question is identified in Step 3004. Next, quality, quantity, temporal, and/or spatial attributes are identified for each piece of information in Step 3006. In a preferred embodiment, all four attributes (i.e., quality, quantity, temporal, and spatial) are identified in Step 3006. The quality, quantity, temporal, and/or spatial attributes are ranked by importance in Step 3008. For each information and attribute pair, corresponding physical layer information from the wireless environment is associated in Step 3010. All information obtained in steps 3004-3010 is operable to be transmitted to the semantic engine.

Further, wireless information is associated with a most statistically relevant combination of extracted measurements in at least one dimension in Step 3012. The at least one dimension includes, but is not limited to, time, frequency, signal space and/or signal characteristics, spatial, and/or application goals and/or customer impact. In a preferred embodiment, the at least one dimension includes time, frequency, signal space and/or signal characteristics, spatial, and application goals and/or customer impact. The RF awareness measurements are then qualified in Step 3014 and actionable data is provided in Step 3016 based on the relationship established in Steps 3002-3012. Actionable data efficiency is qualified in Step 3018 based on Step 3014. All actionable data and its statistical significance is provided in Step 3020.

FIG. 31 illustrates a flow diagram of a method of implementation of actionable data and knowledge decision gates from total signal flow 3100. A customer goal is rephrased as a question in Step 3102. The customer goal is provided to the semantic engine having a proper dictionary in Step 3104 (as shown in Steps 3002-3012 of FIG. 30). Constraints with statistical relevance from Step 3104 and extracted electromagnetic (e.g., RF) awareness information from sensors in Step 3106 are used in an optimization cost function in Step 3108 (as shown in Step 3014 of FIG. 30). Results from the optimization cost function in Step 3108 are provided to an optimization engine in Step 3110 (as shown in Steps 3016-3020 of FIG. 30) to provide actionable data and its statistical relevance in Step 3112.

FIG. 32 illustrates a flow diagram of a method to identify knowledge decision gates based on operational knowledge 3200. Customer operational description of utilization of actionable data is provided in Step 3202. The customer operational description of utilization of actionable data from Step 3202 is used identify a common state of other information used to express the customer operational description and/or required to make decisions in Step 3204. Further, the customer operational description of utilization of actionable data from Step 3202 is used to provide parameterization of customer operational utilization of actionable data in Step 3206. The parameterization of customer operational utilization of actionable data from Step 3206 is used to identify conditions and create a conditional tree in Step 3208. In one embodiment, the information from Step 3204 is used to identify the conditions and create the conditional tree in Step 3208. Information from Steps 3206-3208 is operable to be transmitted to the semantic engine. Actionable data is provided in Step 3210 and used to compute statistical properties of the actionable data as it changes over time in Step 3212. Information from Steps 3208 and 3212 is used by a decision engine to travel a decision tree to identify decision gates in Step 3214. The identified decision gates from Step 3214 are provided along with the information in Step 3204 to allow the customer to make decisions in Step 3216.

Figure 33:
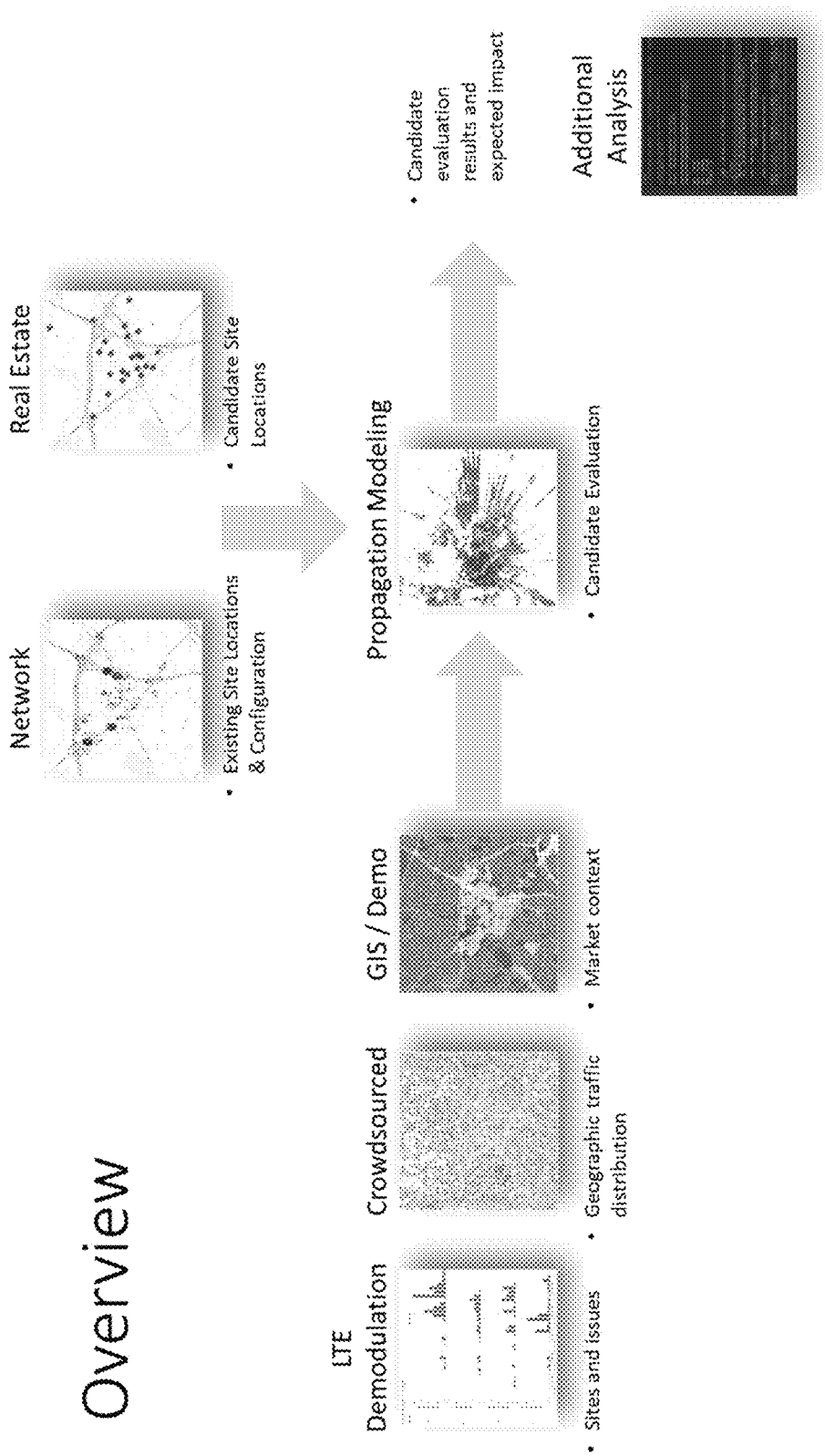
FIG. 33 illustrates an overview of one example of information used to provide knowledge.

FIG. 33 illustrates an overview of one example of information used to provide knowledge. Information including, but not limited to, network information (e.g., existing site locations, existing site configurations), real estate information (e.g., candidate site locations), signal data (e.g., LTE demodulation), signal sites, site issues, crowdsourced information (e.g., geographic traffic distribution), and/or geographic information services (GIS) is used to perform propagation modeling. The propagation models are used to evaluate candidate results and expected impact from any changes (e.g., addition of macrosites, tower). In one embodiment, additional analysis is performed on the candidate results and/or the expected impact.

Example One

In one example, the system is used by a tower company to evaluate if a carrier's performance can be improved by placing at least one additional macrosite on at least one additional tower. If the evaluation shows that the carrier's performance can be improved, it supports a pitch from the tower company to place the at least one macrosite on the at least one additional tower, which would generate revenue for the tower company.

Figure 34:
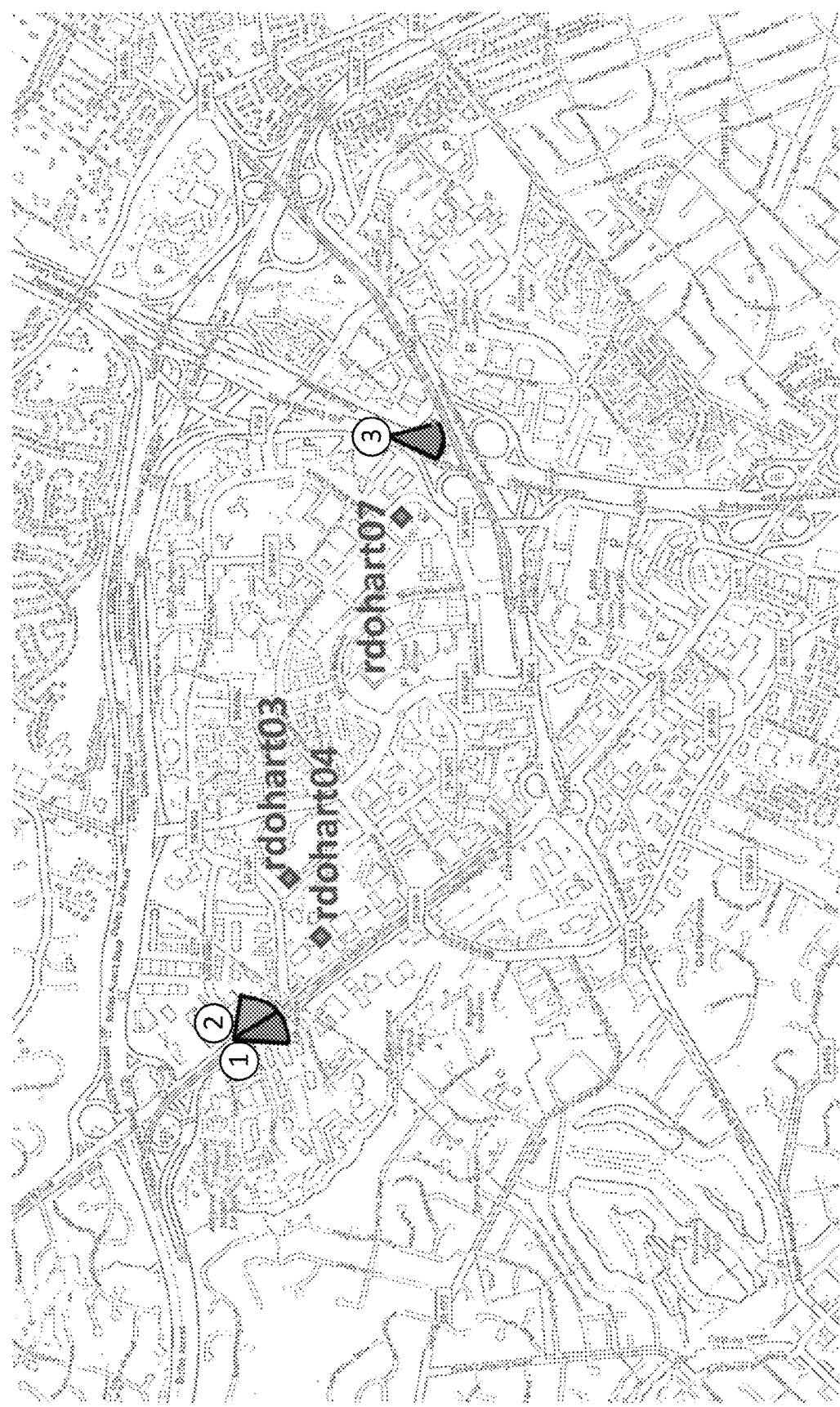
FIG. 34 is a map showing locations of three macrosites, 3 SigBASE units, and a plurality of locations evaluated for alternate or additional site deployment for a first example.

FIG. 34 is a map showing locations of three macrosites ("1" (green), "2" (orange), and "3" (purple)), 3 SigBASE units (orange diamond), and a plurality of locations evaluated for alternate or additional site deployment (green circles).

Figure 35:
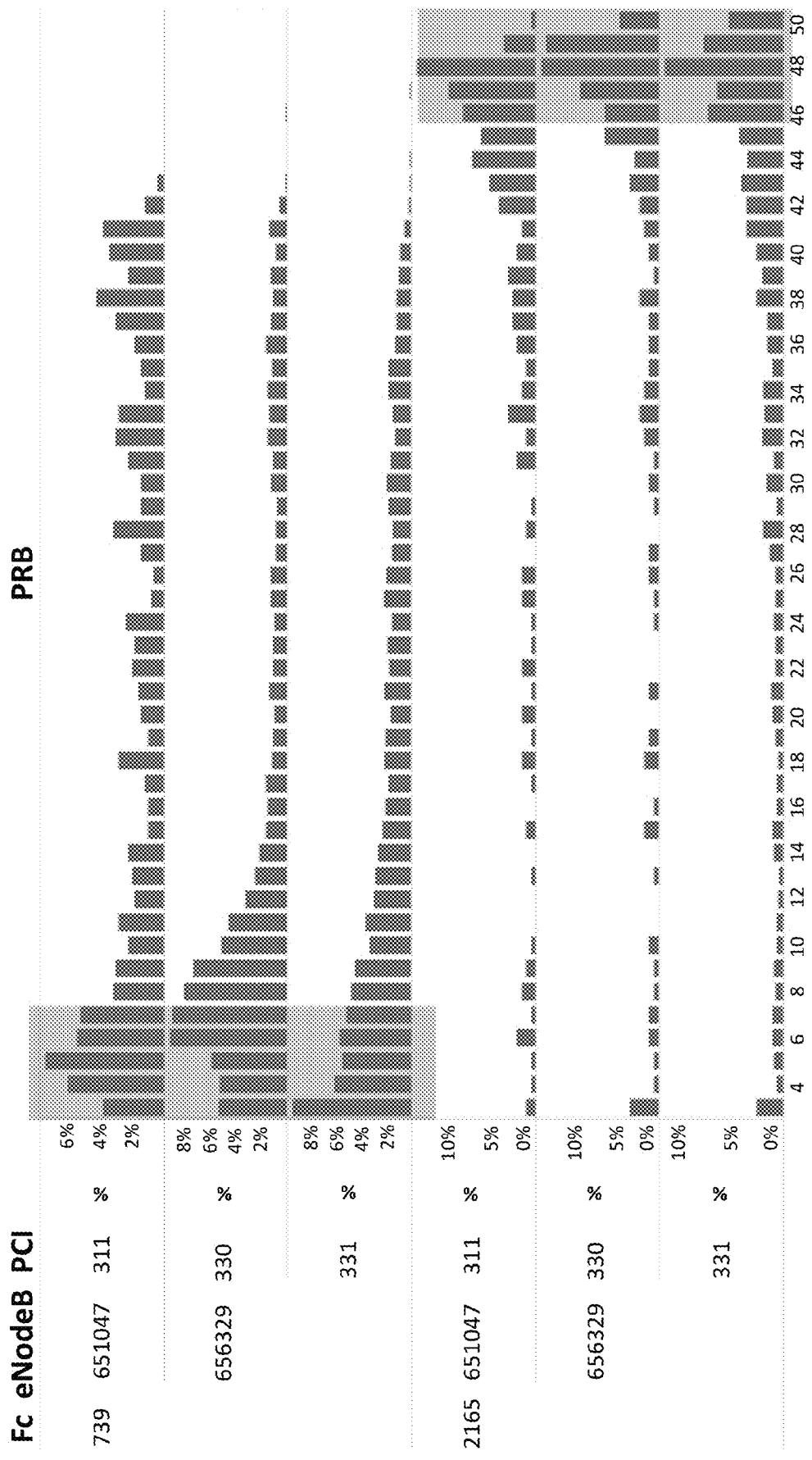
FIG. 35 is a graph of distribution of users by average downlink Physical Resource Block (PRB) allocation for the first example.

FIG. 35 is a graph of distribution of users by average downlink Physical Resource Block (PRB) allocation. Real-time monitoring shows downlink resources allocated to each user. Allocations occur many times per second. A significant f of users on 739 MHz are allocated resources for voice service. Most users on 2165 MHz are allocated resources common for high-speed data.

Figure 36:
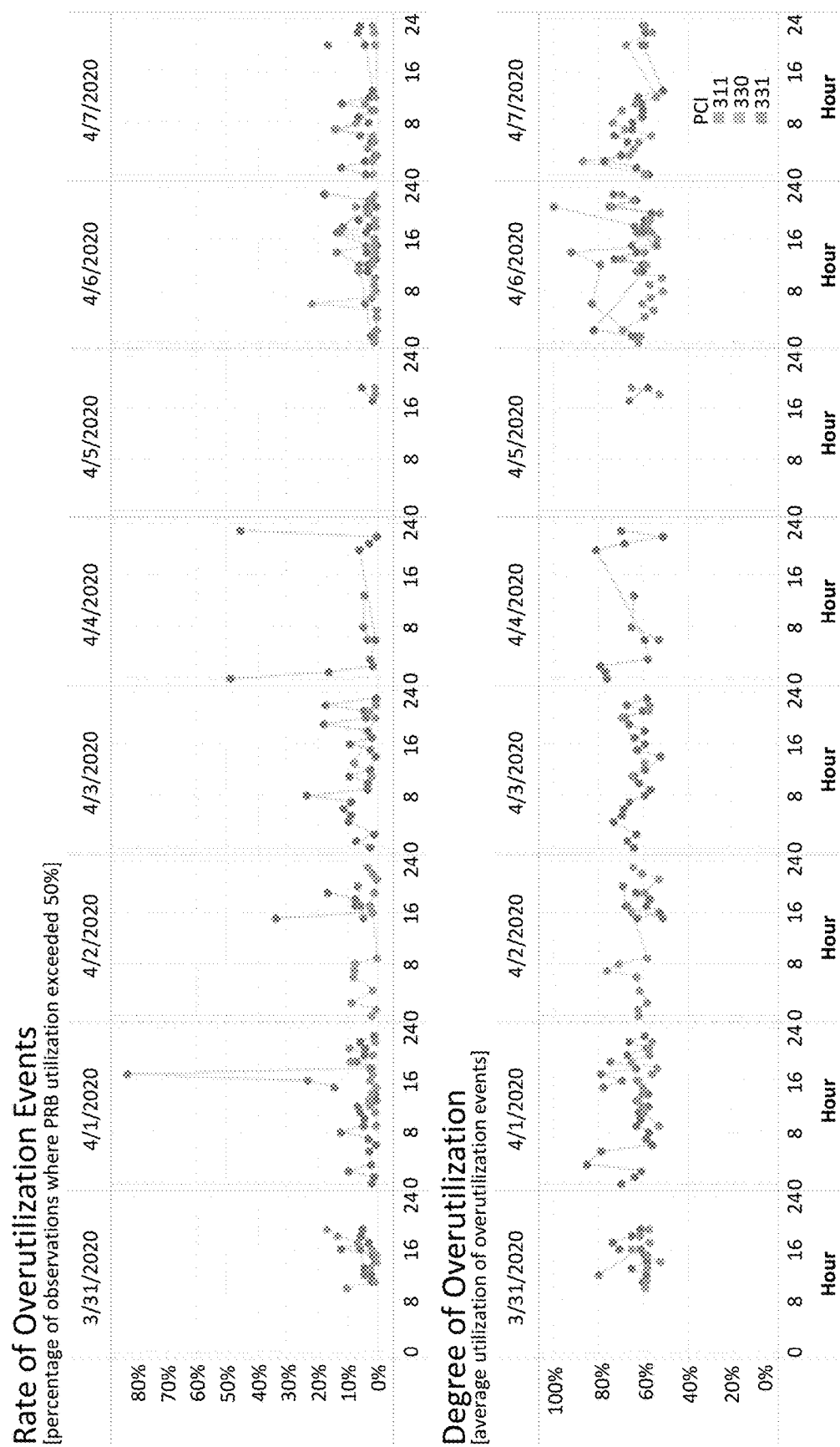
FIG. 36 illustrates rate of overutilization events and degree of overutilization for the first example.

FIG. 36 illustrates rate of overutilization events and degree of overutilization. Real-time monitoring shows the percentage of downlink resources utilized when utilization exceeded 50%. Utilization statistics are generated per second as configured. The rate at which a sector utilization exceeds 50% (overutilized) is presented by hour. the average utilization levels when overutilization occurs describes the severity.

Figure 37B:
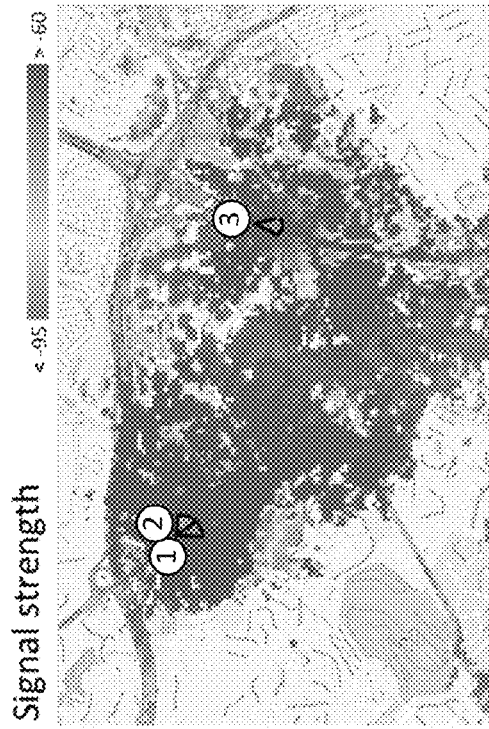
FIG. 37B illustrates signal strength for the sector shown in FIG. 37A for the first example.
Figure 37D:
FIG. 37D illustrates carrier-to-interference ratio for the sector shown in FIG. 37A for the first example.
Figure 37A:
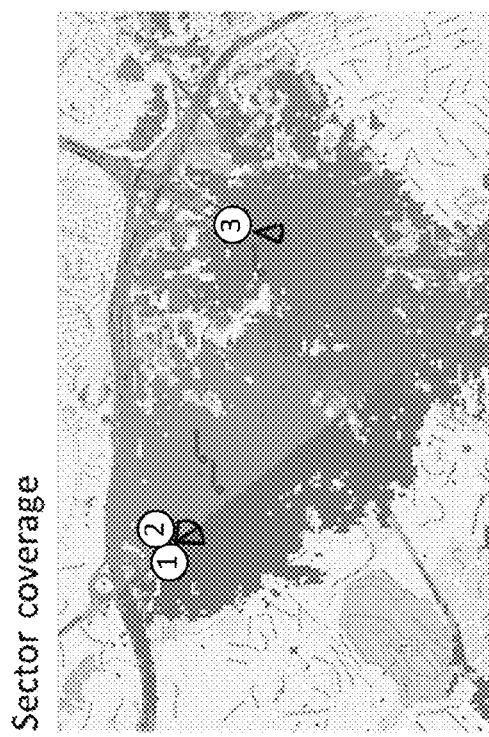
FIG. 37A is a sector coverage map for three macrosites for the first example.

FIG. 37A is a sector coverage map for the three macrosites ("1" (green), "2" (orange), and "3" (purple)).

FIG. 37B illustrates signal strength for the sector shown in FIG. 37A. This figure displays areas of poor coverage.

Figure 37C:
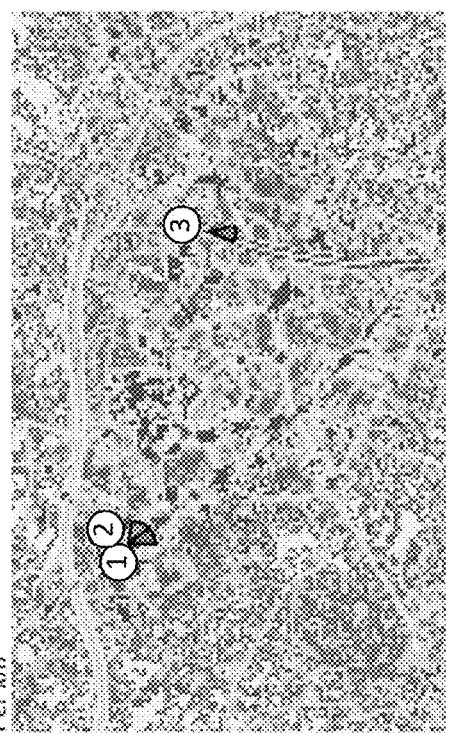
FIG. 37C illustrates subscriber density for the sector shown in FIG. 37A for the first example.

FIG. 37C illustrates subscriber density for the sector shown in FIG. 37A. In one embodiment, data from external sources is used to determine subscriber distribution and density. This figure displays areas of high subscriber demand.

FIG. 37D illustrates carrier-to-interference ratio for the sector shown in FIG. 37A. This figure displays areas of poor quality.

Figure 38B:
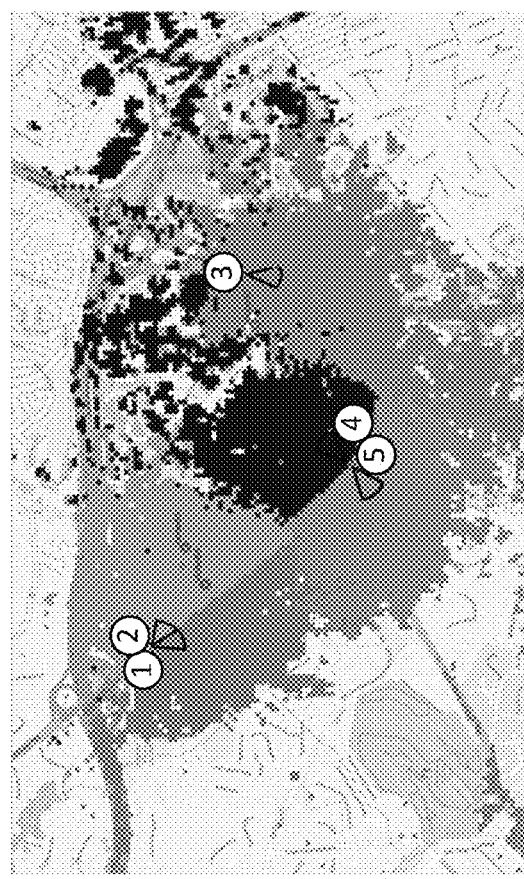
FIG. 38B is a map showing locations of the three original macrosites and two additional macrosites for the first example.
Figure 38A:
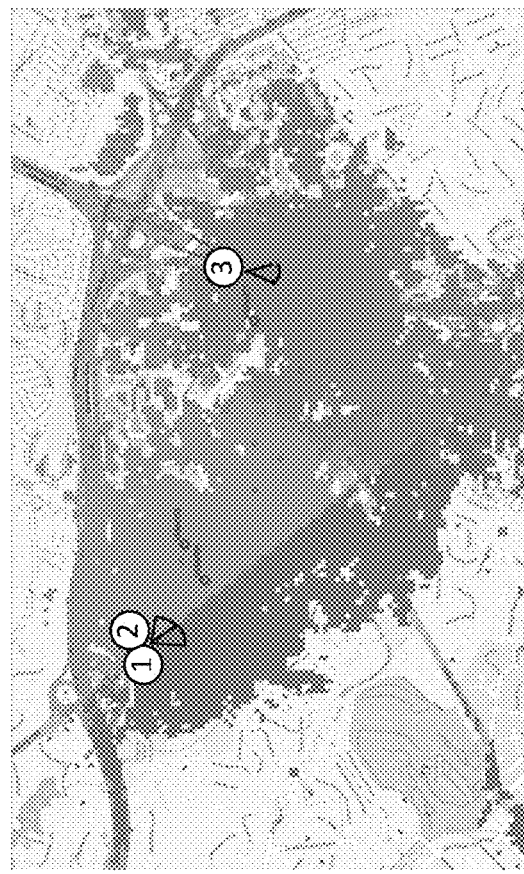
FIG. 38A illustrates the baseline scenario shown in FIG. 34 for the first example.

FIG. 38A illustrates the baseline scenario shown in FIG. 34. FIG. 38B is a map showing locations of the three original macrosites ("1" (green), "2" (orange), and "3" (purple)) and two additional macrosites ("4" (dark blue) and "5" (light blue)).

Figure 39:
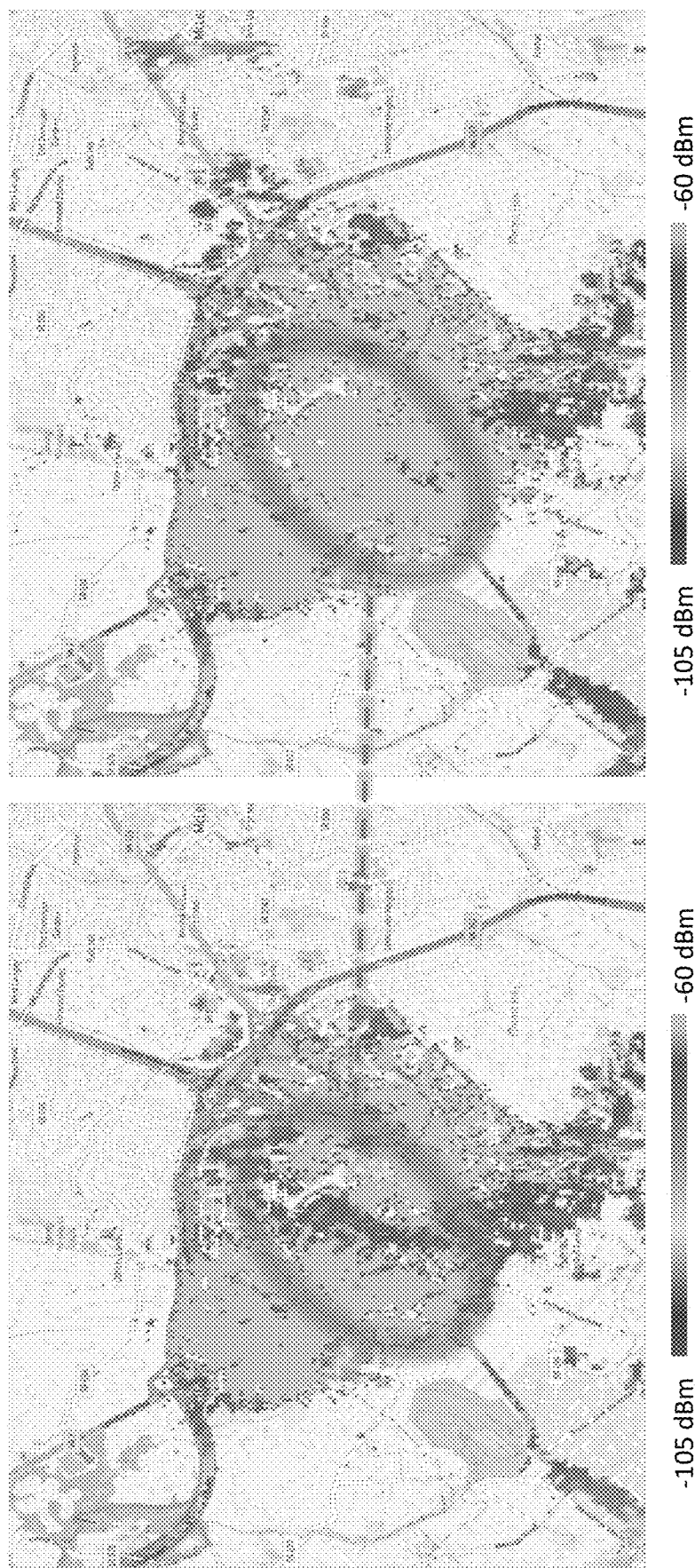
FIG. 39 illustrates signal strength of the baseline scenario from FIG. 38A on the left and the scenario with two additional macrosites from FIG. 38B on the right for the first example.

FIG. 39 illustrates signal strength of the baseline scenario from FIG. 38A on the left and the scenario with two additional macrosites from FIG. 38B on the right. The addition of a 2-sector eNodeB to a tower increases expected coverage by 3 km² as shown in Table 2 below. A total service area for the baseline is 9.89 km² and the total service area increases to 13.15 km² with the two additional macrosites. A total area with a carrier-to-interference ratio less than 5 dB decreases from 1.10 km² for the baseline to 0.38 km² with the two additional macrosites. A total area with a carrier-to-interference ratio greater than 5 dB increases from 8.79 km² for the baseline to 12.77 km² with the two additional macrosites. Traffic served without harmful interference increases from 16.73 Erlands for the baseline to 25.23 Erlands with the two additional macrosites. Additionally, an increase in traffic served of 40% is expected. Further utilization reduction of 30% is expected for pre-existing sectors. Areas of poor coverage are also reduced.

TABLE 2

| Metric | Baseline | 2-sector site added |
|---|---|---|
| Total service area, sq km | 9.89 | 13.15 |
| Total area with C/I < 5 dB, km² | 1.10 | 0.38 |
| Total area with C/I > 5 dB, km² | 8.79 | 12.77 |
| Traffic served without harmful interference, Erlands | 16.73 | 25.23 |

Figure 40B:
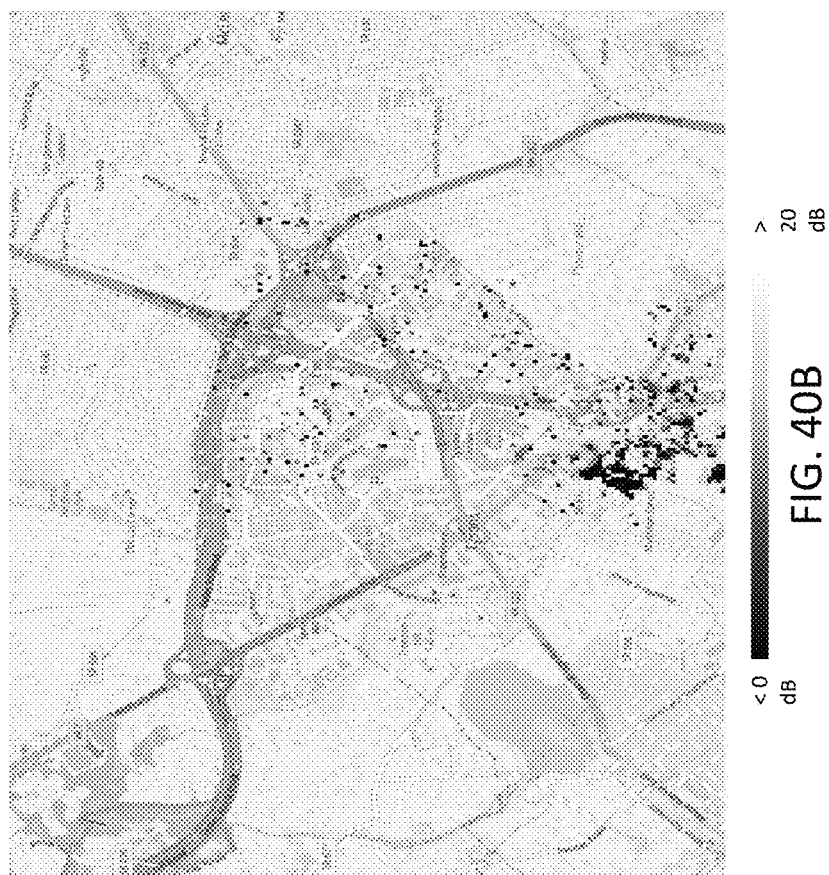
FIG. 40B illustrates carrier-to-interference ratio of the scenario with two additional macrosites for the first example.
Figure 40A:
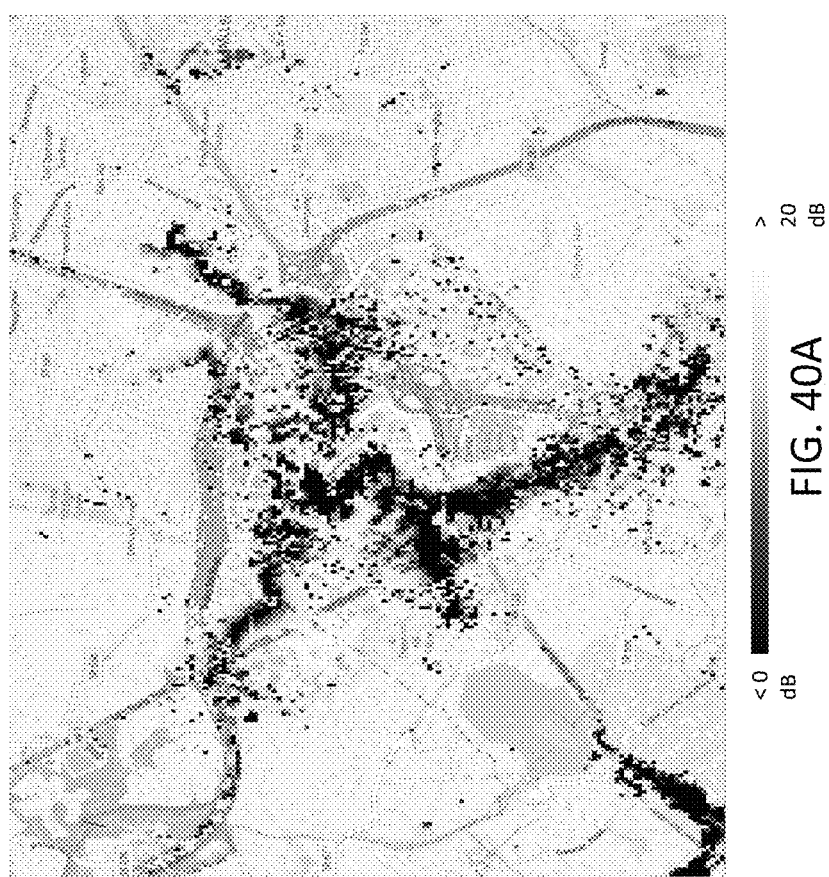
FIG. 40A illustrates carrier-to-interference ratio of the baseline scenario from FIG. 38A for the first example.

FIG. 40A illustrates carrier-to-interference ratio of the baseline scenario from FIG. 38A. FIG. 40B illustrates carrier-to-interference ratio of the scenario with two additional macrosites. The additional two macrosites reduce areas with poor carrier-to-interference.

Example Two

In a second example, the system is also used by a tower company to evaluate if a carrier's performance can be improved by placing at least one additional macrosite on at least one additional tower. If the evaluation shows that the carrier's performance can be improved, it supports a pitch from the tower company to place the at least one macrosite on the at least one additional tower, which would generate revenue for the tower company.

Figure 41:
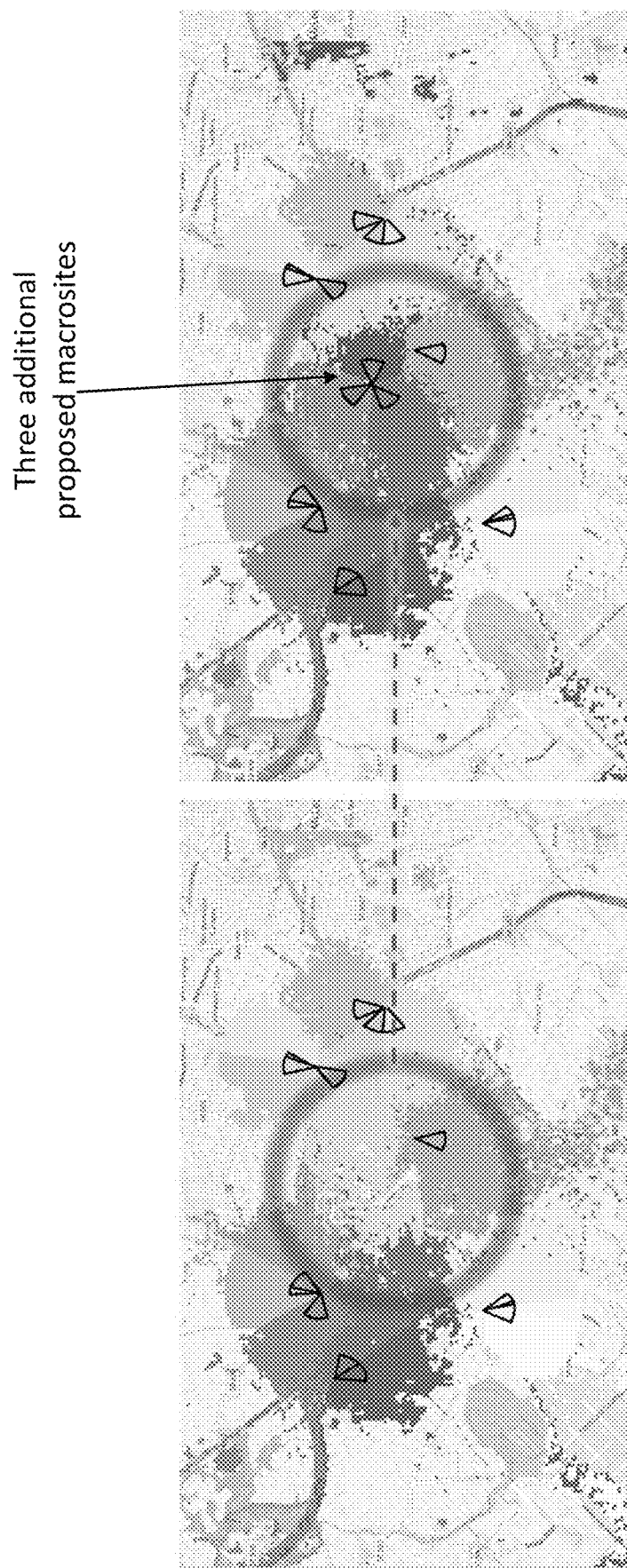
FIG. 41 illustrates a baseline scenario for a second example on the left and a map showing locations of the original macrosites from the baseline scenario with three additional proposed macrosites for the second example on the right.

FIG. 41 illustrates a baseline scenario for the second example on the left and a map showing locations of the original macrosites from the baseline scenario with three additional proposed macrosites on the right.

Figure 42:
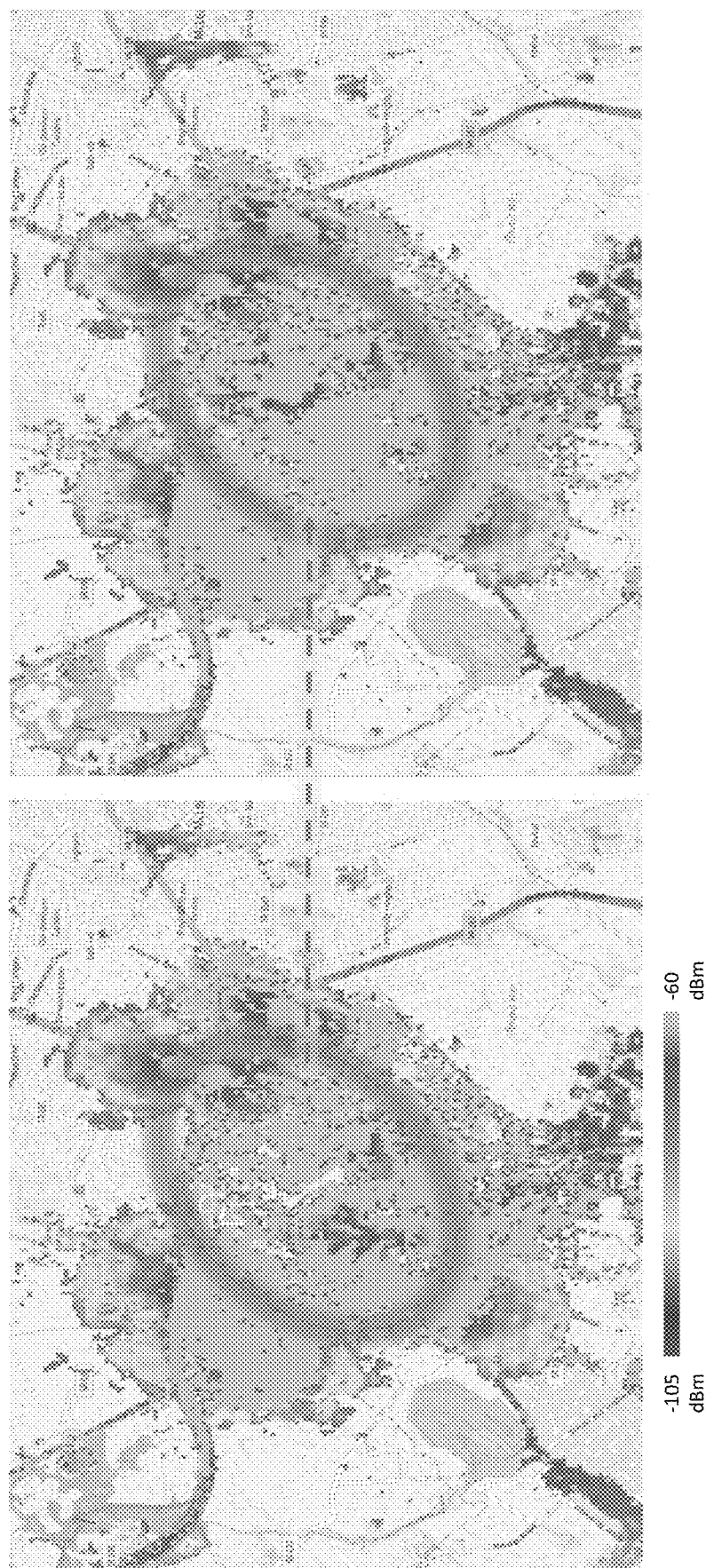
FIG. 42 illustrates signal strength of the baseline scenario from FIG. 41 on the left and the scenario with three additional proposed macrosites from FIG. 41 on the right for the second example.

FIG. 42 illustrates signal strength of the baseline scenario from FIG. 41 on the left and the scenario with three additional proposed macrosites from FIG. 41 on the right. The addition of a 3-sector eNodeB to a tower increases expected coverage by 0.5 km² as shown in Table 3 below. A total service area for the baseline is 21.3 km² and the total service area increases to 21.8 km² with the three additional macrosites. A total area with a carrier-to-interference ratio less than 5 dB increases from 3.0 km² for the baseline to 3.1 km² with the three additional macrosites. A total area with a carrier-to-interference ratio greater than 5 dB increases from 18.3 km² for the baseline to 18.7 km² with the three additional macrosites. Traffic served without harmful interference increases from 79.7 Erlands for the baseline to 80.9 Erlands with the three additional macrosites. Additionally, an increase in traffic served of 2% is expected. Further utilization reduction of 2% is expected for pre-existing sectors.

TABLE 3

| Metric | Baseline | 487044 Added |
|---|---|---|
| Total service area, sq km | 21.3 | 21.8 |
| Total area with C/I < 5 dB, km² | 3.0 | 3.1 |
| Total area with C/I > 5 dB, km² | 18.3 | 18.7 |
| Traffic served without harmful interference, Erlands | 79.7 | 80.9 |

Figure 43:
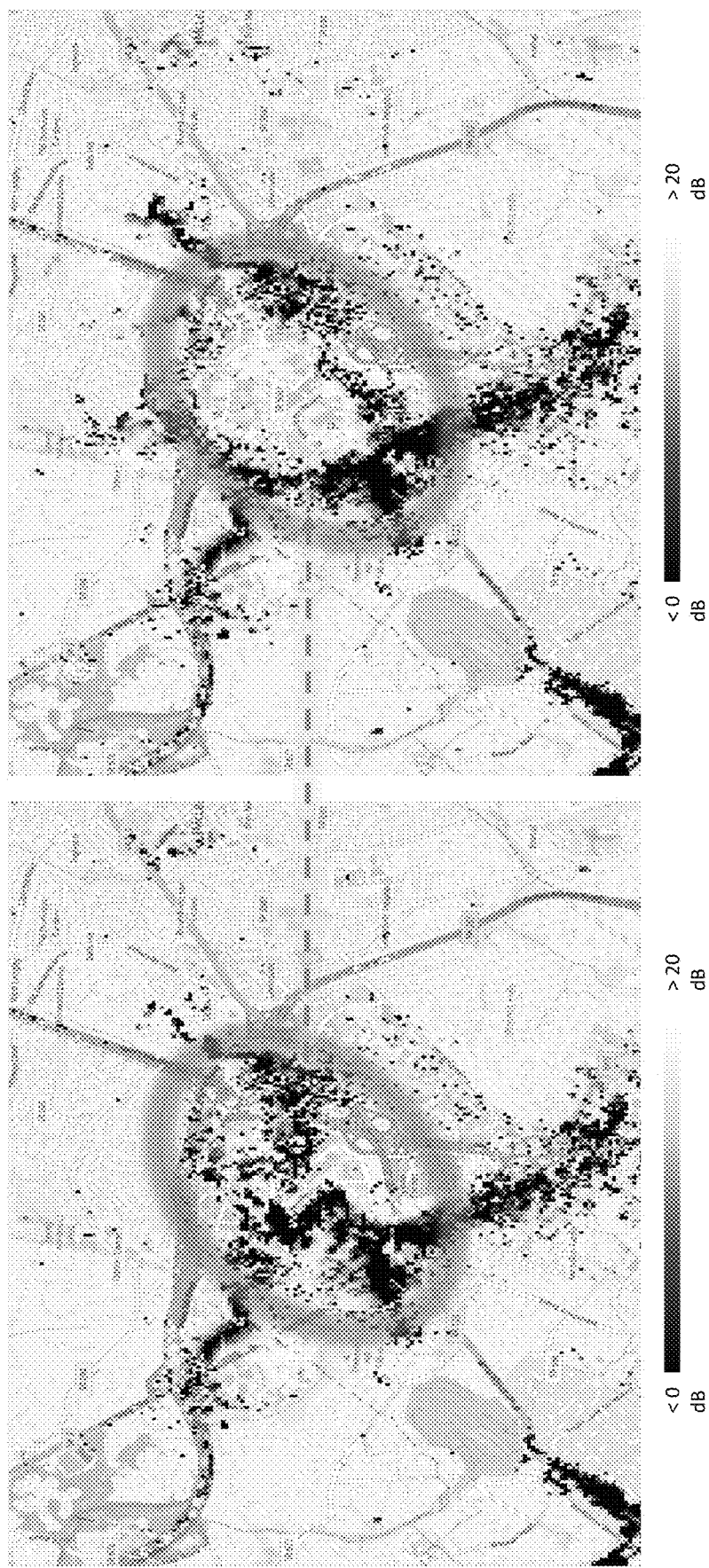
FIG. 43 illustrates carrier-to-interference ratio of the baseline scenario from FIG. 41 for the second example on the left and carrier-to-interference ratio of the scenario with three additional proposed macrosites from FIG. 41 on the right for the second example.

FIG. 43 illustrates carrier-to-interference ratio of the baseline scenario from FIG. 41 on the left and carrier-to-interference ratio of the scenario with three additional proposed macrosites from FIG. 41 on the right. The three additional proposed macrosites slightly reduce areas with poor carrier-to-interference.

Although adding the 3-sector eNodeB does slightly improve performance, this performance improvement is not significant enough to support the addition of the three proposed macrosites to the tower.

Example Three

In a third example, the system is used to evaluate which carrier provides better service.

Figure 44:
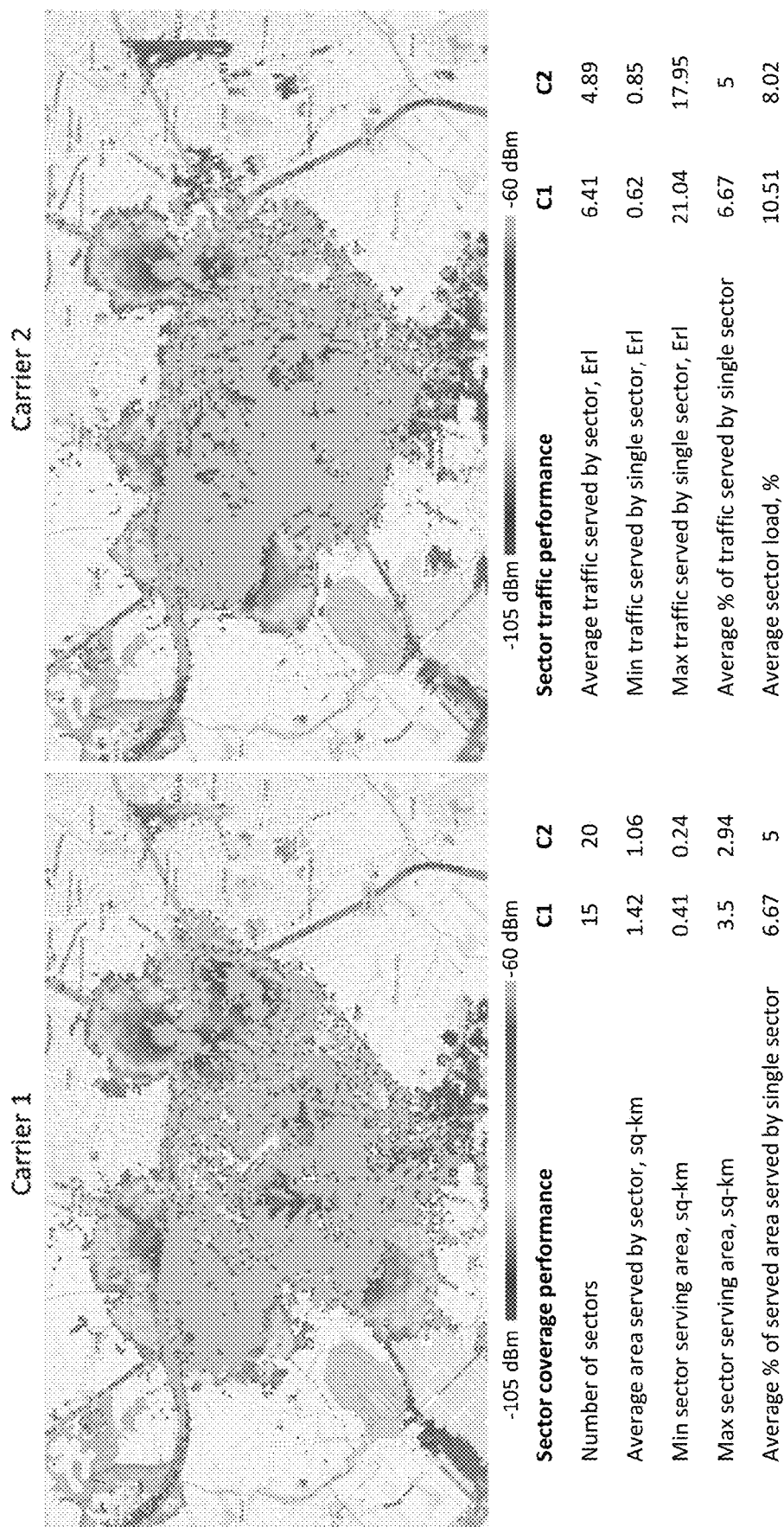
FIG. 44 illustrates a signal strength comparison of a first carrier ("Carrier 1") with a second carrier ("Carrier 2") for 700 MHz for a third example.

FIG. 44 illustrates a signal strength comparison of a first carrier ("Carrier 1") with a second carrier ("Carrier 2") for 700 MHz.

Figure 45:
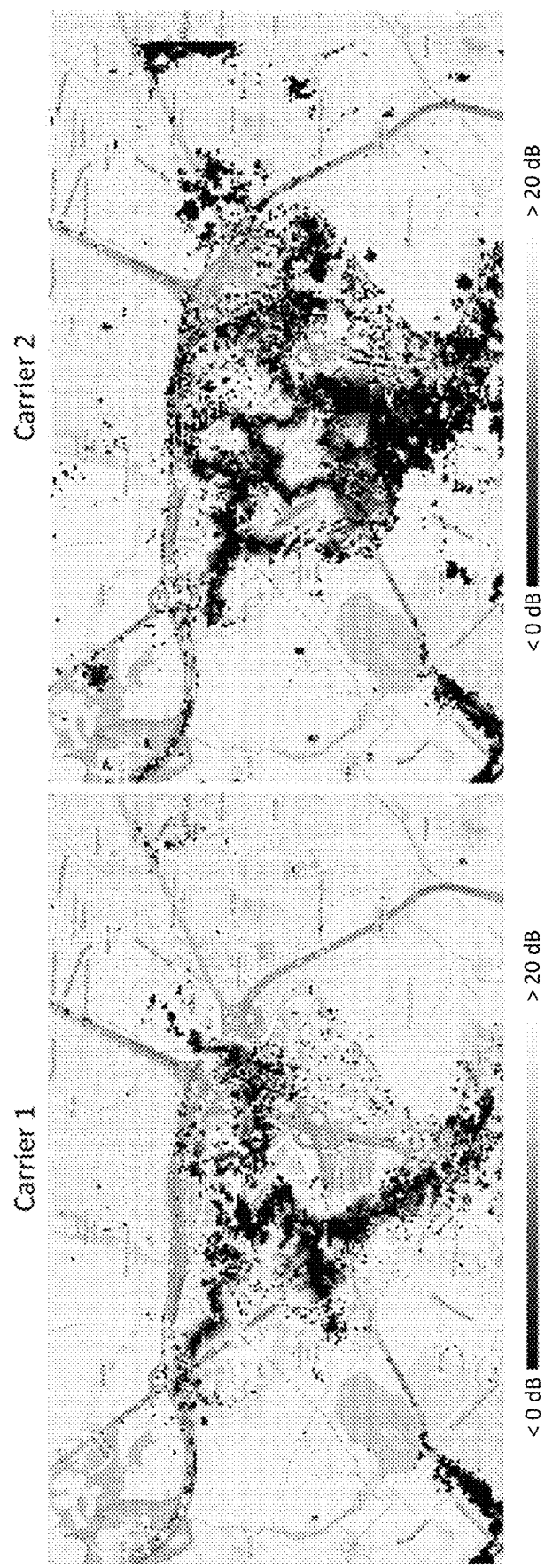
FIG. 45 illustrates carrier-to-interference ratio for Carrier 1 and Carrier 2 for the third example.

FIG. 45 illustrates carrier-to-interference ratio for Carrier 1 and Carrier 2.

Figure 46:
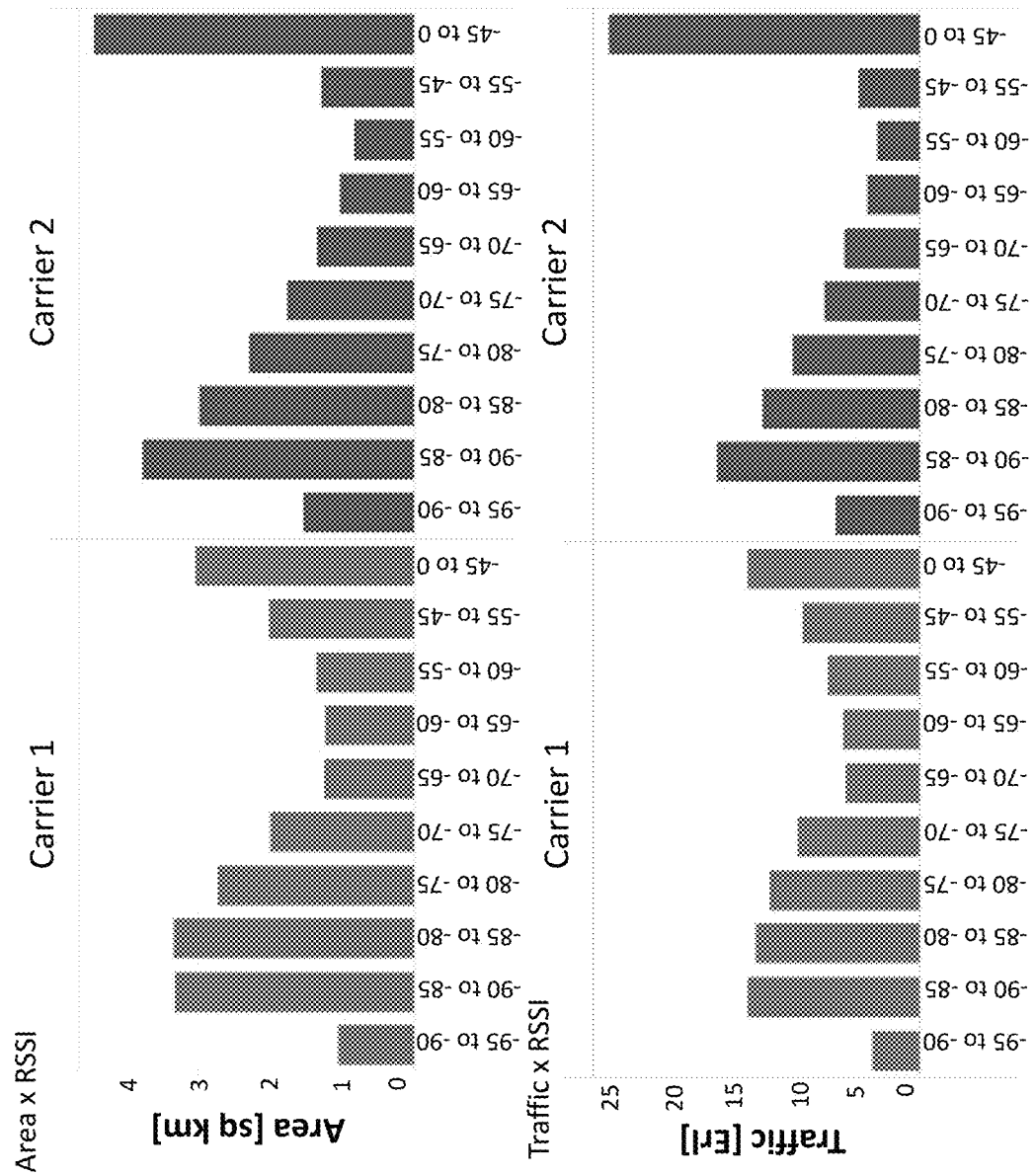
FIG. 46 is a graph of Area vs. RSSI and Traffic vs. RSSI for Carrier 1 and Carrier 2 for the third example.

FIG. 46 is a graph of Area vs. RSSI and Traffic vs. RSSi for Carrier 1 and Carrier 2. Carrier 1 and Carrier 2 serve approximately the same amount of area in the sector.

Figure 47:
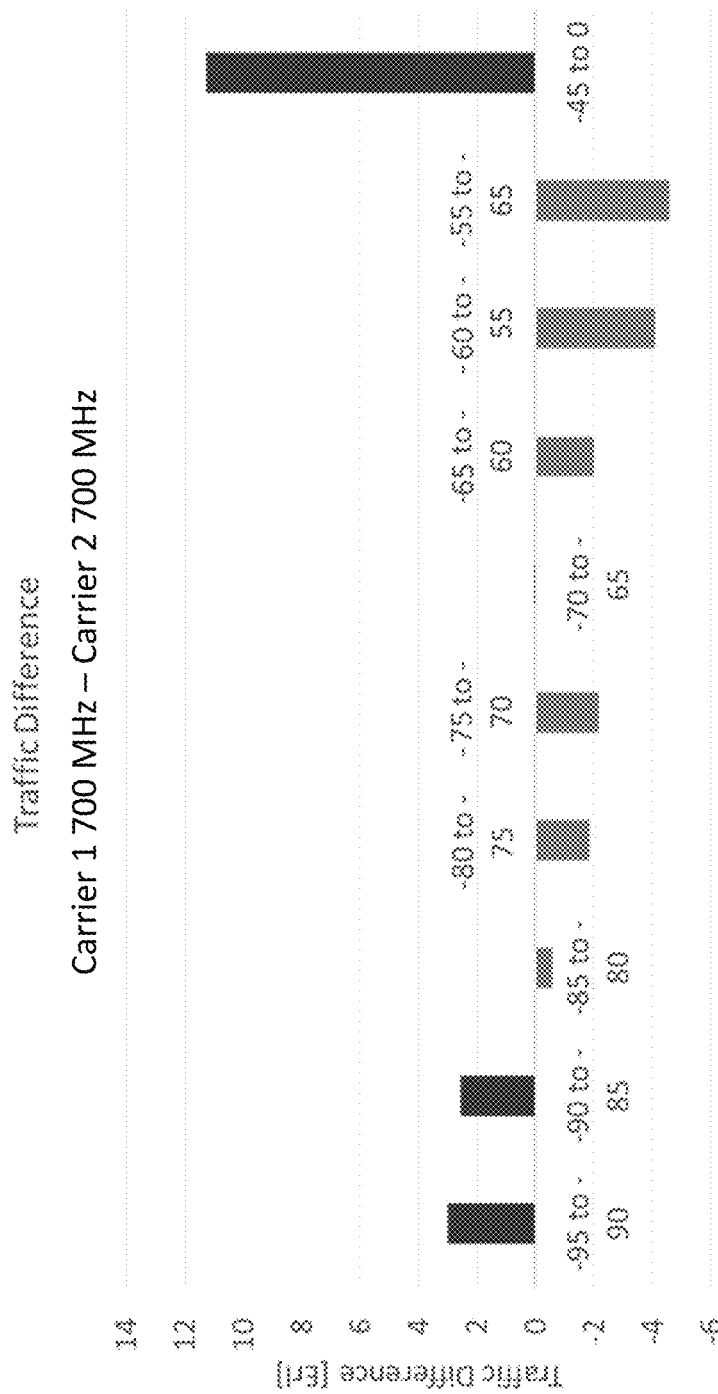
FIG. 47 is a graph of traffic difference for Carrier 1 versus Carrier 2 for the third example.

FIG. 47 is a graph of traffic difference for Carrier 1 versus Carrier 2. Carrier 2 serves more traffic than Carrier 1 at the extremes of coverage, while Carrier 1 serves more traffic in the middle range of coverage.

FIGS. 44-47 illustrate traffic composition for each SigBASE. Different traffic types require different signal-to-noise ratios (SNRs) vs reference signals received power (RSRP). For voice traffic, the SNR is from −6 dB to 0 dB, while the SNR goes upwards of 20 dB for streaming video.

Figure 48:
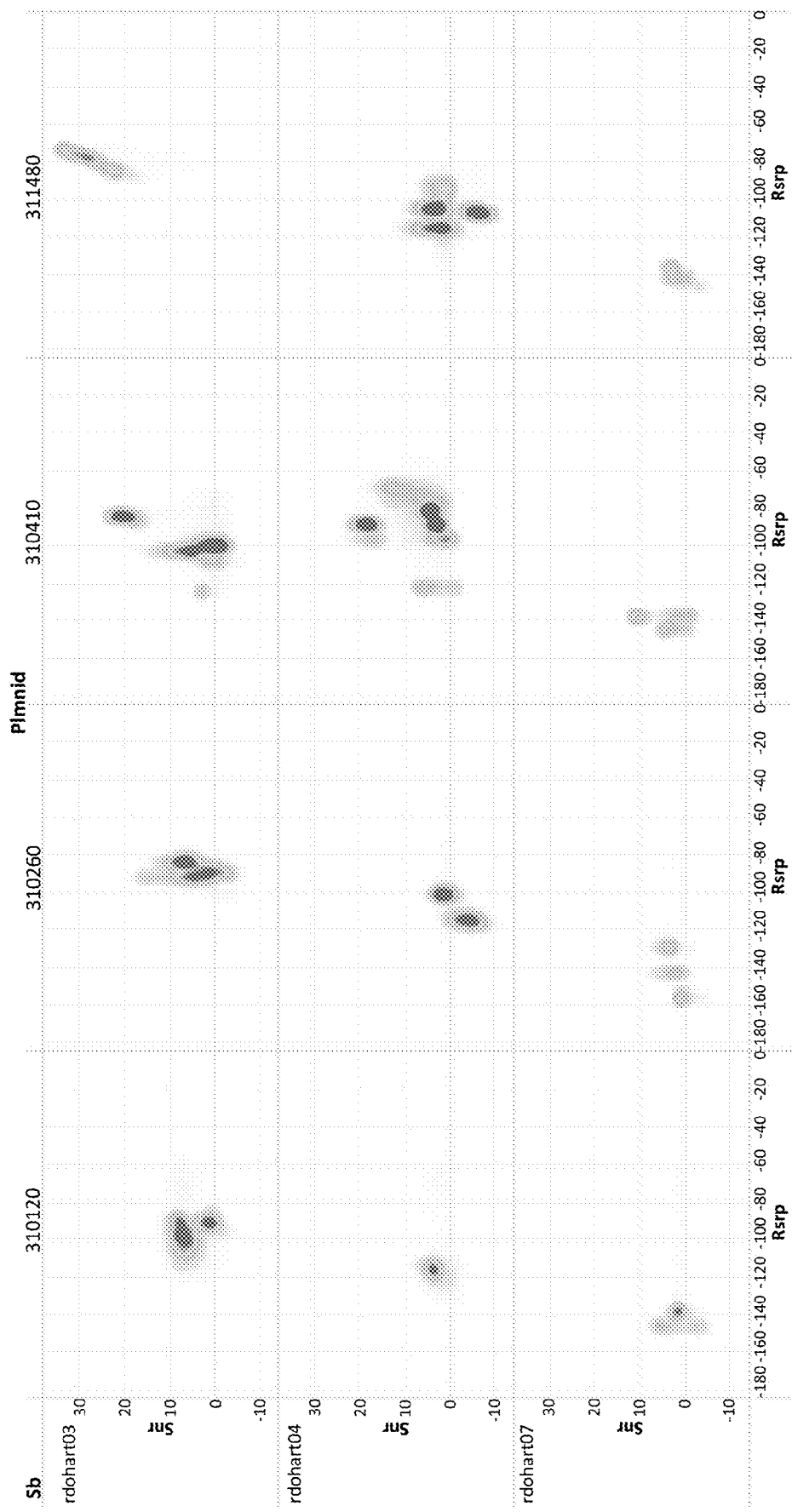
FIG. 48 is a graph of SNR vs. RSRP for each SigBASE for the third example.

FIG. 48 is a graph of SNR vs. RSRP for each SigBASE for the third example.

Figure 49:
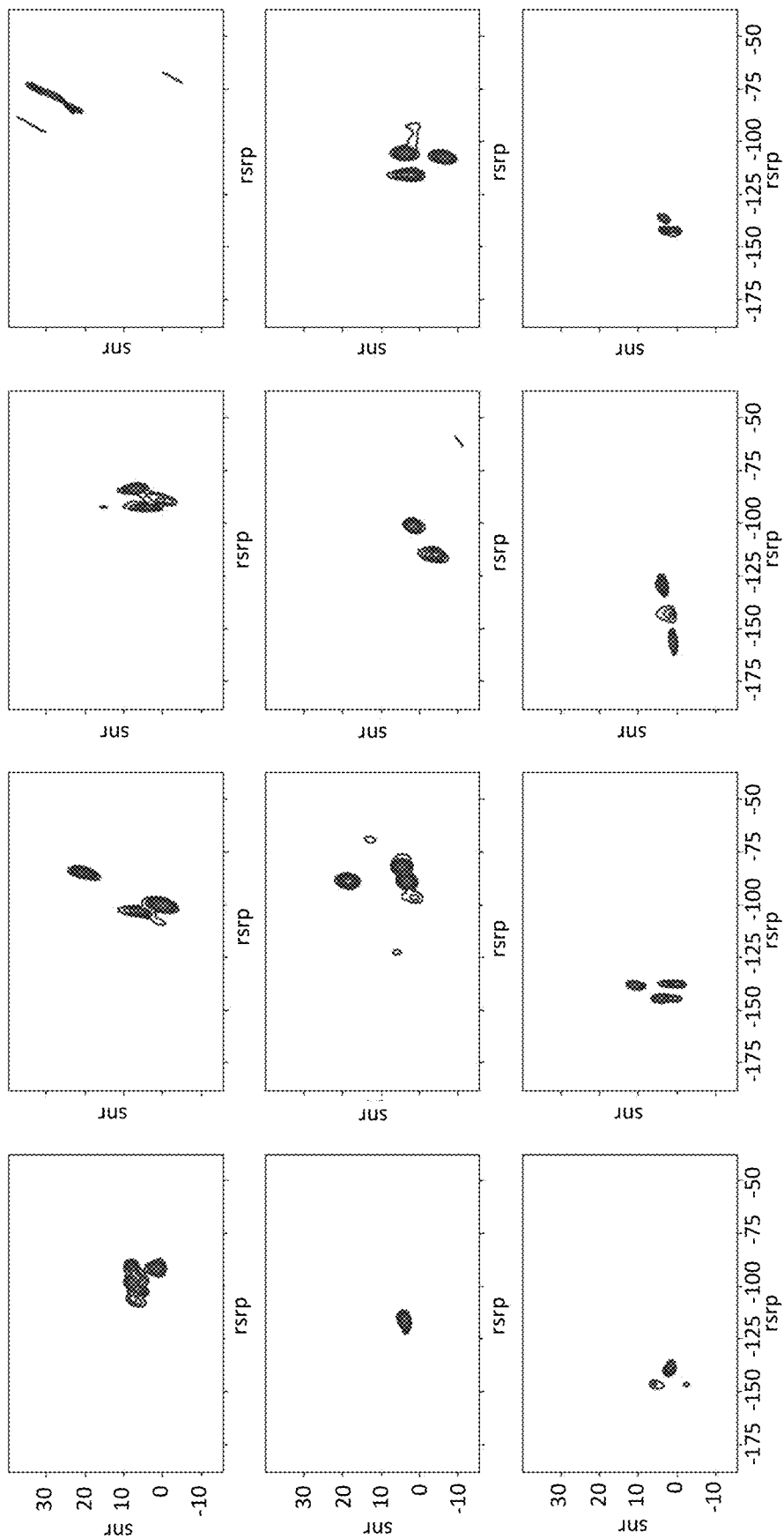
FIG. 49 is another graph of SNR vs. RSRP for each SigBASE for the third example.

FIG. 49 is another graph of SNR vs. RSRP for each SigBASE for the third example.

Figure 50:
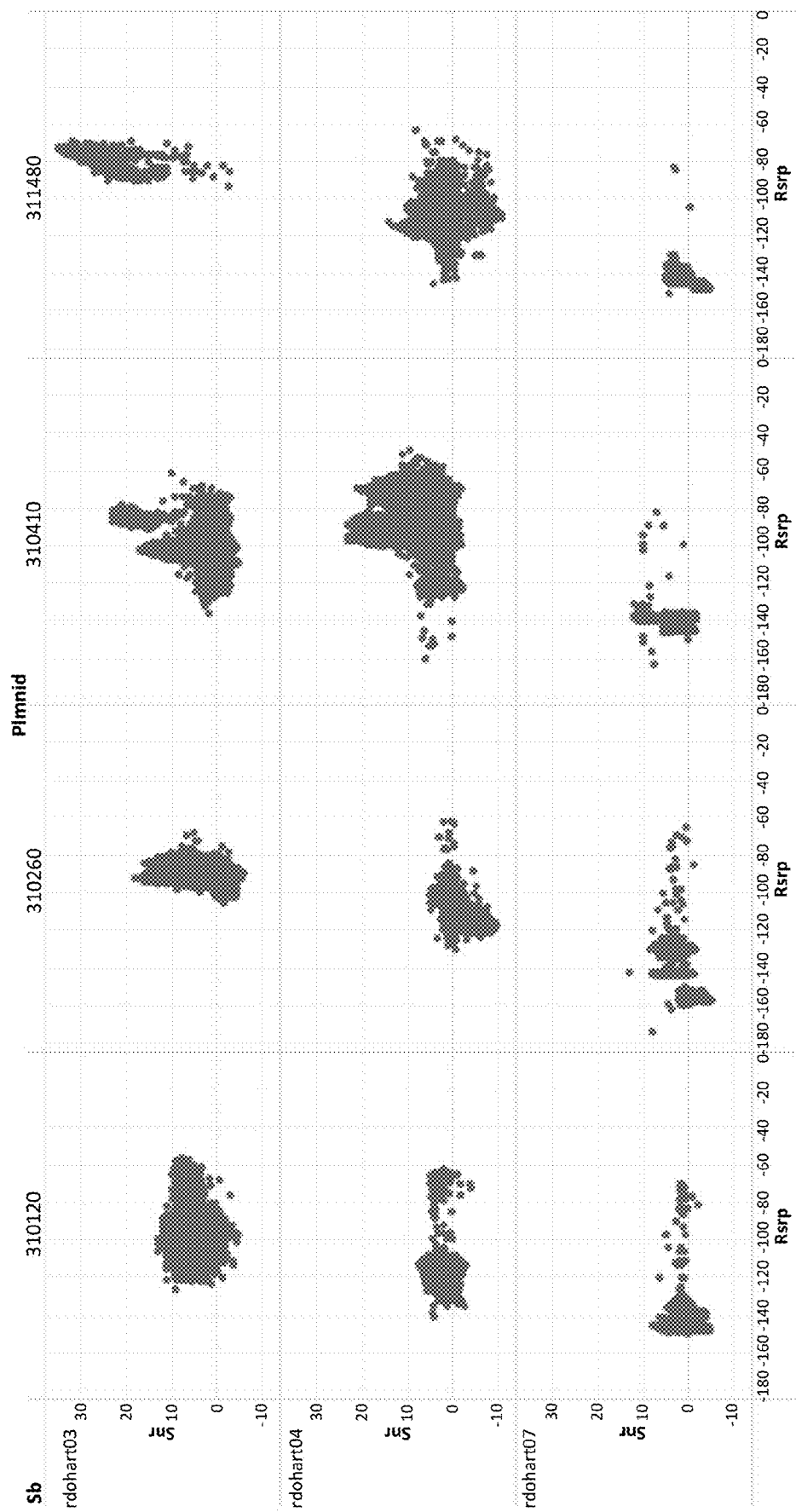
FIG. 50 is a clustered graph of SNR vs. RSRP for each SigBASE for the third example.

FIG. 50 is a clustered graph of SNR vs. RSRP for each SigBASE for the third example.

Figure 51:
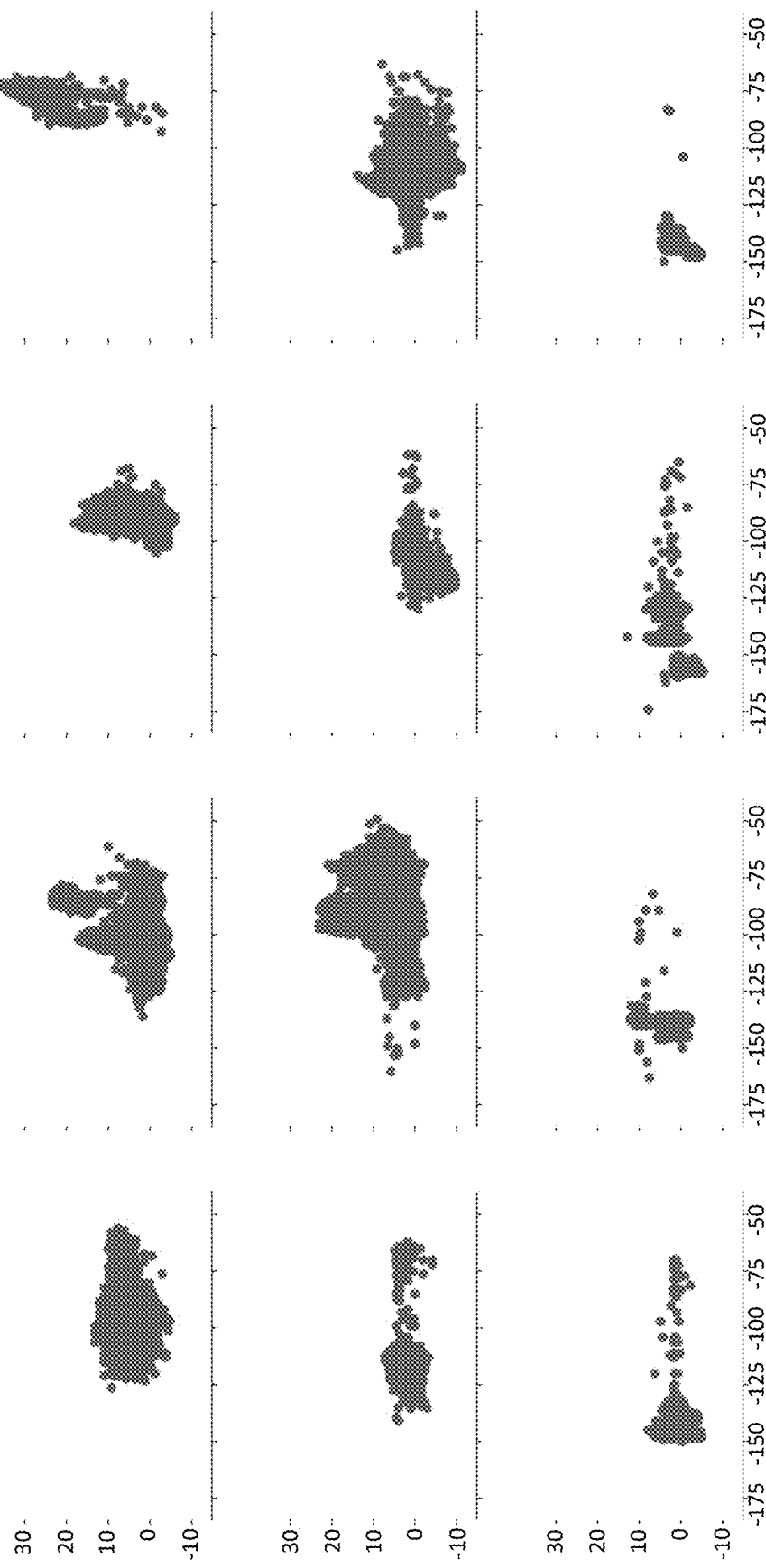
FIG. 51 is another clustered graph of SNR vs. RSRP for each SigBASE for the third example.

FIG. 51 is another clustered graph of SNR vs. RSRP for each SigBASE for the third example.

Figure 52:
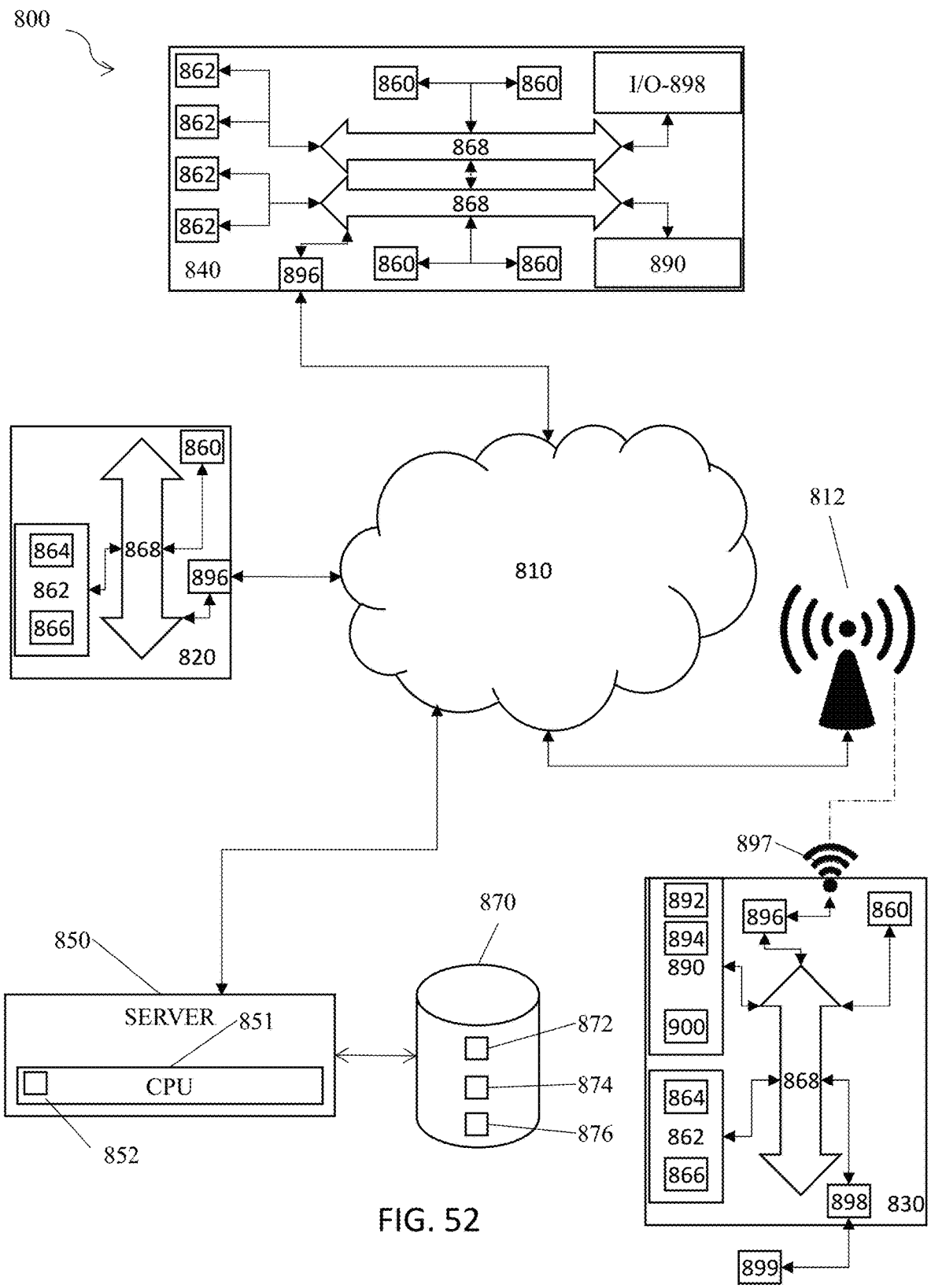
FIG. 52 is a schematic diagram of a system of the present invention.

FIG. 52 is a schematic diagram of an embodiment of the invention illustrating a computer system, generally described as 800, having a network 810, a plurality of computing devices 820, 830, 840, a server 850, and a database 870.

The server 850 is constructed, configured, and coupled to enable communication over a network 810 with a plurality of computing devices 820, 830, 840. The server 850 includes a processing unit 851 with an operating system 852. The operating system 852 enables the server 850 to communicate through network 810 with the remote, distributed user devices. Database 870 is operable to house an operating system 872, memory 874, and programs 876.

In one embodiment of the invention, the system 800 includes a network 810 for distributed communication via a wireless communication antenna 812 and processing by at least one mobile communication computing device 830. Alternatively, wireless and wired communication and connectivity between devices and components described herein include wireless network communication such as WI-FI, WORLDWIDE INTEROPERABILITY FOR MICROWAVE ACCESS (WIMAX), Radio Frequency (RF) communication including RF identification (RFID), NEAR FIELD COMMUNICATION (NFC), BLUETOOTH including BLUETOOTH LOW ENERGY (BLE), ZIGBEE, Infrared (IR) communication, cellular communication, satellite communication, Universal Serial Bus (USB), Ethernet communications, communication via fiber-optic cables, coaxial cables, twisted pair cables, and/or any other type of wireless or wired communication. In another embodiment of the invention, the system 800 is a virtualized computing system capable of executing any or all aspects of software and/or application components presented herein on the computing devices 820, 830, 840. In certain aspects, the computer system 800 is operable to be implemented using hardware or a combination of software and hardware, either in a dedicated computing device, or integrated into another entity, or distributed across multiple entities or computing devices.

By way of example, and not limitation, the computing devices 820, 830, 840 are intended to represent various forms of electronic devices including at least a processor and a memory, such as a server, blade server, mainframe, mobile phone, personal digital assistant (PDA), smartphone, desktop computer, netbook computer, tablet computer, workstation, laptop, and other similar computing devices. The components shown here, their connections and relationships, and their functions, are meant to be exemplary only, and are not meant to limit implementations of the invention described and/or claimed in the present application.

In one embodiment, the computing device 820 includes components such as a processor 860, a system memory 862 having a random access memory (RAM) 864 and a read-only memory (ROM) 866, and a system bus 868 that couples the memory 862 to the processor 860. In another embodiment, the computing device 830 is operable to additionally include components such as a storage device 890 for storing the operating system 892 and one or more application programs 894, a network interface unit 896, and/or an input/output controller 898. Each of the components is operable to be coupled to each other through at least one bus 868. The input/output controller 898 is operable to receive and process input from, or provide output to, a number of other devices 899, including, but not limited to, alphanumeric input devices, mice, electronic styluses, display units, touch screens, signal generation devices (e.g., speakers), or printers.

By way of example, and not limitation, the processor 860 is operable to be a general-purpose microprocessor (e.g., a central processing unit (CPU)), a graphics processing unit (GPU), a microcontroller, a Digital Signal Processor (DSP), an Application Specific Integrated Circuit (ASIC), a Field Programmable Gate Array (FPGA), a Programmable Logic Device (PLD), a controller, a state machine, gated or transistor logic, discrete hardware components, or any other suitable entity or combinations thereof that can perform calculations, process instructions for execution, and/or other manipulations of information.

In another implementation, shown as 840 in FIG. 52, multiple processors 860 and/or multiple buses 868 are operable to be used, as appropriate, along with multiple memories 862 of multiple types (e.g., a combination of a DSP and a microprocessor, a plurality of microprocessors, one or more microprocessors in conjunction with a DSP core).

Also, multiple computing devices are operable to be connected, with each device providing portions of the necessary operations (e.g., a server bank, a group of blade servers, or a multi-processor system). Alternatively, some steps or methods are operable to be performed by circuitry that is specific to a given function.

According to various embodiments, the computer system 800 is operable to operate in a networked environment using logical connections to local and/or remote computing devices 820, 830, 840 through a network 810. A computing device 830 is operable to connect to a network 810 through a network interface unit 896 connected to a bus 868. Computing devices are operable to communicate communication media through wired networks, direct-wired connections or wirelessly, such as acoustic, RF, or infrared, through an antenna 897 in communication with the network antenna 812 and the network interface unit 896, which are operable to include digital signal processing circuitry when necessary. The network interface unit 896 is operable to provide for communications under various modes or protocols.

In one or more exemplary aspects, the instructions are operable to be implemented in hardware, software, firmware, or any combinations thereof. A computer readable medium is operable to provide volatile or non-volatile storage for one or more sets of instructions, such as operating systems, data structures, program modules, applications, or other data embodying any one or more of the methodologies or functions described herein. The computer readable medium is operable to include the memory 862, the processor 860, and/or the storage media 890 and is operable be a single medium or multiple media (e.g., a centralized or distributed computer system) that store the one or more sets of instructions 900. Non-transitory computer readable media includes all computer readable media, with the sole exception being a transitory, propagating signal per se. The instructions 900 are further operable to be transmitted or received over the network 810 via the network interface unit 896 as communication media, which is operable to include a modulated data signal such as a carrier wave or other transport mechanism and includes any delivery media. The term "modulated data signal" means a signal that has one or more of its characteristics changed or set in a manner as to encode information in the signal.

Storage devices 890 and memory 862 include, but are not limited to, volatile and non-volatile media such as cache, RAM, ROM, EPROM, EEPROM, FLASH memory, or other solid state memory technology; discs (e.g., digital versatile discs (DVD), HD-DVD, BLU-RAY, compact disc (CD), or CD-ROM) or other optical storage; magnetic cassettes, magnetic tape, magnetic disk storage, floppy disks, or other magnetic storage devices; or any other medium that can be used to store the computer readable instructions and which can be accessed by the computer system 800.

In one embodiment, the computer system 800 is within a cloud-based network. In one embodiment, the server 850 is a designated physical server for distributed computing devices 820, 830, and 840. In one embodiment, the server 850 is a cloud-based server platform. In one embodiment, the cloud-based server platform hosts serverless functions for distributed computing devices 820, 830, and 840.

In another embodiment, the computer system 800 is within an edge computing network. The server 850 is an edge server, and the database 870 is an edge database. The edge server 850 and the edge database 870 are part of an edge computing platform. In one embodiment, the edge server 850 and the edge database 870 are designated to distributed computing devices 820, 830, and 840. In one embodiment, the edge server 850 and the edge database 870 are not designated for distributed computing devices 820, 830, and 840. The distributed computing devices 820, 830, and 840 connect to an edge server in the edge computing network based on proximity, availability, latency, bandwidth, and/or other factors.

It is also contemplated that the computer system 800 is operable to not include all of the components shown in FIG. 52, is operable to include other components that are not explicitly shown in FIG. 52, or is operable to utilize an architecture completely different than that shown in FIG. 52. The various illustrative logical blocks, modules, elements, circuits, and algorithms described in connection with the embodiments disclosed herein are operable to be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application (e.g., arranged in a different order or partitioned in a different way), but such implementation decisions should not be interpreted as causing a departure from the scope of the present invention.

The above-mentioned examples are provided to serve the purpose of clarifying the aspects of the invention, and it will be apparent to one skilled in the art that they do not serve to limit the scope of the invention. By nature, this invention is highly adjustable, customizable and adaptable. The above-mentioned examples are just some of the many configurations that the mentioned components can take on. All modifications and improvements have been deleted herein for the sake of conciseness and readability but are properly within the scope of the present invention.

The invention claimed is:

1. A system for spectrum management in an electromagnetic environment comprising:
    at least one sensor operable for capturing characteristics of at least one signal in the electromagnetic environment and create measured data based on the at least one signal;
    at least one data analysis engine for analyzing the measured data; and
    a customer optimization module;
    wherein the at least one data analysis engine includes a detection engine, an identification engine, and a learning engine;
    wherein the detection engine is operable to automatically detect the at least one signal;
    wherein the identification engine uses signal profiling and/or comparison with at least one previously recorded signal profile in a database to identify the at least one signal as interference;
    wherein the learning engine receives information from the detection engine and the identification engine;
    wherein the learning engine is operable to learn the electromagnetic environment using machine learning (ML), artificial intelligence (AI), deep learning (DL), neural networks (NNs), artificial neural networks (ANNs), support vector machines (SVMs), Markov decision process (MDP), natural language processing (NLP), control theory, and/or statistical learning techniques;
    wherein the customer optimization module is operable to discern a statistical impact of the interference on customer goals and/or customer operations; and
    wherein the customer optimization module is operable to send actionable data related to the electromagnetic environment to an operational engine.

2. The system of claim 1, further including a survey occupancy application, wherein the survey occupancy application is operable to determine occupancy in frequency bands and schedule occupancy in at least one frequency band.

3. The system of claim 1, wherein the system is operable to activate at least one alarm and/or provide at least one notification.

4. The system of claim 1, wherein the system is operable to provide an alert relating to interference between at least one first party signal and at least one second party signal.

5. The system of claim 4, wherein the system is operable to communicate a resolution to the first party and/or a base station associated with the first party, wherein the resolution includes modification of parameters to resolve the interference.

6. The system of claim 1, wherein the identification of the at least one signal is performed autonomously.

7. The system of claim 1, wherein the system is operable to provide an automated report relating to the identification of the at least one signal.

8. The system of claim 1, further comprising a display operable to display Physical Resource Block (PRB) allocation.

9. The system of claim 1, wherein the system is further operable to maintain a set of de-confliction rules to resolve the interference.

10. The system of claim 1, further comprising at least one classification engine operable to correlate the at least one signal with known signal protocols, correlate the at least one signal with known variables, correlate the at least one signal with known databases, correlate the at least one signal with existing wireless signal formats, and/or correlate the at least one signal with existing cellular protocol formats, and wherein the at least one classification engine is trained to correlate the at least one signal with known signal protocols, correlate the at least one signal with known variables, correlate the at least one signal with known databases, correlate the at least one signal with existing wireless signal formats, and/or correlate the at least one signal with existing cellular protocol formats based on at least one neural network.

* * * * *